(12) United States Patent
Okamura et al.

(10) Patent No.: US 8,286,064 B2
(45) Date of Patent: Oct. 9, 2012

(54) TRANSMISSION DEVICE

(75) Inventors: Shutai Okamura, Kadoma (JP); Yutaka Murakami, Kadoma (JP); Naoya Yosoku, Kadoma (JP); Masayuki Orihashi, Kadoma (JP)

(73) Assignee: Panasonic Corporation, Osaka (JP)

( * ) Notice: Subject to any disclaimer, the term of this patent is extended or adjusted under 35 U.S.C. 154(b) by 424 days.

(21) Appl. No.: 12/738,621

(22) PCT Filed: Oct. 30, 2008

(86) PCT No.: PCT/JP2008/003124
§ 371 (c)(1),
(2), (4) Date: Apr. 16, 2010

(87) PCT Pub. No.: WO2009/057312
PCT Pub. Date: May 7, 2009

(65) Prior Publication Data
US 2010/0251061 A1    Sep. 30, 2010

(30) Foreign Application Priority Data

Oct. 31, 2007  (JP) ................................ 2007-284345
Oct. 29, 2008  (JP) ................................ 2008-278546

(51) Int. Cl.
*G06F 11/00* (2006.01)
(52) U.S. Cl. ........................................ 714/786; 714/793
(58) Field of Classification Search ................. 714/752, 714/786, 793
See application file for complete search history.

(56) References Cited

U.S. PATENT DOCUMENTS

| | | | |
|---|---|---|---|
| 6,167,552 A | 12/2000 | Gagnon | |
| 8,181,081 B1* | 5/2012 | Yeo et al. | 714/752 |
| 2009/0254795 A1* | 10/2009 | Palanki et al. | 714/776 |
| 2010/0098245 A1* | 4/2010 | Fang et al. | 380/38 |
| 2010/0122143 A1* | 5/2010 | Lee et al. | 714/752 |
| 2011/0138258 A1* | 6/2011 | Okamura et al. | 714/780 |

FOREIGN PATENT DOCUMENTS

| | | |
|---|---|---|
| JP | 2002-111516 A | 4/2002 |
| JP | 2006-287336 A | 10/2006 |
| JP | 2007-129679 A | 5/2007 |

OTHER PUBLICATIONS

Extended European Search Report for corresponding EP Application No. 08845649, dated Jun. 7, 2011, 10 pages.

(Continued)

*Primary Examiner* — Marc Duncan
(74) *Attorney, Agent, or Firm* — Seed IP Law Group PLLC

(57) ABSTRACT

Provided is a transmission device which improves the error rate characteristic upon decoding when performing error correction encoding by using a self-orthogonal code or an LDPC-CC in a communication system using a communication path having a fading fluctuation, multi-value modulation, or MIMO transmission. In the transmission device, the self-orthogonal encoding unit (110) encodes a self-orthogonal code having a constriction length K and an interleave unit (130) rearranges a code word sequence so that the same modulation symbol includes an information bit of a moment i and a non-correlated bit of the information bit of the moment i in a multi-value modulation unit (150).

15 Claims, 35 Drawing Sheets

OTHER PUBLICATIONS

Anonym: "Orthogonal frequency-division mutiplexing," Retrieved from the Internet: URL:http://replay.web.archive.org/20071013031929/http://en.wikipedia.org/wiki/Orthogonal_frequency-division_multiplexing [retreived on May 18, 2011].

Muck et al., "Reconfigurable Low Density Parity Check (LDPC) Code Interleaving for SISO and MIMO OFDM Systems," IEEE 7th Workshop on Signal Processing Advances in Wireless Communications, SPAWC '06, Jul. 2-5, 2006, 5 pages.

Cardinal, C., et al., "Iterative Threshold Decoding Without Interleaving for Convolutional Self-Doubly Orthogonal Codes," IEEE Transactions on Communications 51(8): 1274-1282, Aug. 2003.

Cardinal, C., et al., "Reduced-Complexity Convolutional Self-Doubly Orthogonal Codes for Efficient Iterative Decoding," Proceedings of the IEEE 63rd Vehicular Technology Conference (VTC2006-Spring), vol. 3, Melbourne, May 2006, pp. 1372-1376.

Felström, A.J., and K.S. Zigangirov, "Time-Varying Periodic Convolutional Codes with Low-Density Parity-Check Matrix," IEEE Transactions on Information Theory 45(6): 2181-2191, Sep. 1999.

He, Y.-C., and D. Haccoun, "An Analysis of the Orthogonality Structures of Convolutional Codes for Iterative Decoding," IEEE Transactions on Information Theory 51(9): 3247-3261, Sep. 2005.

Imai, H., "Coding Theory," The Institute of Electronics, Information and Communication Engineers (IEICE), 1990 Annual Publication, pp. 274-278.

International Search Report, mailed Jan. 6, 2009, issued in corresponding International Application No. PCT/JP2008/003124, filed Oct. 30, 2008.

Tanner, R.M., et al., "LDPC Block and Convolutional Codes Based on Circulant Matrices," IEEE Transactions on Information Theory 50(12): 2966-2984, Dec. 2004.

* cited by examiner $$H = \begin{Bmatrix} \begin{matrix} Hs & Hp \\ 1100100000100001010000000000000000 \cdots & 1000000000000000 \cdots \\ 0110010000010000101000000000000000 \cdots & 0100000000000000 \cdots \\ 0011001000001000010100000000000000 \cdots & 0010000000000000 \cdots \\ 0001100100000100001010000000000000 \cdots & 0001000000000000 \cdots \\ 0000110010000010000101000000000000 \cdots & 0000100000000000 \cdots \\ 0000011001000001000010100000000000 \cdots & 0000010000000000 \cdots \\ 0000001100100000100001010000000000 \cdots & 0000001000000000 \cdots \\ 0000000110010000010000101000000000 \cdots & 0000000100000000 \cdots \\ 0000000011001000001000010100000000 \cdots & 0000000010000000 \cdots \\ 0000000001100100000100001010000000 \cdots & 0000000001000000 \cdots \\ 0000000000110010000010000101000000 \cdots & 0000000000100000 \cdots \\ 0000000000011001000001000010100000 \cdots & 0000000000010000 \cdots \\ 0000000000001100100000100001010000 \cdots & 0000000000001000 \cdots \\ 0000000000000110010000010000101000 \cdots & 0000000000000100 \cdots \\ 0000000000000011001000001000010100 \cdots & 0000000000000010 \cdots \\ 0000000000000001100100000100001010 \cdots & 0000000000000001 \cdots \\ \cdots & \cdots \\ \cdots & \cdots \\ \cdots & \cdots \end{matrix} \end{Bmatrix}$$

FIG.2

TRANSMISSION DEVICE

TECHNICAL FIELD

The present invention relates to a transmitting apparatus that transmits after performing error correction encoding using a self-orthogonal code or LDPC-CC.

BACKGROUND ART

Currently, in many communication systems in operation or being investigated, error correction encoding is performed on transmission data in a transmitting-side apparatus in order to reduce degradation of transmission quality due to impediments such as interference or noise arising in a channel. A convolutional code is an error correction code that sequentially encodes information data using an encoder having storage, and is used in many communication systems due to such characteristics as having a simple encoder configuration and being able to perform encoding of information data of any length.

A self-orthogonal code, which is an error correction code, is one type of convolutional code that is characterized by the fact that parity bits corresponding to information bits are generated based on the condition that, in a plurality of parity check equations relating to respective information bits, only one information bit is included in two or more parity check equations. Use of this property enables majority logic decoding, which is a simple decoding method, to be used in decoding. Non-Patent Document 1 describes the background and logic of majority logic decoding, together with an actual decoding method.

Although a self-orthogonal code offers the advantage of easy apparatus implementation because it can be decoded with an extremely simple configuration by means of majority logic decoding, as stated above, the error correction capability of majority logic decoding is inferior to that of maximum-likelihood decoding using Viterbi decoding. Thus, a method whereby self-orthogonal code decoding is performed using a soft decision value, and a method whereby error correction capability is improved by applying iterative decoding in which decoding processing is repeated a plurality of times, have been proposed (see Patent Document 1 and Non-Patent Document 1). Furthermore, in order to improve the convergence characteristic in iterative decoding, a Self-Doubly Orthogonal Code has been proposed in which orthogonality is further added to a self-orthogonal code (see Patent Document 2).

Iterative APP (A Posteriori Probability) decoding of a self-orthogonal code is described below.

FIG. 1 shows a configuration of a J=6, K=18 self-orthogonal code encoder, where J corresponds to the number of parity check equations in which one information bit is included, and K corresponds to the constraint length. Encoder 10 shown in FIG. 1 is equipped with 17 (K−1) shift registers 11-1 through 11-17, and a parity bit is generated by modulo-2 addition (finding the exclusive OR) of shift register 11-1 input and the outputs of shift registers 11-2, 11-7, 11-13, 11-16, and 11-17 performed by modulo-2 adder 12.

Here, the connections between modulo-2 adder 12 and shift registers are represented as αj={0, 2, 7, 13, 16, 17} (where j=1, . . . , 6, and J=6). Also, i'th parity bit $p_i$ is represented by equation 1 using αj.

[1]
$$p_i = \sum_{k=1}^{J} \oplus u_{i-\alpha_k}$$ (Equation 1)

Here, $u_i$ represents the i'th information bit, and ⊕ represents modulo-2 addition.

FIG. 2 shows parity check matrix H of this self-orthogonal code. In FIG. 2, Hs corresponds to a part corresponding to parity check matrix information bit $u_i$, and Hp corresponds to a part corresponding to parity check matrix parity bit $p_i$. The row direction of parity check matrix H represents a parity check equation, and the column direction represents an information bit or parity bit sequence.

Data that has undergone self-orthogonal encoding by encoder 10 in FIG. 1 undergoes digital modulation in a modulation section (not shown).

When BPSK (Binary Phase Shift Keying) is used as a digital modulation method, symbols corresponding to information bit $u_i$ and parity bit $p_i$ are represented by equations 2-1 and 2-2 respectively.

[2]
$$x_i^u = -2u_i + 1$$ (Equation 2-1)

$$x_i^p = -2p_i + 1$$ (Equation 2-2)

A modulation symbol is received by a receiving-side apparatus via a channel. Assuming an AWGN (Additive White Gaussian Noise) channel, received modulation symbols are represented by equations 3-1 and 3-2 respectively, where $n_i^u$ and $n_i^p$ are additive white Gaussian noise components in accordance with average zero and variance $\sigma^2$ distribution applied to $x_i^u$ and $x_i^p$.

[3]
$$\hat{x}_i^u = x_i^u + n_i^u$$ (Equation 3-1)

$$\hat{x}_i^p = x_i^p + n_i^p$$ (Equation 3-2)

In the case of a BPSK digital modulation method and an AWGN channel, received bit likelihoods are represented by equations 4-1 and 4-2. In equations 4-1 and 4-2, $y_i^u$ and $y_i^p$ represent received bit likelihoods for information bit $u_i$ and parity bit $p_i$ respectively.

[4]
$$y_i^u = \frac{2\hat{x}_i^u}{\sigma^2}$$ (Equation 4-1)

$$y_i^p = \frac{2\hat{x}_i^p}{\sigma^2}$$ (Equation 4-2)

Information bit $u_i$ and parity bit $p_i$ received bit likelihoods $y_i^u$ and $y_i^p$ are input to an iterative APP decoder.

FIG. 3 shows a configuration of an iterative APP decoder. Iterative APP decoder 20 in FIG. 3 comprises delay devices 21-1 through 21-M and 23-1 through 23-(M−1), APP decoding sections 22-1 through 22-M, and hard decision section 24. Delay devices 21-1 through 21-M and 23-1 through 23-(M−1) store received bit likelihoods, and output a received bit likelihood to each of APP decoding sections 22-1 through 22-M at timing at which each of APP decoding sections 22-1 through 22-M uses the relevant received bit likelihood.

APP decoding sections 22-1 through 22-M perform APP decoding processing using information bit and parity bit received bit likelihoods and an a posteriori probability value (APP value) obtained in the iteration before.

APP value $\lambda_i^{(\mu)}$ in the $\mu$'th iteration obtained by APP decoding section 22-$\mu$ is given by equation 5.

[5]

$$\lambda_i^{(\mu)} = y_i^u + \sum_{j=1}^{J}\left(y_{(i+\alpha_j)}^p \cdot \sum_{k=1}^{j-1} \cdot \lambda_{(i+\alpha_j+\alpha_k)}^{(\mu-1)} \cdot \sum_{k=1}^{J} \lambda_{(i+\alpha_j-\alpha_k)}^{(\mu)}\right) \quad \text{(Equation 5)}$$

Here, "∘" represents an add-min computation.

An add-min computation represents a computation given by equation 6. In equation 6, sgn(x) represents the positive/negative sign of x.

[6]

$$\sum_{j=1}^{N} \cdot L(\beta_j) = (-1)^{N+1} \prod_{j-1}^{N} \text{sgn}(L(\beta_j)) \min_{l=1,2,\ldots,N}(|L(\beta_j)|) \quad \text{(Equation 6)}$$

Hard decision section 24 makes a hard decision for APP value $\lambda_i^{(M)}$ obtained by means of an M'th iteration. A hard decision is made based on the criterion in equation 7.

[7]

$$\hat{u}_i = 0 \text{ if and only if } \lambda_i^{(M)} > 0, \text{ otherwise } \hat{u}_i = 1 \quad \text{(Equation 7)}$$

When iterative APP decoding is applied to self-orthogonal code decoding, decoding performance can be made to approach likelihood estimation performance as the number of iterations increases (see Non-Patent Document 2).

In investigations of decoding of a convolutional code using an iterative decoding algorithm, the use of an LDPC-CC (Low-Density Parity-Check Convolutional Code) has been investigated as well as the use of a self-orthogonal code.

An LDPC-CC is a convolutional code defined by a low-density parity check matrix, and is disclosed in Non-Patent Document 3 or Non-Patent Document 4. LDPC-CCs are divided into a number of groups according to differences in the parity check matrix design method. In the following description, an LDPC-CC designed on the basis of a Quasi-Cyclic Low-Density Parity-Check code (QC-LDPC code), which is a block code, disclosed in Non-Patent Document 4, is taken as an example.

Equation 8 shows a parity check matrix of a [21, 8, 6] QC-LDPC code.

[8]

$$H = \begin{bmatrix} I_1 & I_2 & I_4 \\ I_6 & I_5 & I_3 \end{bmatrix} \quad \text{(Equation 8)}$$

In parity check matrix H of equation 8, $I_x$ represents a matrix in which rows of a 7×7 unitary matrix are cyclically shifted to the left by x. A [21, 8, 6] ∘ QC-LDPC code is a block code with a code length of 21.

To find an LDPC-CC from the QC-LDPC code shown in equation 8, block code parity check matrix H is replaced by a polynomial representation, and converted to a convolutional code parity check matrix. Equation 9 shows parity check matrix H(D) obtained by replacing $I_x$ of parity check matrix H with delay operator $D^x$ and creating a polynomial representation.

[9]

$$H(D) = \begin{bmatrix} D & D^2 & D^4 \\ D^6 & D^5 & D^3 \end{bmatrix} \quad \text{(Equation 9)}$$

$D^x$ is a delay operator in a polynomial representation, with exponent x of D representing a delay of point-in-time x. Since convolutional code parity check matrix H(D) and generator matrix G(D) satisfy the relationship in equation 10, generator matrix G(D) is as shown in equation 11.

[10]

$$G(D)H(D)^T = 0 \quad \text{(Equation 10)}$$

[11]

$$G(D) = \left[\frac{D+D^3}{1+D^2+D^4} \; 1 \; \frac{D^2}{1+D^2+D^4}\right] \quad \text{(Equation 11)}$$

Generator matrix G(D) is a generator matrix for a recursive systematic convolutional code with a coding rate of ⅓.

FIG. 4 shows a configuration of an LDPC-CC encoder based on generator matrix G(D). LDPC-CC encoder 30 in FIG. 4 comprises delay devices 31-1 through 31-4 and modulo-2 adders 32 and 33. LDPC-CC encoder 30 is an encoder that outputs 3-bit codeword bits cmi (where m=1, 2, 3) for 1-bit information bit $u_i$ input. As can be seen from equation 11, c2i is equal to information bit $u_i$.

FIG. 5 is an example in which parity check matrix H(D) given by equation 9 is described schematically by means of a matrix representation. FIG. 5 shows only parts of parity check matrix H(D) relating to a codeword bit of point-in-time i. Parity check matrix 40 in FIG. 5 is configured by repeatedly setting out partial matrix 41 comprising a plurality of 2×3 matrices. The 2×3 number of rows and number of columns correspond to the number of rows and number of columns of parity check matrix H(D) in polynomial representation form shown by equation 9. A column of partial matrix 41 corresponds to 3-bit codeword bits cmi output from LDPC-CC encoder 30 starting from the left.

In parity check matrix 40, three columns of point-in-time (c1i, c2i, c3i) are focused on. If a row in which "1" is placed in each column is extracted, it can be seen that the above self-orthogonal conditions are satisfied. For example, looking at the c1i column of parity check matrix 40, "1" is placed in the p1(i+1) and p2(i+6) rows, and in these two rows, columns in which "1" is placed other than c1i are {c3(i−3), c2(i−1), c2(i+1), c3(i+3)}, and the number of 1s is only one for each column.

Since an LDPC-CC can be designed so that a parity check matrix has self-orthogonality in this way, it is known to show an excellent error rate characteristic when iterative decoding is applied.

Patent Document 1: Japanese Patent Application Laid-Open No. 2002-111516

Patent Document 2: U.S. Pat. No. 6,167,552 Specification

Non-Patent Document 1: "Code Logic," Hideki Imai, (IEICE, 1990 Annual Publication), p. 274-p. 278

Non-Patent Document 2: "Iterative Threshold Decoding Without Interleaving for Convolutional Self-Doubly Orthogonal Codes," Cristian Cardinal, David Haccoun, Francois Gagnon, IEEE Transactions on Communications, vol. 51, no. 8, pp. 1274-1282 August 2003.

Non-Patent Document 3: "An Analysis of the Orthogonality Structures of Convolutional Codes for Iterative Decoding," Yu-Cheng He, David Haccoun, IEEE Transactions on Information Theory, vol. 51, no. 9, pp. 3247-3261, September 2005.

Non-Patent Document 4: "Time-Varying Periodic Convolutional Codes With Low-Density Parity-Check-Matrix," Alberto Jimenez Felstorom. and Kamil Sh. Zigangirov, IEEE Transactions on Information Theory, Vol. 45. No. 6. pp. 2181-2191. September 1999.

Non-Patent Document 5: "LDPC Block and Convolutional Codes Based on Circulant Matrices," R. Michael Tanner, Deepak Sridhara, Arvind Sridharan, Thomas E. Fuja, and Daniel J. Costello. Jr., IEEE Transactions on Information Theory. vol. 50. no. 12. December 2004.

DISCLOSURE OF INVENTION

Problems to be Solved by the Invention

However, investigations to date concerning self-orthogonal codes and LDPC-CCs have mainly been concerned with an AWGN channel or binary symmetric channel in which errors occur randomly, and investigations concerning channels having correlation, such as a fading channel or MIMO channel for which application to a mobile communication system is assumed, have not been sufficiently conducted.

In general, with a fading channel, errors occur in bursts due to correlation of time and frequency direction fading fluctuation. With a convolutional code, encoding processing is performed sequentially while successively accumulating an information sequence in storage of a length known as a constraint length, and therefore if error occurrence is concentrated within the constraint length range, an error correction effect decreases. Also, with a MIMO channel, spatial correlation is considered in addition to the above-mentioned time-direction correlation and frequency-direction correlation, and therefore error occurrence is not random as in the case of an AWGN channel, and error correction capability cannot be sufficiently realized.

Also, hitherto, cases in which BPSK modulation is used as a modulation method have mainly been investigated, and cases of M-ary modulation for achieving a high communication speed have not been sufficiently considered.

It is an object of the present invention to provide a transmitting apparatus that improves error correction capability in transmission using M-ary modulation and in a fading channel or MIMO channel.

Means for Solving the Problem

A transmitting apparatus of the present invention employs a configuration having: an encoding section that performs error correction encoding using a self-orthogonal code or LDPC-CC on an information symbol and generates a codeword symbol; an interleaver that rearranges the order of the codeword symbols; and a transmission symbol generation section that generates a transmission symbol using a plurality of the codeword symbols; wherein the interleaver rearranges the codeword symbols so that correlation between a channel characteristic of the transmission symbol that includes the information symbol of point-in-time i and a channel characteristic of the transmission symbol that includes a non-correlated symbol of the information symbol of point-in-time i becomes high, and the non-correlated symbol is the codeword symbol that is not used in decoding of the information symbol of point-in-time i.

Advantageous Effects of Invention

The present invention can improve an error rate characteristic in decoding when error correction encoding is performed using a self-orthogonal code or LDPC-CC in a communication system using a channel having fading fluctuation, M-ary modulation, or MIMO transmission.

BRIEF DESCRIPTION OF DRAWINGS

FIG. 2 is a drawing showing an example of parity check matrix H of a self-orthogonal code;

BEST MODE FOR CARRYING OUT THE INVENTION

Now, embodiments of the present invention will be described in detail with reference to the accompanying drawings.

(Non-Correlated Bit)

First, before describing the actual configuration and operation of this embodiment, a non-correlated bit, which is fundamental to the present invention, will be explained. With a self-orthogonal code or LDPC-CC parity check matrix, a bit that is not used in decoding of an information bit of point-in-time i is called a non-correlated bit. An additional explanation of a non-correlated bit is given below.

(Self-Orthogonal Code)

First, an explanation will be given of non-correlated bits in a self-orthogonal code.

A characteristic of a self-orthogonal code is that J integers included in $\alpha j$ are a complete difference set, and differences between arbitrary pairs of integers included in $\alpha j$ are all different.

Figure 1:
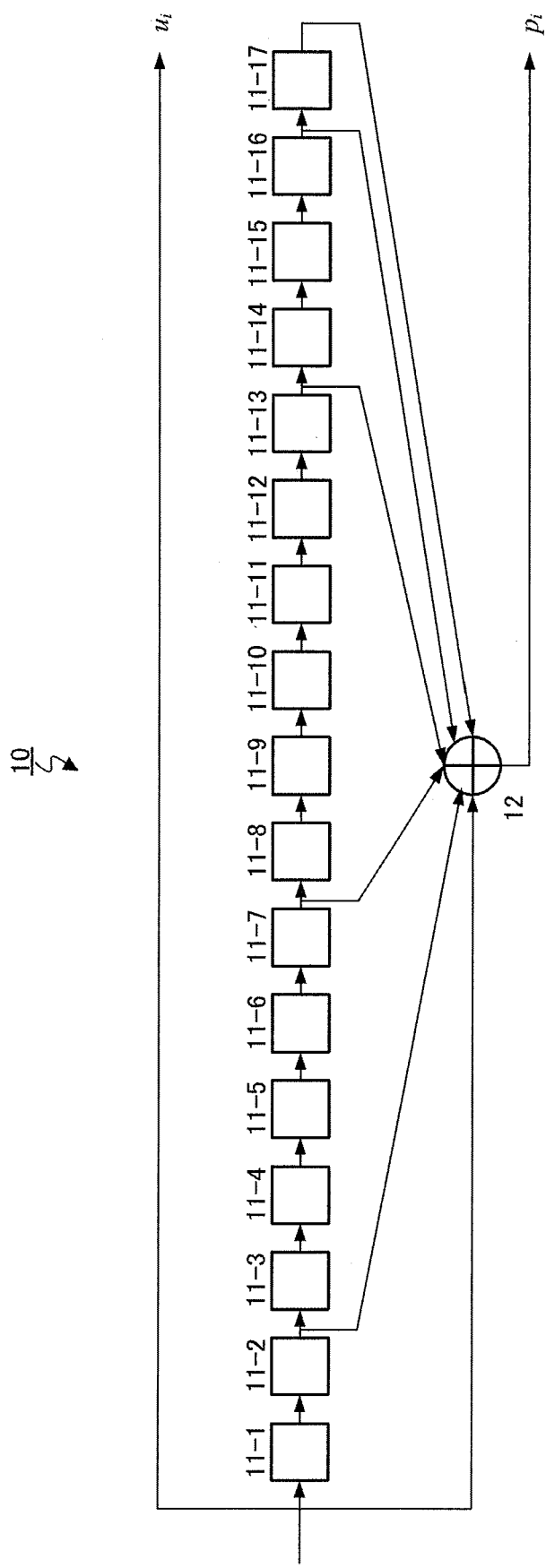
FIG. 1 is a drawing showing an example of the configuration of a self-orthogonal code encoder.
Figure 3:
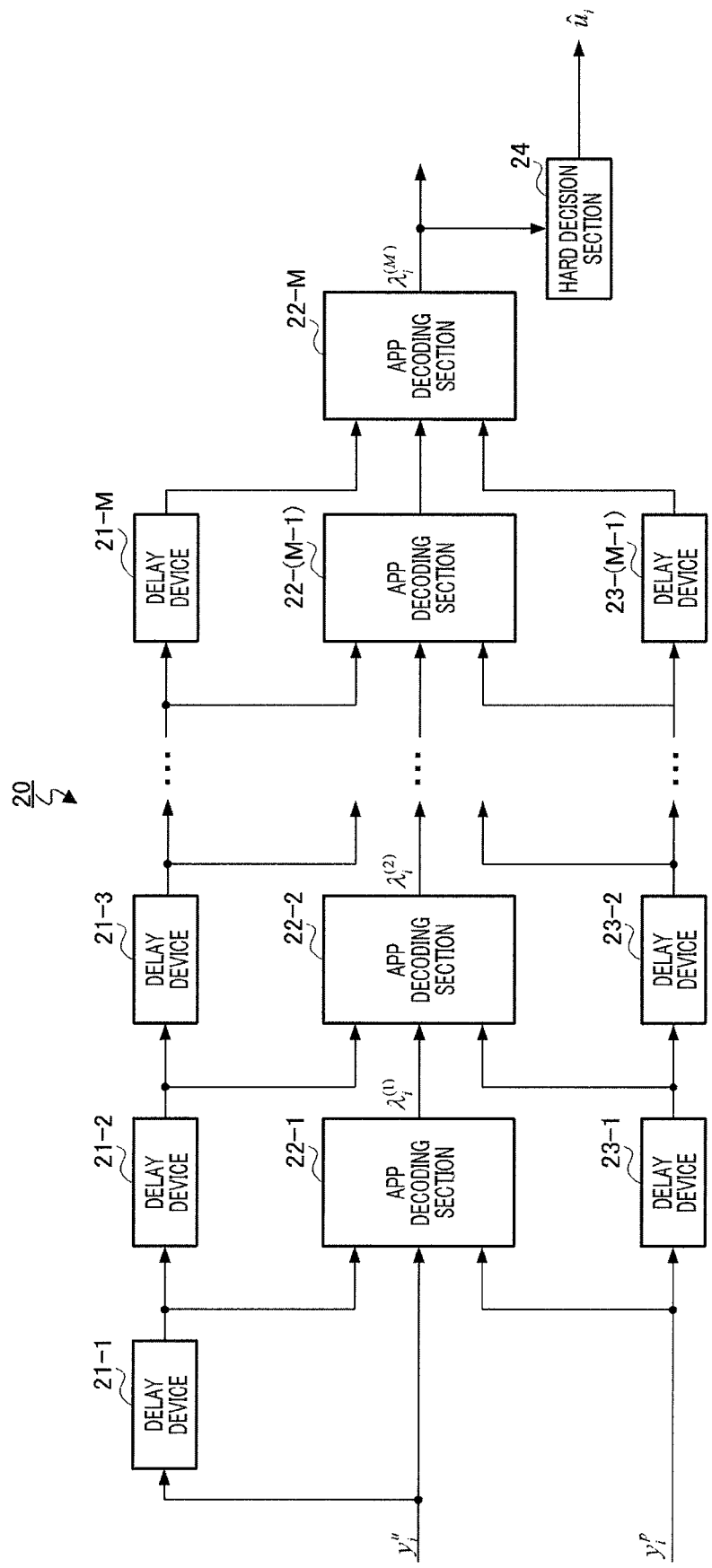
FIG. 3 is a drawing showing an example of the configuration of an iterative APP decoder.
Figure 4:
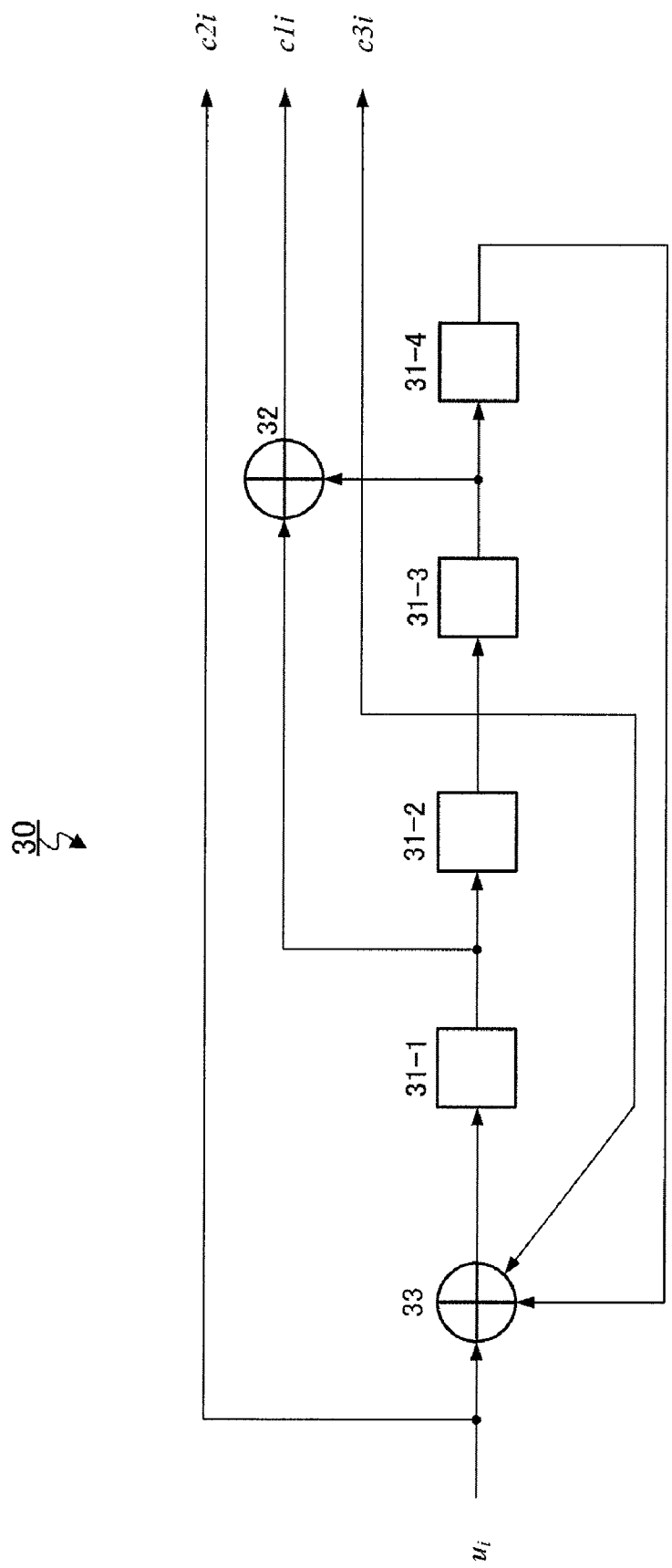
FIG. 4 is a drawing showing an example of the configuration of an LDPC-CC encoder.

To take the J=6, K=18 self-orthogonal code shown in FIG. 1 as an example, $\alpha j=\{0, 2, 7, 13, 16, 17\}$, and differences between arbitrary pairs of integers included in $\alpha j$ are shown in equations 12-1 through 12-30.

[12]

$$0-2=-2 \quad \text{(Equation 12-1)},$$
$$0-7=-7 \quad \text{(Equation 12-2)},$$
$$0-13=-13 \quad \text{(Equation 12-3)},$$
$$0-16=-16 \quad \text{(Equation 12-4)},$$
$$0-17=-17 \quad \text{(Equation 12-5)},$$
$$2-0=2 \quad \text{(Equation 12-6)},$$
$$2-7=-5 \quad \text{(Equation 12-7)},$$
$$2-13=-11 \quad \text{(Equation 12-8)},$$
$$2-16=-14 \quad \text{(Equation 12-9)},$$
$$2-17=-15 \quad \text{(Equation 12-10)},$$
$$7-0=7 \quad \text{(Equation 12-11)},$$
$$7-2=5 \quad \text{(Equation 12-12)},$$
$$7-13=-6 \quad \text{(Equation 12-13)},$$
$$7-16=-9 \quad \text{(Equation 12-14)},$$
$$7-17=-10 \quad \text{(Equation 12-15)},$$
$$13-0=13 \quad \text{(Equation 12-16)},$$
$$13-2=11 \quad \text{(Equation 12-17)},$$
$$13-7=6 \quad \text{(Equation 12-18)},$$
$$13-16=-3 \quad \text{(Equation 12-19)},$$
$$13-17=-4 \quad \text{(Equation 12-20)},$$
$$16-0=16 \quad \text{(Equation 12-21)},$$
$$16-2=14 \quad \text{(Equation 12-22)},$$
$$16-7=9 \quad \text{(Equation 12-23)},$$
$$16-13=3 \quad \text{(Equation 12-24)},$$
$$16-17=-1 \quad \text{(Equation 12-25)},$$
$$17-0=17 \quad \text{(Equation 12-26)},$$
$$17-2=15 \quad \text{(Equation 12-27)},$$
$$17-7=10 \quad \text{(Equation 12-28)},$$
$$17-13=4 \quad \text{(Equation 12-29)},$$
$$17-16=1 \quad \text{(Equation 12-30)}$$

Here, if a set obtained by means of equations 12-1 through 12-30 is designated D, set D is a set of integers in the range (−17 to 17). If (−17 to 17) integer set U is considered here, a complementary set of set D with respect to set U is as shown by equation 13.

[13]

$$\overline{D}=\{-1\ 2, -8, 8, 1\ 2\} \quad \text{(Equation 13)}$$

In equation 13, bar[D] represents a complementary set of set D with respect to set U, and bar corresponds to the symbol (¯) in equation 13. Below, bar[D] is written as $D^-$.

Looking at APP value derivation equation 5 in an APP decoding section, $(\alpha j-\alpha k)$—that is, a set D element—appears in the index of APP value $\lambda_{(i+\alpha j-\alpha k)}^{(\mu)}$. Considering this, and the fact that set D complementary set $D^-$ is represented by equation 13, it can be seen that received bit likelihoods or APP values of information bits of point-in-time (i−12), point-in-time (i−8), point-in-time (i+8), and point-in-time (i+12), for which (i−12), (i−8), (i+8), and (i+12) obtained by adding integers included in set D complementary set D⁻ to index i of point-in-time i are indexes are not used in point-in-time i information bit decoding.

Thus, with a self-orthogonal code, there are information bits that are not involved in point-in-time i APP decoding, and these bits are non-correlated bits.

Figure 6:
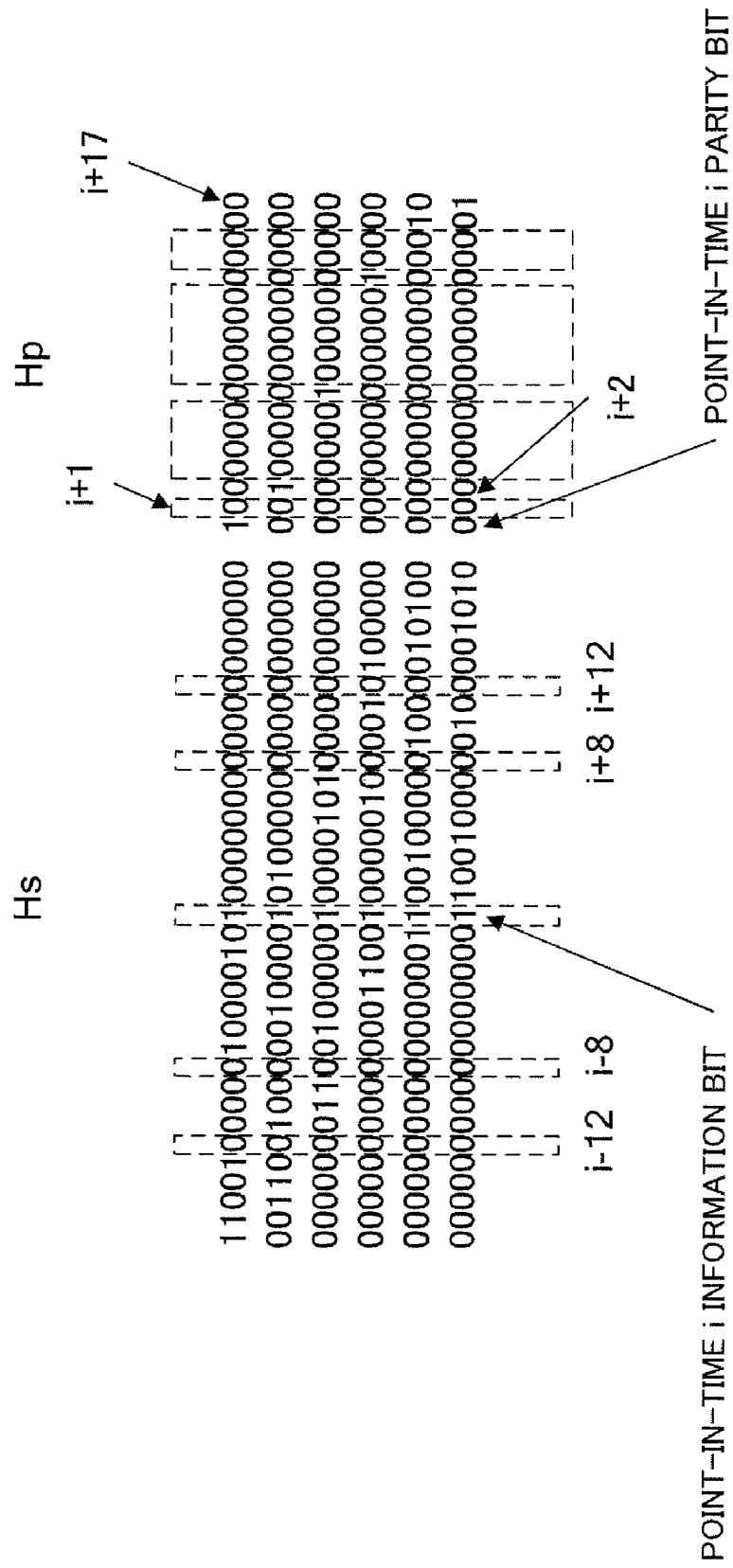
FIG. 6 is a drawing provided to explain a non-correlated bit.

Point-in-time i non-correlated bits will now be described using FIG. 6. FIG. 6 shows a part relating to point-in-time i information bit decoding in the J=6, K=18 self-orthogonal code parity check matrix H shown in FIG. 2—that is, a matrix in which only rows in which "1" is placed in a point-in-time i information bit are extracted.

Looking at FIG. 6, it can be seen that "1" is not placed in columns corresponding to information bits of point-in-time (i−12), point-in-time (i−8), point-in-time (i+8), and point-in-time (i+12). The fact of "1" not being placed in a parity check matrix means that information relating to information bits corresponding to that column is not used in APP decoding. As stated above, point-in-time (i−12), point-in-time (i−8), point-in-time (i+8), and point-in-time (i+12) are points in time for which values obtained by adding integers included in set D complementary set D⁻ to index i of point-in-time i are indexes. That is to say, it can be seen from the parity check matrix that, in point-in-time i information bit APP decoding, information bits of point-in-time (i−12), point-in-time (i−8), point-in-time (i+8), and point-in-time (i+12) for which values obtained by adding integers included in set D complementary set D⁻ to index i of point-in-time i are non-correlated bits of a point-in-time i information bit.

(LDPC-CC)

Next, an explanation will be given of non-correlated bits in an LDPC-CC.

Since an LDPC-CC parity check matrix has self-orthogonality, as described above, in a broad sense an LDPC-CC is also included among self-orthogonal codes. However, with an LDPC-CC, a generating polynomial is represented as shown in equation 11, and cases other than a complete difference set are also included, and therefore LDPC-CC non-correlated bits will be explained below using LDPC-CC parity check matrix H(D).

Figure 5:
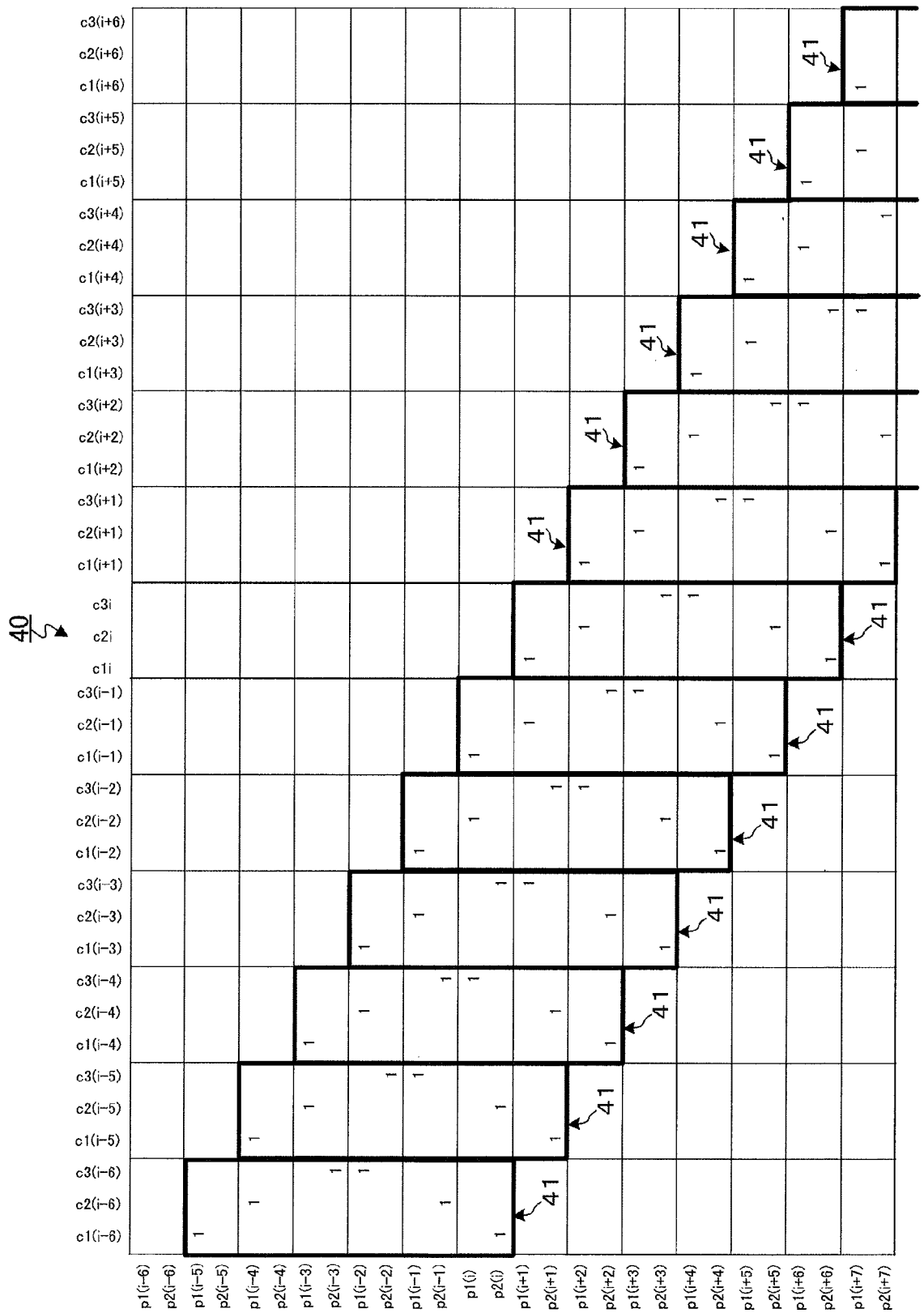
FIG. 5 is a drawing showing part of parity check matrix H of a self-orthogonal code.
Figure 7:
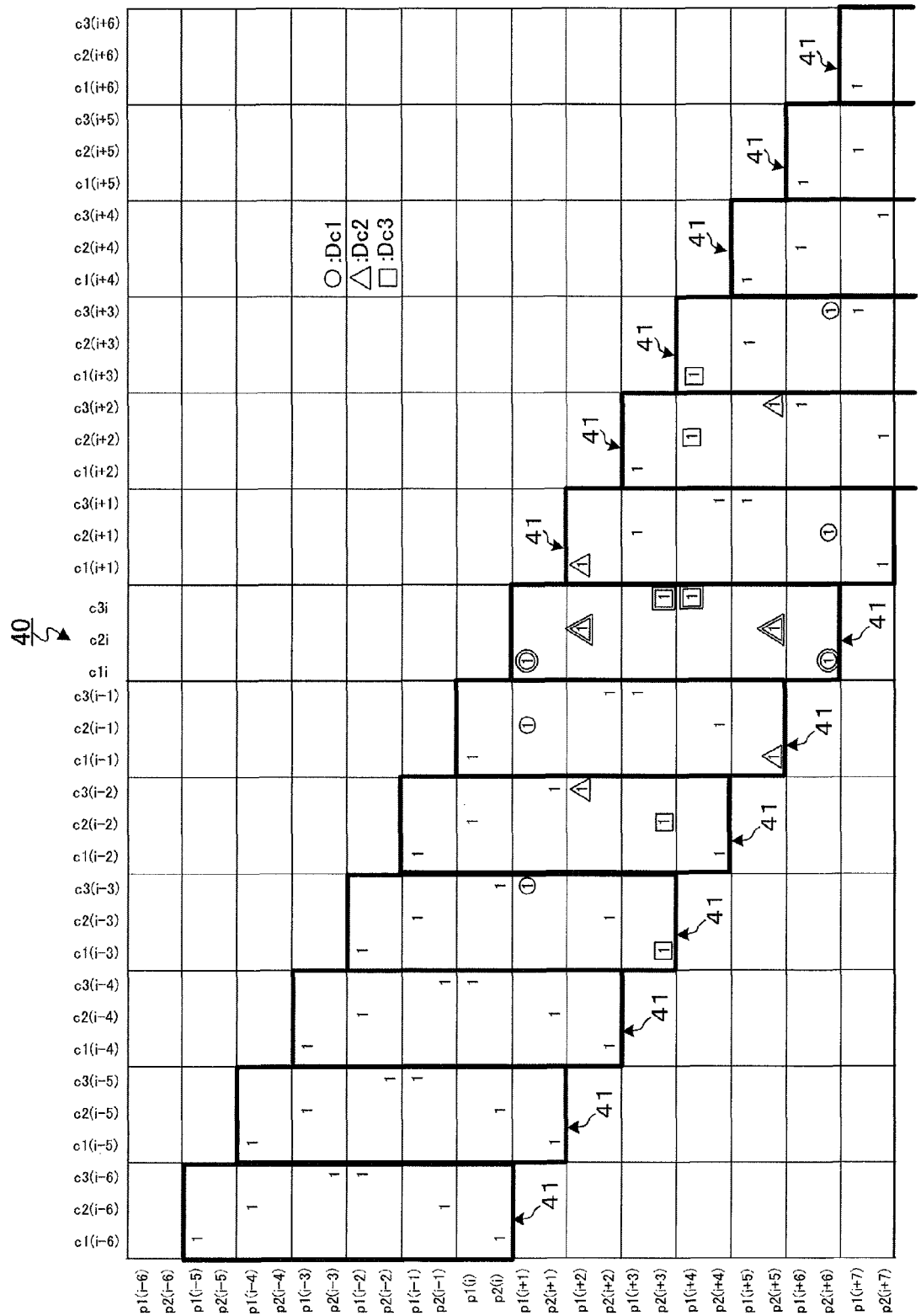
FIG. 7 is a drawing provided to explain self-single orthogonality of an LDPC-CC.

FIG. 7 is an example in which LDPC-CC parity check matrix H(D) given by equation 9 is described schematically by means of a matrix representation. Parts in FIG. 7 identical to those in FIG. 5 are assigned the same reference codes as in FIG. 5.

From parity check matrix 40 in FIG. 7, when a set of indexes of columns in which "1" is placed with respect to c1i (such a column being referred to hereinafter as a "single correlation column") is designated Dc1, c1i non-correlated bits are bits of points in time corresponding to columns included in a Dc1={c3(i−3), c2(i−1), c2(i+1), c3(i+3)} complementary set with respect to set Ucc of range (−6 to +6). In FIG. 7, a bit other than a bit of a point in time corresponding to a column including a circled "1" is a c1i non-correlated bit.

Also, with regard to c2i, a codeword bit of a point in time corresponding to a column included in a complementary set of single correlation column index set Dc2={c3(i−2), c1(i+1), c1(i−1), c3(i+2)} with respect to set Ucc is a non-correlated bit. In FIG. 7, a bit other than a bit of a point in time corresponding to a column including a "1" inside a triangle is a c2i non-correlated bit.

Furthermore, with regard to c3i, a codeword bit of a point in time corresponding to a column included in a complementary set of single correlation column index set Dc3={c1(i−3), c2(i−2), c2(i+2), c1(i+3)} with respect to set Ucc is a non-correlated bit. In FIG. 7, a bit other than a bit of a point in time corresponding to a column including a "1" inside a square is a c3i non-correlated bit.

To consider all of c1i, c2i, and c3i, in a similar way set Du of points in time at which there are non-correlated bits comprises points in time corresponding to columns including "1" inside a circle, triangle, or square—that is, Du={(c1(i−6), c2(i−6), c3(i−6), c1(i−5), c2(i−5), c3(i−5), c1(i−4), c2(i−4), c3(i−4), c2(i−3), c1(i−2), c3(i−1), c3(i+1), c1(i+2), c2(i+3), c1(i+4), c2(i+4), c3(i+4), c1(i+5), c2(i+5), c3(i+5), c1(i+6), c2(i+6), c3(i+6)}.

Thus, it can be seen that non-correlated bits in the case of an LDPC-CC are present symmetrically about point-in-time i, in the same way as in the case of a self-orthogonal code.

Since "1"s are not placed in columns corresponding to bits of points in time for which these values included in set Du are indexes, a bit likelihood of a codeword bit of a point in time for which a value included in set Du is an index is not used in point-in-time i information bit decoding.

Furthermore, double self-orthogonality of an LDPC-CC parity check matrix (self-double orthogonality) will be considered using parity check matrix 40 in FIG. 7. Below, self-double orthogonality will be described using FIG. 8, focusing on codeword bits corresponding to columns including circled "1"s in FIG. 7.

Figure 8:
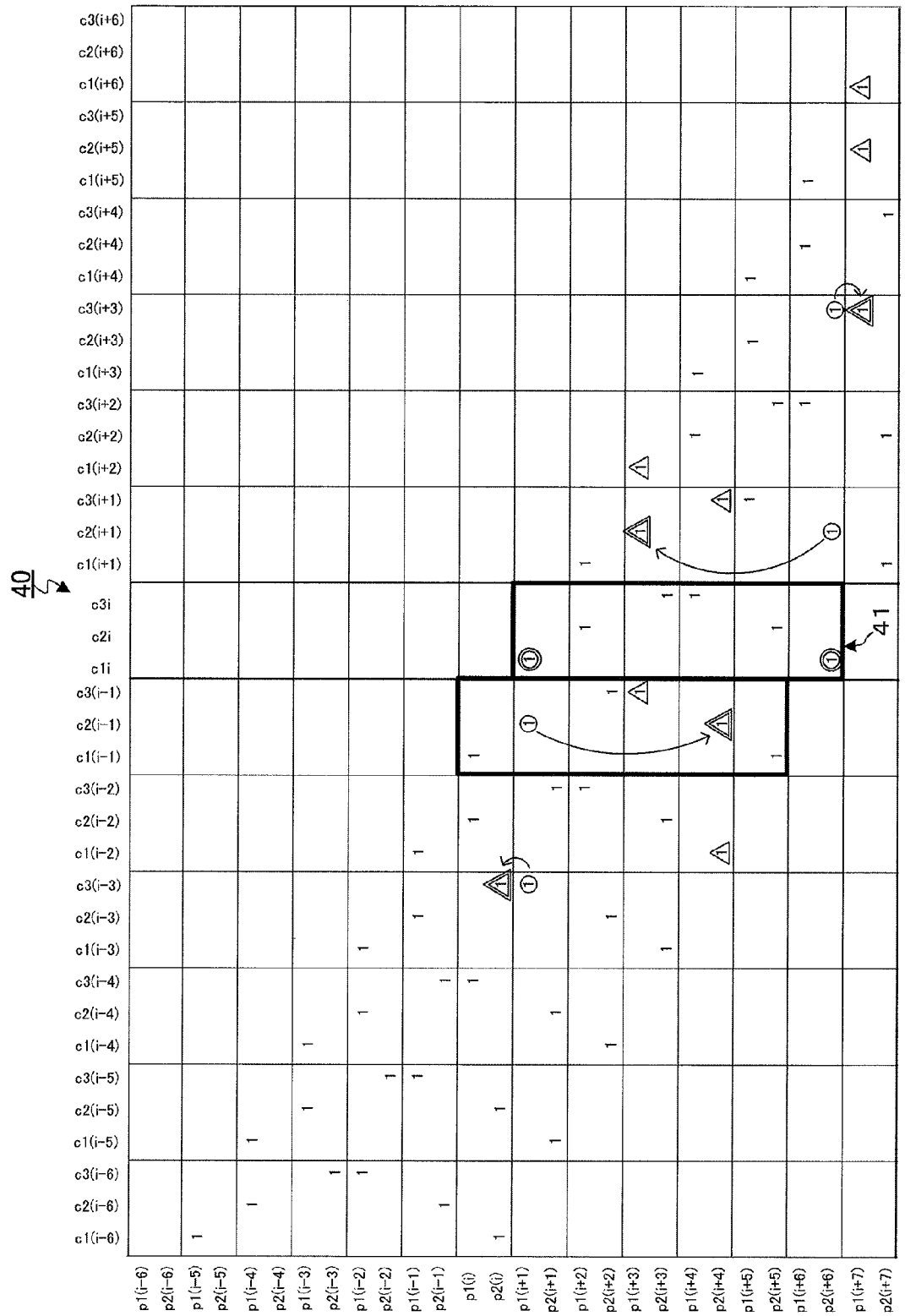
FIG. 8 is a drawing provided to explain self-double orthogonality of an LDPC-CC.

FIG. 8 is an example in which LDPC-CC parity check matrix H(D) given by equation 9 is described schematically by means of a matrix representation, in the same way as parity check matrix 40 in FIG. 7, and parts in FIG. 8 identical to those in FIG. 7 are assigned the same reference codes as in FIG. 7. Focusing on the c1i column of point-in-time i in parity check matrix 40 in FIG. 8, "1" is placed in the p1(i+1) and p2(i+6) rows. In these two rows, single correlation columns (columns in which "1" is placed other than c1i) are columns {c3(i−3), c2(i−1), c2(i+1), c3(i+3)} including a single-circled "1" in FIG. 8, and only one "1" is placed in each column.

Here, further focusing in a similar way on rows in which "1" is placed for each column included in single correlation columns {c3(i−3), c2(i−1), c2(i+1), c3(i+3)}, "1" is placed in the p2(i), p1(i+3), p2(i+4), and p1(i+7) rows. In these four rows, columns in which "1" is placed are columns including "1" inside a single triangle in FIG. 8—that is, columns {c3(i−6), c2(i−5), c1(i−2), c3(i−1), c3(i+1), c1(i+2), c2(i+5), c1(i+6)}. Columns in this set are called double correlation columns. At this time, double correlation columns in no case overlap with single correlation columns {c3(i−3), c2(i−1), c2(i+1), c3(i+3)}, and therefore parity check matrix 40 can be said to have self-double orthogonality with regard to codeword bit c1i.

Similarly, double correlation columns for c2i are {c1(i−5), c2(i−4), c3(i−4), c2(i−2), c2(i+2), c2(i+4), c3(i+4), c1(i+5)}. As these double correlation columns do not overlap with c2i single correlation columns, parity check matrix 40 also has self-double orthogonality with regard to codeword bit c2i. Furthermore, double correlation columns for c3i are {c3(i−6), c2(i−4), c3(i−4), c1(i−1), c1(i+1), c3(i+1), c3(i+4), c2(i+5)}, and as these double correlation columns do not overlap with c3i single correlation columns, parity check matrix 40 also has self-double orthogonality with regard to codeword bit c3i.

The meaning of a double correlation column in iterative decoding will now be explained. As stated earlier, only bits corresponding to single correlation columns are used in point-in-time i codeword bit decoding. Furthermore, bits used in decoding of codeword bits included in single correlation columns are codeword bits included in double correlation columns. That is to say, in the process of iterative decoding, a codeword bit included in a double correlation column corresponds to a codeword bit used in point-in-time i information bit decoding when not only the present iteration but also iterations up the one before are considered. Consequently, if a non-correlated bit for a point-in-time i codeword bit is found with this kind of self-double orthogonality also taken into consideration, correlation taking a plurality of decoding instances into consideration can be reduced.

Thus, with a self-orthogonal code or LDPC-CC parity check matrix, bits not used in point-in-time i information bit decoding (non-correlated bits) are present within a range of twice constraint length K centered on point-in-time i.

Embodiment 1

In this embodiment, a transmitting apparatus and transmission method are described whereby the fact that, in a self-orthogonal code or LDPC-CC parity check matrix, bits not used in point-in-time i information bit decoding (non-correlated bits) are present within a range of twice constraint length K centered on point-in-time i is focused upon, and a bit transmitted in the same modulation symbol as a point-in-time i information bit is made a non-correlated bit.

Figure 9:
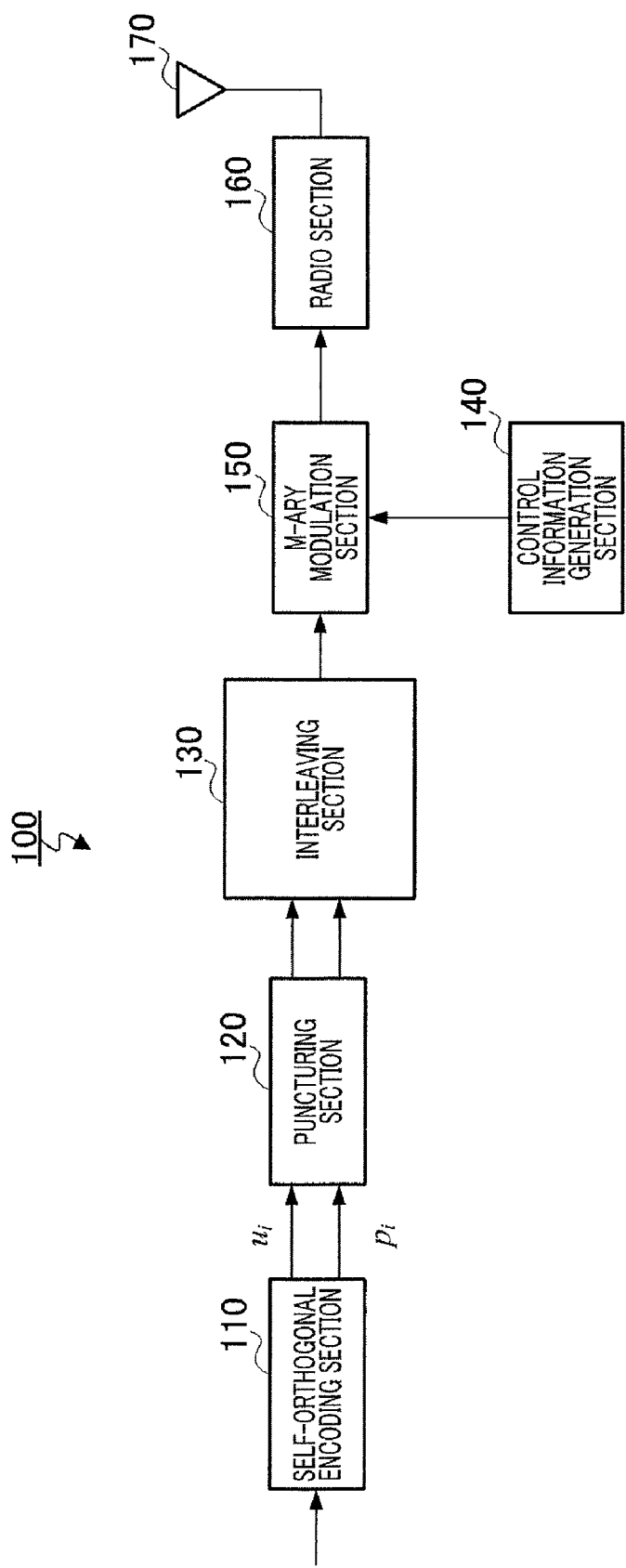
FIG. 9 is a block diagram showing a configuration of a transmitting apparatus according to Embodiment 1 of the present invention.

FIG. 9 shows a configuration of a transmitting apparatus according to this embodiment. Transmitting apparatus 100 in FIG. 9 comprises self-orthogonal encoding section 110, puncturing section 120, interleaving section 130, control information generation section 140, M-ary modulation section 150, radio section 160, and transmitting antenna 170.

Figure 10:
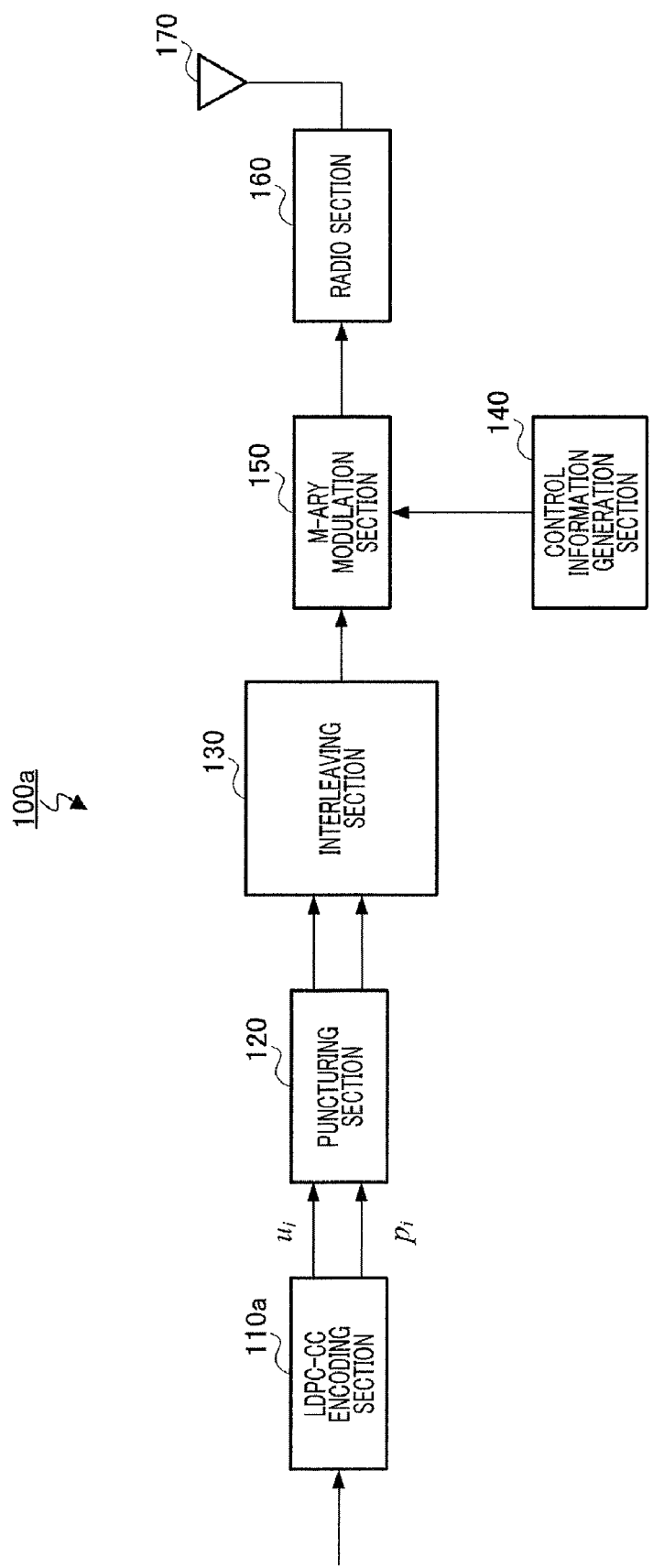
FIG. 10 is a block diagram showing another configuration of a transmitting apparatus according to Embodiment 1.

FIG. 10 shows a configuration of a transmitting apparatus when an LDPC-CC is used as an error correction code. In transmitting apparatus 100a in FIG. 10, self-orthogonal encoding section 110 of transmitting apparatus 100 in FIG. 9 is replaced by LDPC-CC encoding section 110a that performs LDPC-CC encoding processing. Since the operation of transmitting apparatus 100a as a transmitting apparatus implementing the present invention is similar to that of transmitting apparatus 100, transmitting apparatus 100 is used in the following description.

Self-orthogonal encoding section 110 performs self-orthogonal code encoding processing on a transmission information sequence, and generates a codeword sequence. In this embodiment, a case in which a self-orthogonal code is a systematic code is assumed, and self-orthogonal encoding section 110 generates a systematic bit sequence and parity bit sequence as codeword sequences. Then self-orthogonal encoding section 110 outputs the systematic bit sequence and parity bit sequence to puncturing section 120.

Puncturing section 120 performs puncturing on a parity bit sequence from self-orthogonal encoding section 110 based on a predetermined puncture pattern. Puncturing section 120 outputs a punctured parity bit sequence to interleaving section 130.

Interleaving section 130 has a systematic bit sequence and punctured parity bit sequence as input, and performs sequence order rearrangement (interleaving) processing on these codeword sequences. Interleaving section 130 performs codeword sequence rearrangement so that a bit transmitted in the same symbol as a point-in-time i information bit generated by self-orthogonal encoding section 110 is a non-correlated bit with respect to the point-in-time i information bit. The rearrangement (interleaving) processing method used by interleaving section 130 will be described in detail later herein. Interleaving section 130 outputs a rearranged (interleaved) codeword sequence to M-ary modulation section 150.

Control information generation section 140 generates control information necessary for transmitting and receiving signals between transmitting apparatus 100 and a communicating-party receiving apparatus. Control information includes, for example, the modulation method, the transmission information sequence length, a preamble signal for time/frequency synchronization, and so forth. Control information generation section 140 outputs the generated control information to M-ary modulation section 150.

M-ary modulation section 150 modulates a rearranged (interleaved) codeword sequence using a modulation method such as PSK (Phase Shift Keying), QAM (Quadrature Amplitude Modulation), or the like, and outputs an obtained transmission modulation symbol sequence to radio section 160.

Radio section 160 performs radio modulation processing such as D/A (Digital to Analog) conversion, frequency conversion, and RF (Radio Frequency) filtering processing on the transmission modulation symbol sequence, and generates a transmission RF signal. Radio section 160 transmits the generated transmission RF signal via transmitting antenna 170.

Figure 11:
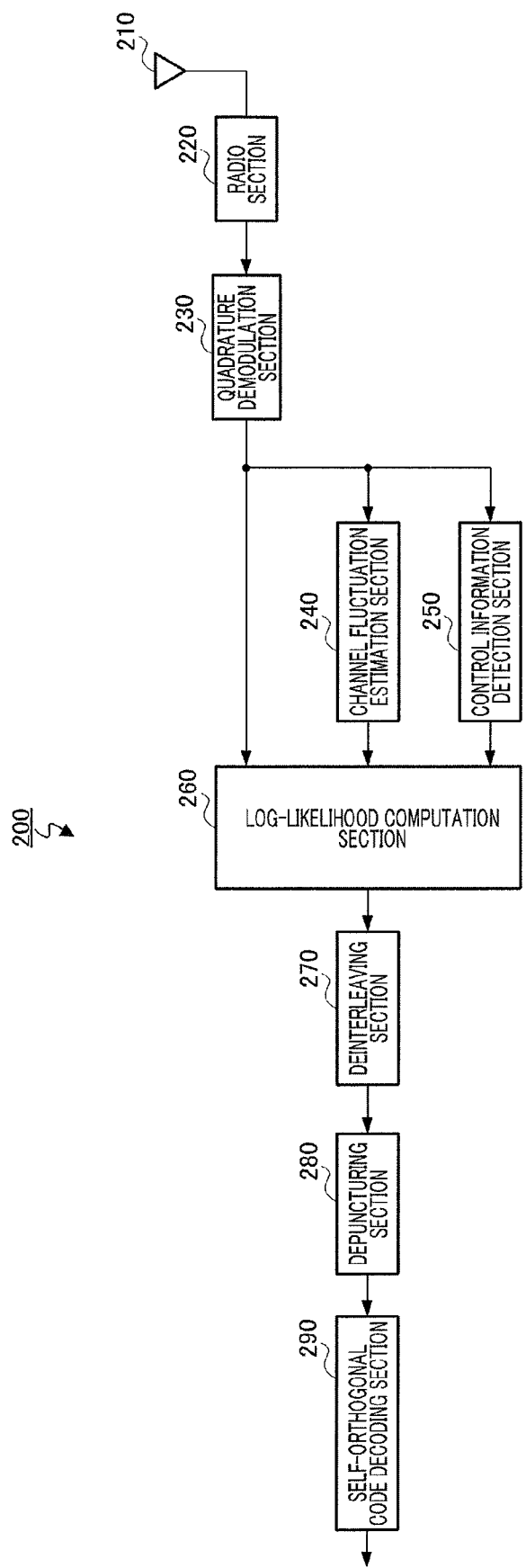
FIG. 11 is a block diagram showing a configuration of a receiving apparatus according to Embodiment 1.

FIG. 11 shows a configuration of a receiving apparatus according to this embodiment. Receiving apparatus 200 in FIG. 10 comprises receiving antenna 210, radio section 220, quadrature demodulation section 230, channel fluctuation estimation section 240, control information detection section 250, log-likelihood computation section 260, deinterleaving section 270, depuncturing section 280, and self-orthogonal code decoding section 290.

Figure 12:
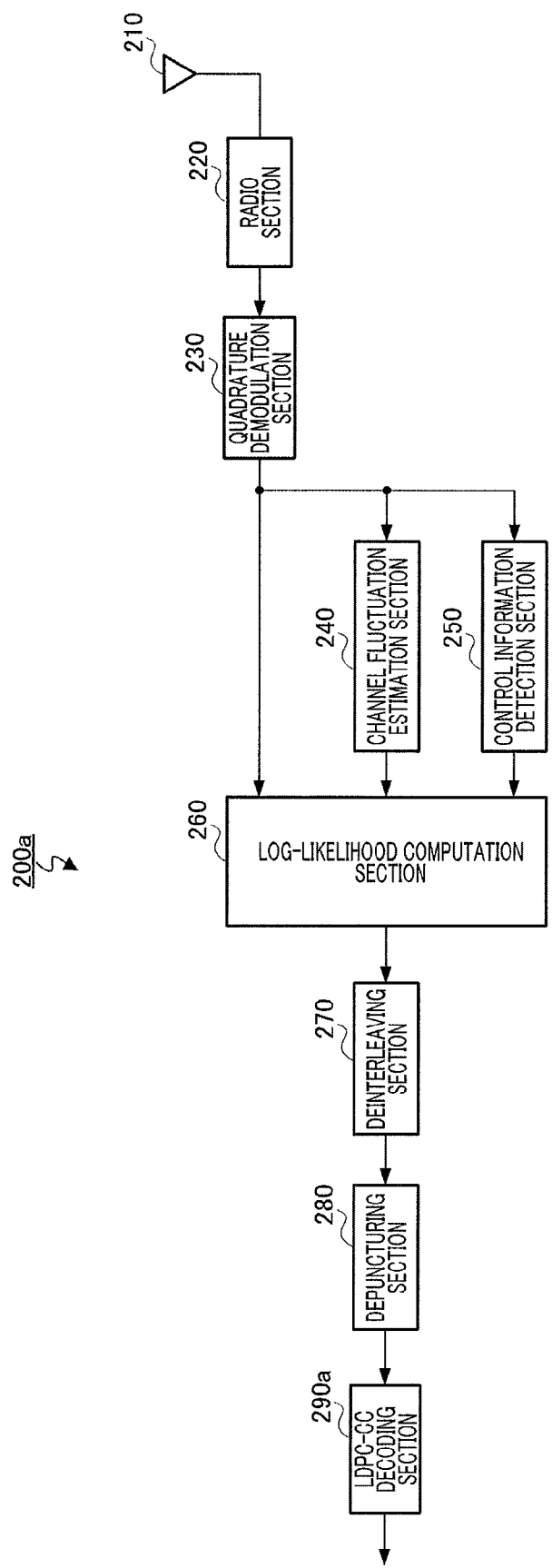
FIG. 12 is a block diagram showing another configuration of a receiving apparatus according to Embodiment 1.

FIG. 12 shows a configuration of a receiving apparatus when an LDPC-CC is used as an error correction code. In receiving apparatus 200a in FIG. 12, self-orthogonal code decoding section 290 of receiving apparatus 200 in FIG. 11 is replaced by LDPC-CC decoding section 290a. Since the operation of receiving apparatus 200a as a receiving apparatus implementing the present invention is similar to that of receiving apparatus 200, receiving apparatus 200 is used in the following description.

Receiving antenna 210 receives a transmission RF signal transmitted from transmitting apparatus 100, and outputs this signal to radio section 220.

Radio section 220 performs radio demodulation processing such as RF filtering processing, frequency conversion, and A/D (Analog to Digital) conversion, and outputs a radio-demodulated baseband signal to quadrature demodulation section 230.

Quadrature demodulation section 230 detects I-channel and Q-channel baseband signals from a radio-demodulated baseband signal output from radio section 220, and outputs the baseband signals to channel fluctuation estimation section 240, control information detection section 250, and log-likelihood computation section 260.

Channel fluctuation estimation section 240 utilizes a known signal included in a baseband signal to estimate channel fluctuation in the radio channel between transmitting apparatus 100 and receiving apparatus 200.

Control information detection section 250 detects a control signal included in a baseband signal, and outputs the detected control signal to log-likelihood computation section 260.

Log-likelihood computation section 260 finds a log-likelihood ratio of each transmitted codeword bit from a baseband signal, and outputs these to deinterleaving section 270.

Deinterleaving section 270 rearranges the order of a log-likelihood ratio sequence using processing that is the opposite of the rearrangement processing performed by interleaving section 130 of transmitting apparatus 100.

Depuncturing section 280 performs depuncturing of parity bits punctured by puncturing section 120 of transmitting apparatus 100. Specifically, depuncturing section 280 assigns 0 to the log-likelihood ratio of a punctured parity bit.

Self-orthogonal code decoding section 290 performs self-orthogonal code decoding using the log-likelihood ratio sequence, and outputs a decoding result hard decision value as a receiving apparatus 200 decoding result.

The operation of transmitting apparatus 100 and receiving apparatus 200 configured as described above will now be described, focusing on the operation of interleaving section 130 and M-ary modulation section 150. In the following description, self-orthogonal encoding section 110 is assumed to use the coding-rate-½, J=6, K=18 self-orthogonal code shown in FIG. 1, and a case is described in which transmitting apparatus 100 operates in a transmission mode in which the coding rate is ½ and the modulation method is 16QAM.

In self-orthogonal encoding section 110, self-orthogonal encoding is executed on transmission information sequence $u_i$ (where i=1, ... n), and a codeword sequence composed of systematic bit sequence $u_i$ identical to the transmission information sequence, and parity bit sequence $p_i$, is generated.

In puncturing section 120, bits in predetermined positions in a codeword sequence output from self-orthogonal encoding section 110 are punctured in accordance with a predetermined transmission mode. In this embodiment, the coding rate of self-orthogonal encoding section 110 is ½, and therefore when the transmission mode is coding-rate-½, 16QAM, puncturing is not performed by puncturing section 120, and a codeword sequence is output as-is to interleaving section 130.

In interleaving section 130, codeword sequence rearrangement processing is performed. Here, in transmitting apparatus 100 of the present invention, transmission is performed so that a bit transmitted in the same symbol as a point-in-time i information bit is a non-correlated bit, and therefore provision is made for this condition to be satisfied in interleaving section 130.

That is to say, interleaving section 130 performs codeword sequence rearrangement so that, in later-stage M-ary modulation section 150 a point-in-time i information bit in self-orthogonal encoding section 110 and a non-correlated bit with respect to a point-in-time i information bit are included in the same modulation symbol.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

Figure 13:
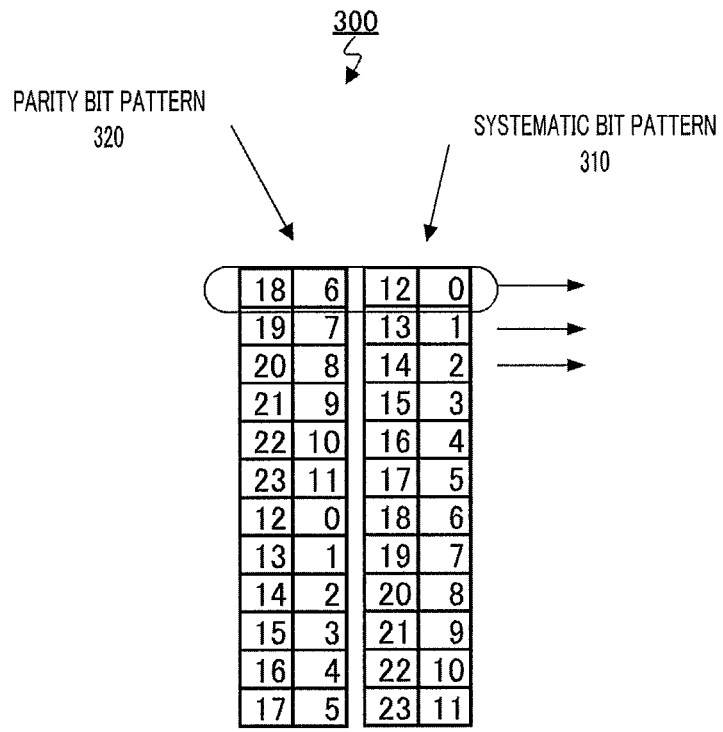
FIG. 13 is a drawing showing an example of an interleave pattern according to Embodiment 1.

FIG. 13 is a drawing explaining rearrangement (interleaving) processing performed by interleaving section 130. FIG. 13 shows an example of an interleave pattern in interleaving section 130. Interleave pattern 300 in FIG. 13 is an example of an interleave pattern in the case of a coding rate of ½. Interleave pattern 300 comprises systematic bit pattern 310 and parity bit pattern 320. Here, systematic bit pattern 310 is an interleave pattern for a systematic bit sequence, and parity bit pattern 320 is an interleave pattern for a parity bit sequence. Systematic bits $u_i$ and parity bit sequence $p_i$ are codeword sequences encoded by means of the J=6, K=18 self-orthogonal code shown in FIG. 6 above, and the numbers entered in each pattern represent index i of systematic bits $u_i$ and parity bit sequence $p_i$ bits.

Systematic bit pattern 310 is a length-12 interleaver, and shows the way in which bits are written into memory in interleaving section 130 in the vertical-direction order in FIG. 13. That is to say, systematic bits are written into memory in interleaving section 130 in the order u0, u1, u2, ..., u11. Then 12th bit u12 is written at the top of the next column. By this means, information bit u0 of point-in-time i and bit u12 of point-in-time (i+12) are rearranged so as to become laterally aligned. As explained above, bit u12 of point-in-time (i+12) is a non-correlated bit with respect to information bit u0 of point-in-time i. Thus, systematic bit pattern 310 laterally aligns information bit u0 of point-in-time i and u12, which is a non-correlated bit with respect to that bit u0.

Similarly, parity bit pattern 320 is a length-12 interleaver. Parity bit pattern 320 is equivalent to systematic bit pattern 310 cyclically shifted downward.

In the example shown in FIG. 13, parity bit pattern 320 laterally aligns parity bits p6 and p18 and bits u0 and u12. Parity bits p6 and p18 are parity bits that are not used in decoding of bits u0 and u12, and parity bit p18 is a non-correlated bit with respect to parity bit p6. Thus, parity bit pattern 320 laterally aligns information bit u0 of point-in-time i and parity bit p6 that is not used in decoding of bit u12 of point-in-time (i+12). Furthermore, parity bit pattern 320 laterally aligns parity bit p18 that is a non-correlated bit with respect to that parity bit p6, and is not used in decoding of information bit u0 of point-in-time i and bit u12 of point-in-time (i+12).

A codeword sequence rearranged in this way is output sequentially to M-ary modulation section 150 in the horizontal direction of interleave pattern 300. Therefore, a codeword sequence is output from interleaving section 130 to M-ary modulation section 150 in the order u0, u12, p6, p18, u1, u13, ..., for example.

In M-ary modulation section 150, M-ary modulation processing is executed on a bit sequence output from interleaving section 130. When 16QAM is used as a modulation method in M-ary modulation section 150, four successively input bits are modulated as one modulation symbol.

Therefore, when interleave pattern 300 is used, if a modulation symbol is designated xj, bits composing respective symbols are as follows: x0={u0, u12, p6, p18}, x1={u1, u13, p7, p19}, ..., x11={u11, u23, p5, p17}.

Transmission modulation symbol xj is converted to a transmission RF signal by radio section 160, and the transmission RF signal is transmitted to receiving apparatus 200 via transmitting antenna 170.

A transmission RF signal transmitted from transmitting antenna 170 is affected by fading, interference, and so forth in the radio channel, and is received by receiving antenna 210 of receiving apparatus 200.

Receiving antenna 210 receives a transmission RF signal transmitted from transmitting apparatus 100, and outputs this signal to radio section 220.

In radio section 220, radio demodulation processing such as RF filtering processing, frequency conversion, and A/D conversion, is performed on a received signal received by receiving antenna 210, and then I-channel and Q-channel baseband signals are detected by quadrature demodulation section 230.

In channel fluctuation estimation section 240, a known signal included in a baseband signal is utilized to estimate channel fluctuation in the radio channel between transmitting apparatus 100 and receiving apparatus 200.

In control information detection section 250, a control signal included in a baseband signal is detected, and the control signal is output to log-likelihood computation section 260.

In log-likelihood computation section 260, a log-likelihood ratio of each transmitted codeword bit is found from a baseband signal, and the obtained log-likelihood ratios are output to deinterleaving section 270.

In deinterleaving section 270, the order of a log-likelihood ratio sequence is rearranged using processing that is the opposite of the rearrangement processing performed by interleaving section 130 of transmitting apparatus 100.

In depuncturing section 280, depuncturing of parity bits punctured by puncturing section 120 of transmitting apparatus 100 is performed. Specifically, 0 is assigned to the log-likelihood ratio of a punctured parity bit.

In self-orthogonal code decoding section 290, self-orthogonal code decoding is performed using the log-likelihood ratio sequence, and a decoding result hard decision value is output as a decoding result. Self-orthogonal code decoding can be implemented by updating the APP value of each bit by means of iterative decoding, as shown in equation 5.

Here, a case will be considered in which the reception level of a particular transmission modulation symbol xj falls due to fading fluctuation in the radio channel. At this time, the SNR (Signal to Noise Ratio) of transmission modulation symbol xj becomes lower if thermal noise generated by radio section 220 of receiving apparatus 200 is included. It is known that, in general, if the SNR of a modulation symbol is low, the absolute value of the log-likelihood ratio of a bit included in the modulation symbol decreases.

Therefore, if transmission modulation symbol xj comprises a combination of bits that are non-correlated bits, decoding characteristics may degrade. For example, consider a case in which transmission modulation symbol x0 comprises the combination {u0, u1, p0, p2}. As can be seen from equation 5 and αj, u1, p0, and p2 are not used in decoding of the u0 bit. Consequently, if the reception level of transmission modulation symbol x0 falls due to fading fluctuation, the log-likelihood ratios of u0, u1, p0, and p2 become small absolute values at the same time. Thus, when transmission modulation symbol x0 comprises a combination of bits other than non-correlated bits, the absolute values of the log-likelihood ratios of information bits u1, p0, and p2 involved in decoding of information bit u0 become smaller at the same time, and therefore characteristics may degrade significantly.

In contrast, in this embodiment, x0 comprises the combination {u0, u12, p6, p18}, for example, through codeword sequence rearrangement using interleave pattern 300 in FIG. 13. At this time, u12, p6, and p18 are non-correlated bits with respect to u0, and u12, p6, and p18 are bits that are not used in decoding of u0. Consequently, even if the reception level of transmission modulation symbol xj comprising a combination of non-correlated bits is low, and the log-likelihood ratios of u0, u12, p6, and p18 become small absolute values at the same time, decoding of information bit u0 is not affected since the log-likelihood ratios of information bits u12, p6, and p18 are not used in decoding of u0.

Thus, in this embodiment, provision is made for a non-correlated bit with respect to a point-in-time i information bit to be assigned preferentially to a modulation symbol in which a point-in-time i information bit is transmitted. In this way, degradation of decoding characteristics can be suppressed even if the reception level of a particular transmission modulation symbol xj falls due to fading fluctuation.

As described above, according to this embodiment, self-orthogonal encoding section 110 performs convergence-length-K self-orthogonal code encoding, and M-ary modulation section 150 modulates a point-in-time i information bit and a non-correlated bit that is not used in point-in-time i information bit decoding in the same modulation symbol.

Also, interleaving section 130 performs codeword sequence rearrangement so that the same modulation symbol includes a point-in-time i information bit and a non-correlated bit with respect to a point-in-time i information bit in later-stage M-ary modulation section 150.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

In the case of a self-orthogonal code, if a set composed of differences of elements of a complete difference set defining the self-orthogonal code is designated set D, and a set of integers in the range −(K−1) to (K−1) is designated set U, an information bit at a point in time separate from point-in-time i by the number of complementary sets of set D (set D complementary sets D⁻) with respect to set U is a non-correlated bit with respect to a point-in-time i information bit. Also, not only a systematic bit, but also a parity bit that is not used in point-in-time i information bit decoding, is similarly a non-correlated bit.

By this means, the effect of decoding performance degradation due to an absolute value of a log-likelihood ratio becoming smaller can be dispersed, and transmission error rate characteristic degradation in overall APP decoding can be suppressed, even in a case such as when the reception level of a transmission modulation symbol falls due to fading fluctuation.

In this embodiment, the case of a transmission mode using a coding rate of ½ and a 16QAM modulation method has been described as an example, but the transmission mode may be other than this. As an example, a case in which the coding rate is ¾ is described below.

In the case of a coding rate of ¾, puncturing section 120 performs puncturing on parity bits obtained by self-orthogonal encoding.

As in the case of a coding rate of ½, interleaving section 130 performs codeword sequence rearrangement so that, in later-stage M-ary modulation section 150, a point-in-time i information bit in self-orthogonal encoding section 110 and a non-correlated bit with respect to a point-in-time i information bit are included in the same transmission symbol.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

Figure 14:
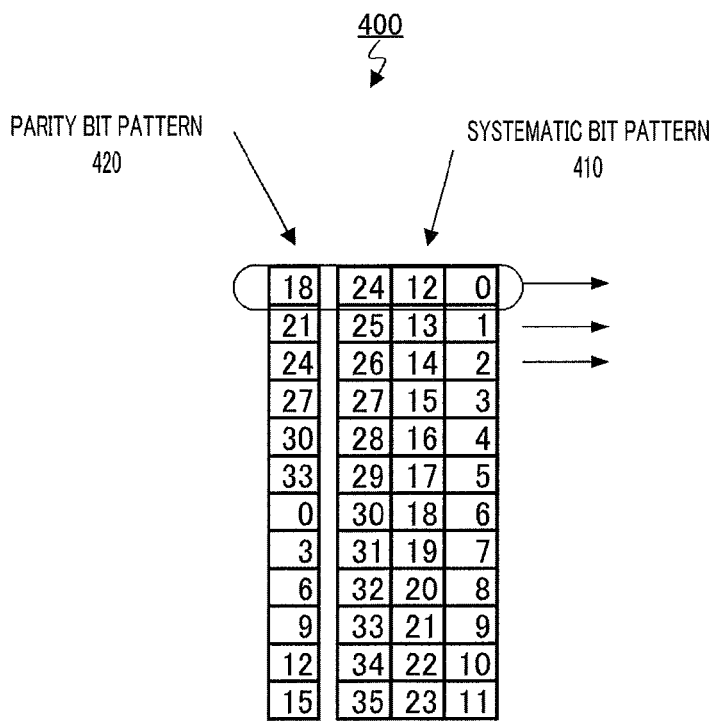
FIG. 14 is a drawing showing another example of an interleave pattern according to Embodiment 1.

FIG. 14 is a drawing showing an example of an interleave pattern. Interleave pattern 400 in FIG. 13 is an example of an interleave pattern in the case of a coding rate of ¾, and comprises systematic bit pattern 410 and parity bit pattern 420. Here, systematic bit pattern 410 is an interleave pattern for a systematic bit sequence, and parity bit pattern 420 is an interleave pattern for a parity bit sequence. The numbers entered in each pattern represent index i of systematic bits $u_i$ and parity bit sequence $p_i$ bits. Systematic bits $u_i$ and parity bit sequence $p_i$ are codeword sequences encoded by means of the J=6, K=18 self-orthogonal code shown in FIG. 6 above.

Through the use of interleave pattern 400 in FIG. 14, transmission modulation symbol x0 comprises {u0, u12, u24, p18}. As described above, since this combination comprises non-correlated bits, the same kind of effect can be obtained. Even in the case of a different coding rate and modulation method, the same kind of effect can be obtained by providing a configuration such that a point-in-time i information bit and a non-correlated bit with respect to that information bit are included in the same modulation symbol.

In this embodiment, cases have been described in which codeword sequence rearrangement is performed using interleave patterns 300 and 400 shown in FIG. 13 and FIG. 14, but this is not a limitation, and the same kind of effect can be obtained as long as the interleave pattern provides for codeword sequence rearrangement to be performed so that non-correlated bits are present in the same modulation symbol.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

For example, in the above description, a case has been described in which interleaving section 130 focuses on "−12" and "+12" among the four integers {−12, −8, +8, +12} included in set D complementary set D⁻, and performs codeword sequence rearrangement so that a point-in-time i information bit and point-in-time (i+12) bit are transmitted in the same modulation symbol. However, the combination is not limited to this, and provision may also be made for interleaving section 130 to perform codeword sequence rearrangement so that "−8" and "+8" are used and a point-in-time i information bit and point-in-time (i+8) bit are transmitted in the same modulation symbol. As well as providing for bits transmitted in the same transmission symbol to be made a combination of non-correlated bits, this also enables the size of the interleaver to be made smaller than when "−12" and "+12" are used.

Figure 15:
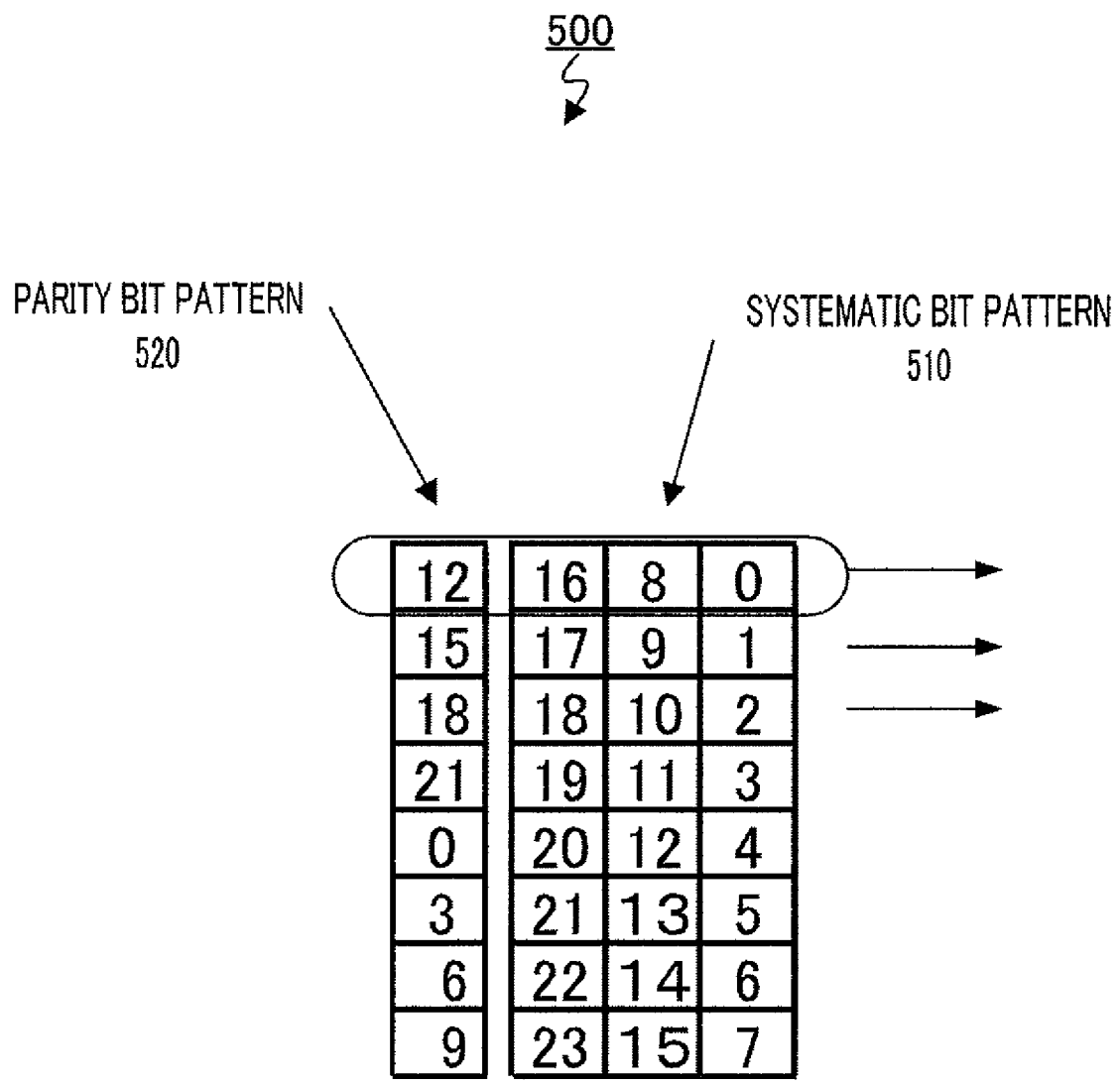
FIG. 15 is a drawing showing an example of an interleave pattern according to Embodiment 1.

FIG. 15 shows an example of an interleave pattern for which the interleaver size is 8 in the case of a transmission mode using a coding rate of ¾ and a 16QAM modulation method. In accordance with interleave pattern 500 in FIG. 15, bits included in one 16QAM symbol are {u0, u8, u16, p12}, which is not a combination in which all the bits are non-correlated bits. Therefore, it is necessary to take the following conditions into consideration in order to include a desired number of information bit non-correlated bits in one modulation symbol.

(1) When Including Two Information Bit Non-Correlated Bits in the Same Modulation Symbol Non-correlated bits are chosen from among integers included in set D complementary set D⁻ using the integer with the smallest absolute value. In the above example, this corresponds to the selection of "−8" and "+8". In this case, a combination of non-correlated bits can be created with a small-size interleaver.

(2) When Including m (where m≧3) Information Bit Non-Correlated Bits in the Same Modulation Symbol Among integers included in set D complementary set D⁻, a value multiplied by (m−1) is chosen from integers included in complementary set D⁻. Alternatively, an integer is selected for which a value multiplied by (m−1) is outside the range of set U. In the example shown in FIG. 14, values obtained by doubling {−12, +12} are outside the range of set U, and therefore all the bits composing modulation symbol x0 can be made non-correlated bits as shown in FIG. 14 by using a size-12 interleaver.

When an LDPC-CC is used as an error correction code, provision is made for a modulation symbol in which a point-in-time i information bit is included to include preferentially a bit of other than a single correlation column of that information bit. Furthermore, provision may also be made for a modulation symbol to be configured using a bit of other than a single correlation column of that information bit or a bit of other than a double correlation column of that information bit.

Embodiment 2

In this embodiment, a transmitting apparatus and transmission method are described whereby the fact that, in a self-orthogonal code or LDPC-CC parity check matrix, bits not used in point-in-time i information bit decoding (non-correlated bits) are present within a range of twice the constraint length centered on point-in-time i is focused upon, and a non-correlated bit with respect to a point-in-time i information bit is transmitted in a modulation symbol that is temporally consecutive to a modulation symbol including a point-in-time i information bit. According to a transmitting apparatus and transmitting method of this embodiment, when there is temporal fading, a burst-type reception SNR fall due to a fall in that fluctuation can be avoided, and error correction decoding can be performed effectively.

Figure 16:
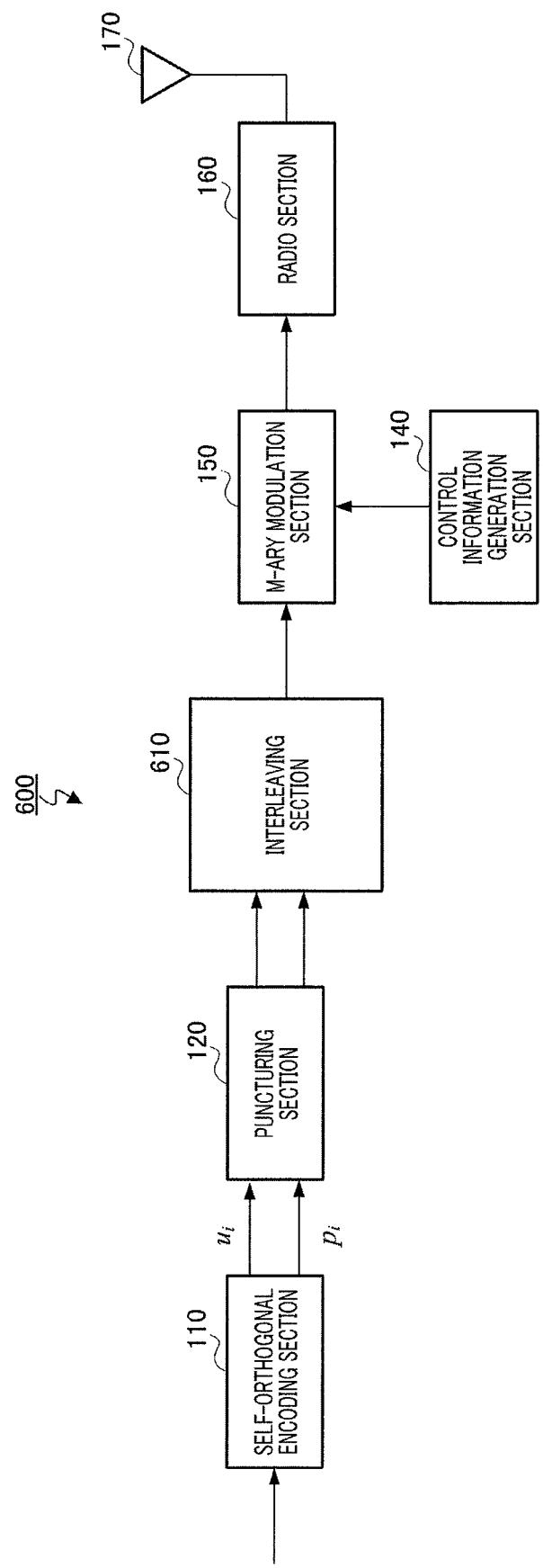
FIG. 16 is a block diagram showing another configuration of a transmitting apparatus according to Embodiment 2 of the present invention.

FIG. 16 shows a configuration of a transmitting apparatus according to this embodiment. Configuration parts in FIG. 16 common to FIG. 9 are assigned the same reference codes as in FIG. 9, and descriptions thereof are omitted here. Transmitting apparatus 600 in FIG. 16 is equipped with interleaving section 610 instead of interleaving section 130 of transmitting apparatus 100 in FIG. 9.

Interleaving section 610 performs codeword sequence rearrangement so that a non-correlated bit with respect to a point-in-time i information bit is transmitted in a modulation symbol that is temporally consecutive to a modulation symbol including a point-in-time i information bit. Interleaving is described below using FIG. 17.

Figure 17:
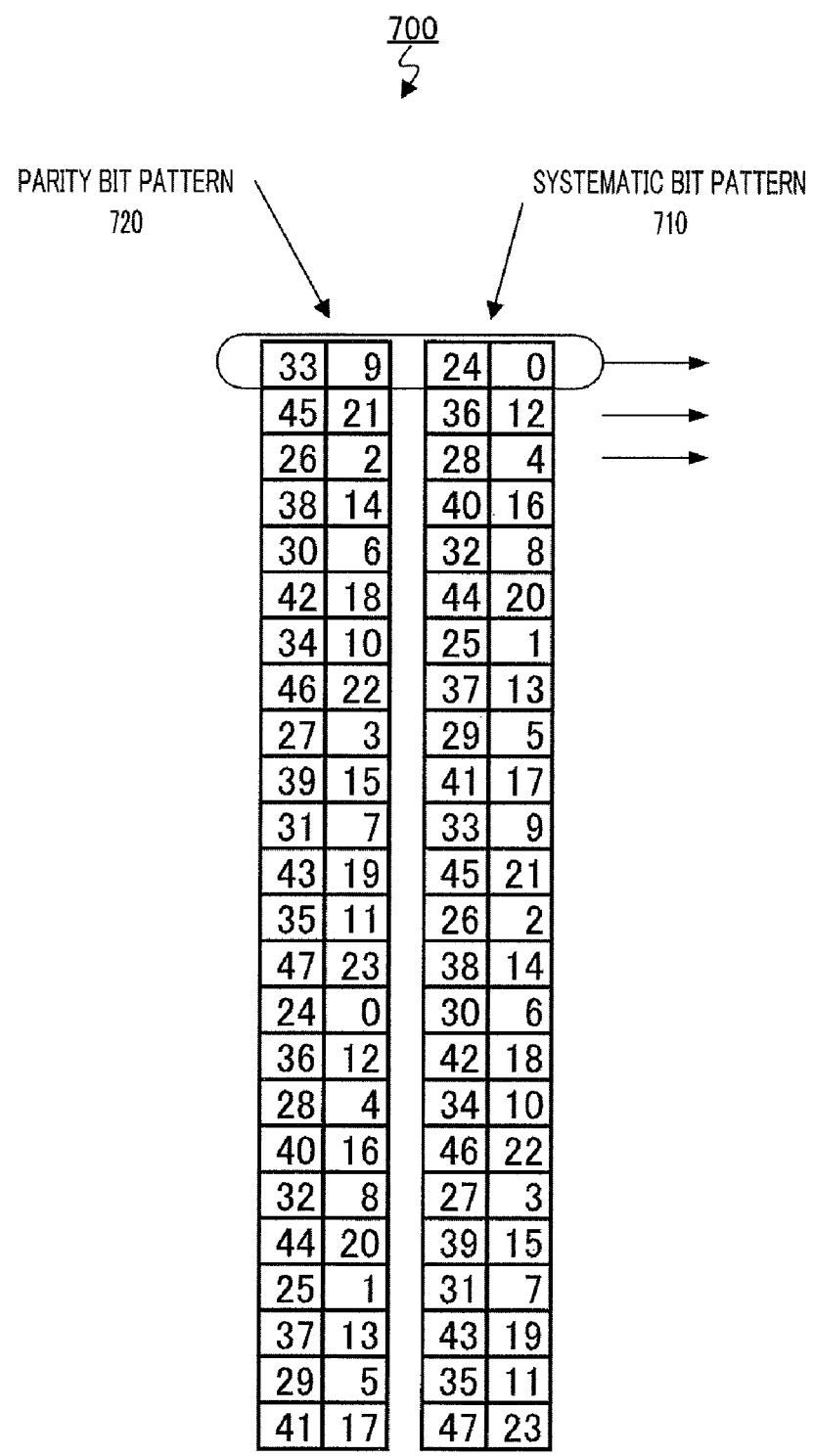
FIG. 17 is a drawing showing an example of an interleave pattern according to Embodiment 2.

FIG. 17 is a drawing showing an example of an interleave pattern in interleaving section 610. Interleave pattern 700 in FIG. 17 is an example of an interleave pattern in the case of a transmission mode using a coding rate of ½ and a 16QAM modulation method, in which systematic bit pattern 710 is an interleave pattern for a systematic bit sequence, and parity bit pattern 720 is an interleave pattern for a parity bit sequence. The numbers entered in each pattern represent bit indexes.

Systematic bit pattern 710 is a length-24 interleaver, and shows the way in which bits are written into memory in interleaving section 610 in the index order shown in FIG. 17. Then 24th bit u24 is written at the top of the next column. By this means, information bit u0 of point-in-time i and bit u24 of point-in-time (i+24) are rearranged so as to become laterally aligned. As explained above, bit u24 of point-in-time (i+24) is a non-correlated bit with respect to information bit u0 of point-in-time i.

Also, by using systematic bit pattern 710, information bit u0 of point-in-time i and bit u12 of point-in-time (i+12) are rearranged so as to become vertically aligned. As explained above, bit u12 of point-in-time (i+12) is a non-correlated bit with respect to information bit u0 of point-in-time i.

Similarly, parity bit pattern 720 is a length-24 interleaver. Parity bit pattern 720 is equivalent to systematic bit pattern 710 cyclically shifted downward.

In the example shown in FIG. 17, parity bit pattern 720 laterally aligns parity bits p9 and p33 and bits u0 and u24. Parity bits p9 and p33 are parity bits that are not used in decoding of bits u0 and u24, and parity bit p33 is a non-correlated bit with respect to parity bit p9.

Also, by using parity bit pattern 720, parity bit p9 of point-in-time (i+9) and parity bit p21 of point-in-time (i+21) are rearranged so as to become vertically aligned. Parity bit p21 of point-in-time (i+21) is a non-correlated bit with respect to parity bit p9 of point-in-time (i+9).

A codeword sequence rearranged in this way is output sequentially to M-ary modulation section 150 in the horizontal direction of interleave pattern 700. Therefore, a codeword sequence is output from interleaving section 610 to M-ary modulation section 150 in the order u0, u24, p9, p33, u12, u36, p21, p45, . . . , for example.

In M-ary modulation section 150, M-ary modulation processing is executed on a bit sequence output from interleaving section 610. When 16QAM is used as a modulation method in M-ary modulation section 150, four successively input bits are modulated as one modulation symbol.

Therefore, when interleave pattern 700 is used, if a modulation symbol is designated xj, bits composing respective symbols are as follows: x0={u0, u24, p9, p33}, x1={u12, u36, p21, p45}, . . . .

By this means, when 16QAM modulation is performed every 4 bits, a bit included in the same modulation symbol in which a point-in-time i information bit is included can be made a non-correlated bit, and bits included in modulation symbols that are consecutive in the time domain can be made non-correlated bits for a modulation symbol including a point-in-time i information bit.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

Thus, interleaving section 610 performs transmission codeword sequence rearrangement so that a non-correlated bit with respect to a point-in-time i information bit is included in a modulation symbol that is transmitted temporally consecutively to a modulation symbol including a point-in-time i information bit.

As described above, according to this embodiment, self-orthogonal encoding section 110 acquires encoded bits by performing self-orthogonal code encoding, M-ary modulation section 150 converts encoded bits to a modulation symbol, and interleaving section 610 performs transmission codeword sequence rearrangement so that a non-correlated bit with respect to a point-in-time i information bit is included in a modulation symbol that is transmitted temporally consecutively to a modulation symbol including a point-in-time i information bit. By this means, since a modulation symbol including a point-in-time i information bit and a modulation symbol including a non-correlated bit with respect to a point-in-time i information bit are transmitted temporally consecutively, even if the reception levels of a modulation symbol including a point-in-time i information bit and a modulation symbol including a non-correlated bit with respect to a point-in-time i information bit fall in a burst fashion due to temporal fading fluctuation, the effect of decoding performance degradation due to an absolute value of a log-likelihood ratio becoming smaller can be dispersed, and transmission error rate characteristic degradation in overall APP decoding can be suppressed, since a non-correlated bit that is not involved in decoding of a point-in-time i information bit is included in a modulation symbol transmitted temporally consecutively to a modulation symbol including a point-in-time i information bit.

A modulation symbol including a point-in-time i information bit and a modulation symbol including a non-correlated bit with respect to a point-in-time i information bit need not necessarily be transmitted temporally consecutively, and the same kind of effect can also be obtained if rearrangement is performed so that these modulation symbols are transmitted in a period of time in which reception levels fall in a burst fashion due to fading fluctuation.

Figure 18:
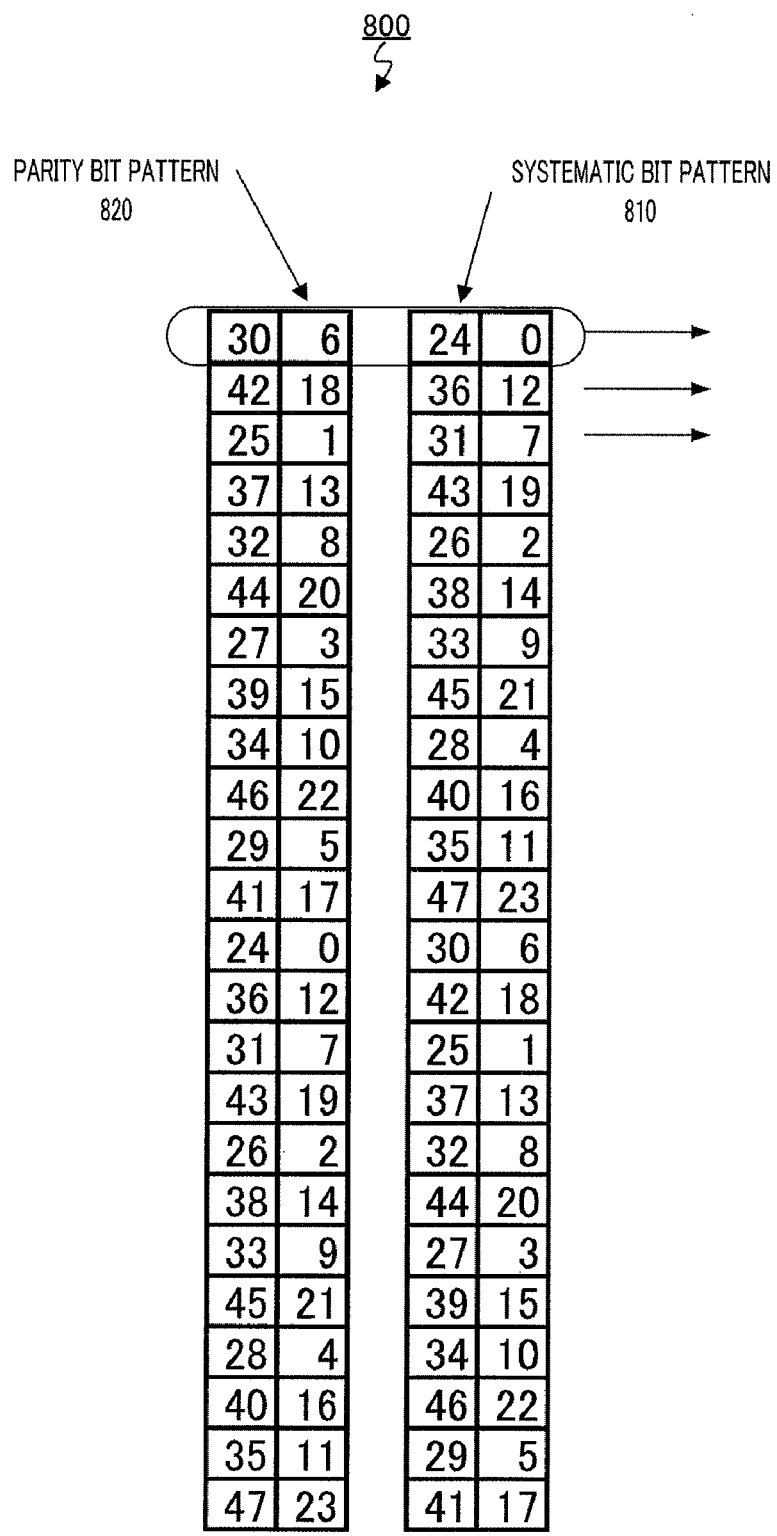
FIG. 18 is a drawing showing another example of an interleave pattern according to Embodiment 2.

In this embodiment, a case has been described by way of example in which codeword sequence rearrangement is performed using interleave pattern 700 shown in FIG. 17, but this is not a limitation, and the same kind of effect can be obtained as long as an interleave pattern is used that performs codeword sequence rearrangement so that non-correlated bits are included in modulation symbols that are transmitted temporally consecutively. FIG. 18 shows another example of an interleave pattern. When interleave pattern 800 shown in FIG. 18 is used, also, the same modulation symbol is configured by means of non-correlated bits, and non-correlated bits are included in modulation symbols that are transmitted temporally consecutively.

By this means, in addition to achieving the effects described in Embodiment 1, degradation of decoding performance can be suppressed even if the reception levels of a plurality of modulation symbols fall temporally consecutively due to fading fluctuation.

Embodiment 3

In this embodiment, a transmitting apparatus and transmission method are described whereby the fact that, in a self-orthogonal code or LDPC-CC parity check matrix, bits not used in point-in-time i information bit decoding (non-correlated bits) are present within a range of twice the constraint length centered on point-in-time i is focused upon, and, when multicarrier signal transmission is performed, a non-correlated bit with respect to a point-in-time i information bit is transmitted in a modulation symbol of a frequency adjacent to that of a modulation symbol including a point-in-time i information bit. According to a transmitting apparatus and transmitting method of this embodiment, when there is frequency fading, a burst-type reception SNR fall due to a fall in frequency characteristics can be avoided, and error correction decoding can be performed effectively.

Figure 19:
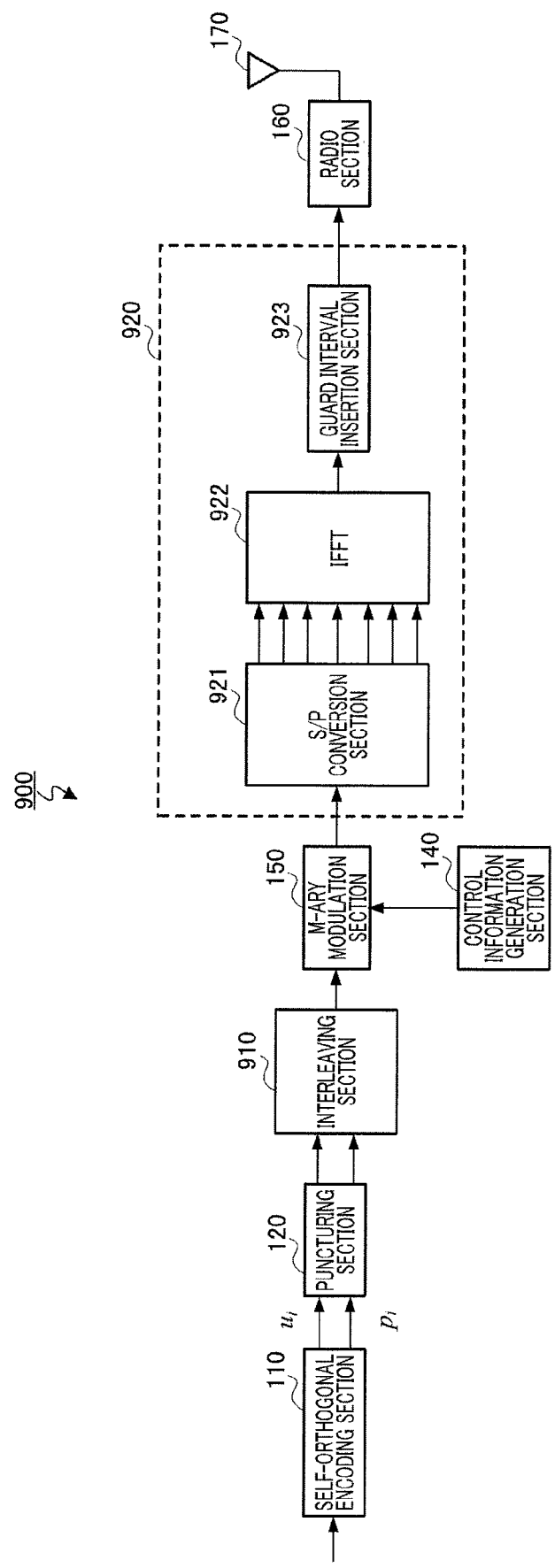
FIG. 19 is a block diagram showing another configuration of a transmitting apparatus according to Embodiment 3 of the present invention.

FIG. 19 shows a configuration of a transmitting apparatus according to this embodiment. Configuration parts in FIG. 19 common to FIG. 9 are assigned the same reference codes as in FIG. 9, and descriptions thereof are omitted here. Transmitting apparatus 900 in FIG. 19 is a multicarrier signal (OFDM signal) transmitting apparatus, and has a configuration in which interleaving section 910 is provided instead of interleaving section 130 of transmitting apparatus 600 in FIG. 19, and OFDM forming section 920 has been added.

OFDM forming section 920 comprises S/P (Serial to Parallel) conversion section 921, IFFT (Inverse Fast Fourier Transform) section 922, and guard interval insertion section 923. S/P conversion section 921 performs serial/parallel conversion to map a modulation symbol output from M-ary modulation section 150 onto multicarrier signal frequencies. S/P conversion section 921 outputs a serial/parallel-conversed modulation symbol to IFFT section 922. IFFT section 922 performs multicarrier modulation using IFFT on a parallel-input modulation symbol, generates a time domain signal, and outputs the generated time domain signal to guard interval insertion section 923. Guard interval insertion section 923 inserts a guard interval in the multicarrier modulation signal output from IFFT section 922, and outputs a guard-interval-inserted time domain signal to radio section 160.

Interleaving section 910 performs codeword sequence rearrangement so that a modulation symbol including a non-correlated bit that is not used in point-in-time i information bit decoding is transmitted at a frequency adjacent to a frequency at which a modulation symbol including a point-in-time i information bit is transmitted. Interleaving is described below using FIG. 20.

Figure 20:
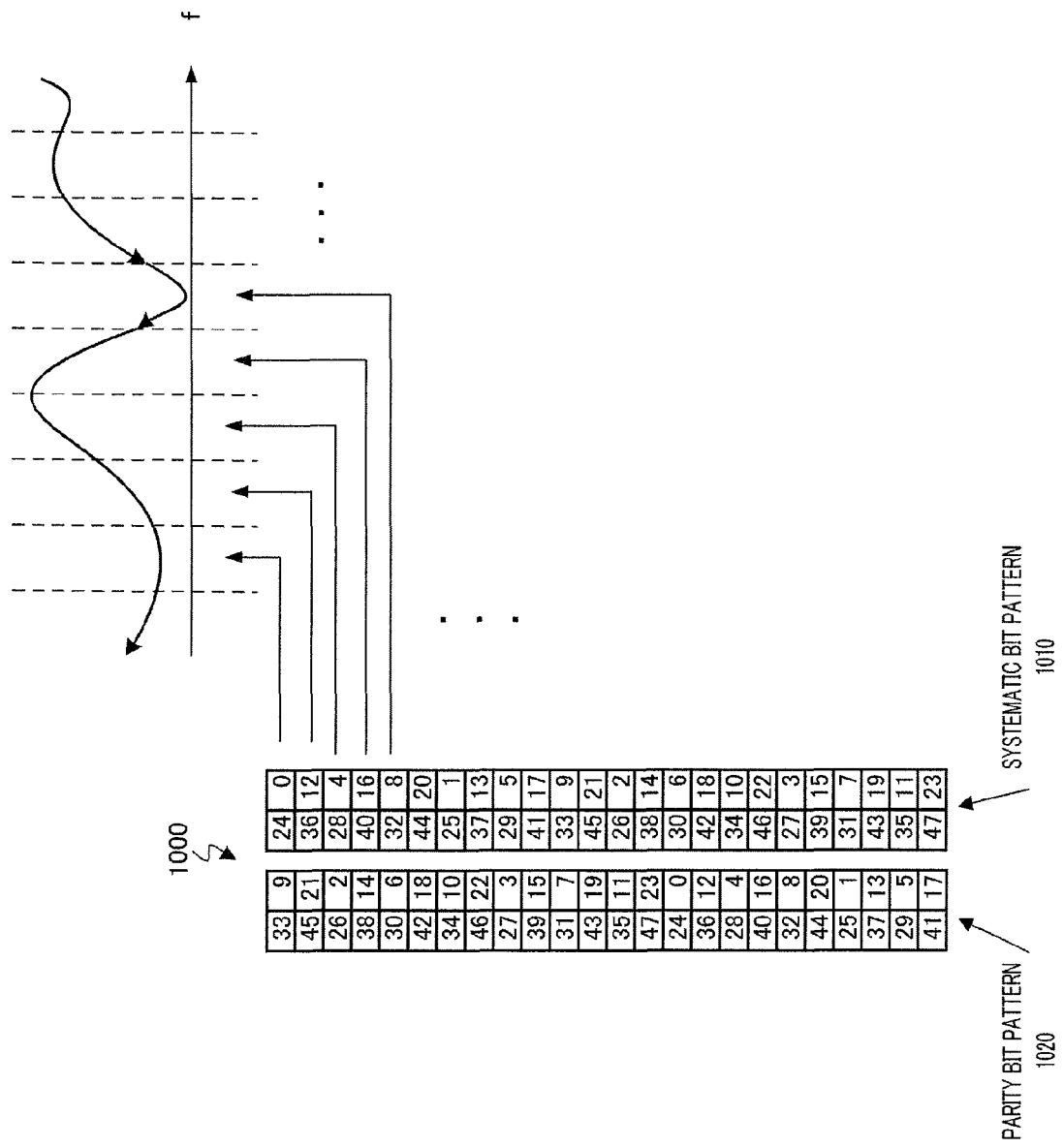
FIG. 20 is a drawing showing an example of an interleave pattern according to Embodiment 3.

FIG. 20 is a drawing showing an example of an interleave pattern in interleaving section 910 and mapping to the frequency domain. Interleave pattern 1000 in FIG. 20 is an example of an interleave pattern in the case of a transmission mode using a coding rate of ½ and a 16QAM modulation method, in which systematic bit pattern 1010 is an interleave pattern for a systematic bit sequence, and parity bit pattern 1020 is an interleave pattern for a parity bit sequence. The numbers entered in each pattern represent bit indexes. Interleave pattern 1000 in FIG. 20 is similar to interleave pattern 700 described in Embodiment 2.

Interleaving section 910 uses interleave pattern 1000 to perform codeword sequence rearrangement so that a non-correlated bit with respect to a point-in-time i information bit is transmitted in a modulation symbol of a frequency adjacent to a frequency at which a modulation symbol including a point-in-time i information bit is transmitted.

In the same way as in Embodiment 2, a codeword sequence is output from interleaving section 910 to M-ary modulation section 150 in the order u0, u24, p9, p33, u12, u36, p21, p45, . . . , for example.

Therefore, when interleave pattern 1000 is used, if a modulation symbol is designated xj, bits composing respective symbols are as follows: x0={u0, u24, p9, p33}, x1={u12, u36, p21, p45}, . . . .

By this means, when 16QAM modulation is performed every 4 bits in M-ary modulation section 150, a bit included in the same modulation symbol in which a point-in-time i information bit is included can be made a non-correlated bit, and when a modulation symbol is mapped to the frequency domain and a multicarrier signal is generated in OFDM forming section 920, bits included in a modulation symbol in which a point-in-time i information bit is included and a modulation symbol that is consecutive in the frequency direction can be made non-correlated bits.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

Thus, interleaving section 910 performs transmission codeword sequence rearrangement so that a non-correlated bit with respect to a point-in-time i information bit is included in a modulation symbol of a frequency adjacent to a frequency at which a modulation symbol including a point-in-time i information bit is transmitted. By this means, degradation of decoding performance can be suppressed even if the reception level of transmission modulation symbol xj transmitted in a particular frequency domain falls due to frequency selective fading.

As described above, according to this embodiment, self-orthogonal encoding section 110 acquires encoded bits by performing self-orthogonal code encoding, M-ary modulation section 150 converts encoded bits to a modulation symbol, and interleaving section 910 transmits a modulation symbol including a point-in-time i non-correlated bit at a frequency adjacent to a frequency at which a modulation symbol including a point-in-time i information bit is transmitted. By this means, bits included in two modulation symbols that are consecutive in the frequency domain become non-correlated bits, and therefore, in addition to achieving the effects of Embodiment 1, an effect of avoiding error rate characteristic degradation due to a frequency selective fading fall is obtained.

In this embodiment, a case has been described by way of example in which codeword sequence rearrangement is performed using interleave pattern 1000 shown in FIG. 20, but this is not a limitation, and the same kind of effect can be obtained as long as an interleave pattern is used that performs codeword sequence rearrangement so that non-correlated bits are included in modulation symbols that are transmitted consecutively in the frequency domain.

Embodiment 4

In this embodiment, a transmitting apparatus and puncturing method are described whereby a codeword sequence obtained by performing error correction encoding using a self-orthogonal code or LDPC-CC is punctured. According to a transmitting apparatus and puncturing method, a parity bit necessary for decoding of a point-in-time i information bit is not punctured, and therefore the decoding error rate characteristic is better than when parity bits are punctured randomly, or in a regular manner without taking the configuration of a self-orthogonal code or LDPC-CC into account.

The configuration of a transmitting apparatus according to this embodiment is similar to that in FIG. 9. Below, the puncturing method used by puncturing section 120 is mainly described. A case is described below in which a coding rate of ¾ is obtained by puncturing a coding-rate-½, J=6, K=18 self-orthogonal code.

Puncturing section 120 punctures parity bit sequence $p_i$ of codeword sequences obtained by self-orthogonal encoding section 110. Here, puncturing section 120 performs puncturing using puncture matrix P represented by equation 14.

[14] (Equation 14)

$$P = \begin{pmatrix} 1 & 1 & 1 & 1 & 1 & 1 & 1 & 1 & 1 & 1 & 1 & 1 & 1 & 1 & 1 & 1 & 1 & 1 \\ 1 & 0 & 1 & 0 & 0 & 0 & 0 & 1 & 0 & 0 & 0 & 0 & 1 & 0 & 0 & 1 & 1 \end{pmatrix}$$

Puncture matrix P is a 2×18 (=K (constraint length)) matrix, in which the first row shows a puncture pattern for systematic bit sequence $u_i$, and the second row shows a puncture pattern for parity bit sequence $p_i$. In puncture matrix P of equation 14, a bit corresponding to a "1" element is not punctured, and a bit corresponding to a "0" element is punctured.

By using puncture matrix P shown in equation 14, if a parity bit corresponding to the leftmost column is designated p0, {p1, p3, p4, p5, p6, p8, p9, p10, p11, p12, p14, p15} are punctured.

As can be seen from the J=6, K=18 self-orthogonal code parity check matrix in FIG. 2, parity bits used in u0 decoding are {p0, p2, p7, p13, p16, p17}, and {p1, p3, p4, p5, p6, p8, p9, p10, p11, p12, p14, p15} are non-correlated bits. Consequently, puncturing these bits has little effect on decoding of point-in-time information bit u0.

Figure 21:
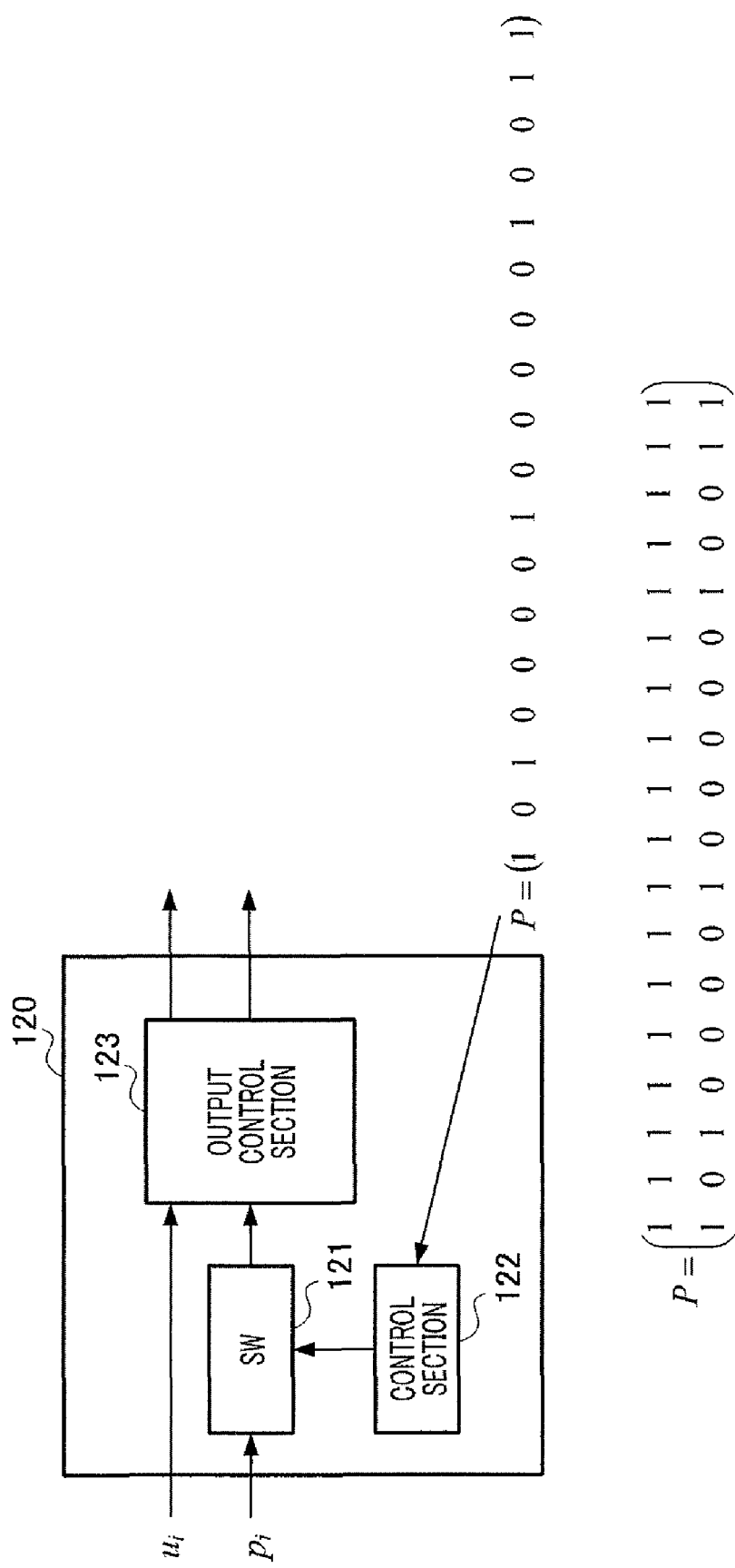
FIG. 21 is a block diagram showing an example of the configuration of a puncturing section according to Embodiment 4 of the present invention.

FIG. 21 shows an example of the configuration of puncturing section 120. Puncturing section 120 comprises SW 121, control section 122, and output control section 123.

SW 121 switches parity bit $p_i$ output in accordance with a puncture pattern output from control section 122. Specifically, $p_i$ is output when a "1" signal is output from control section 122, and $p_i$ is not output when a "0" signal is output.

Control section 122 transmits a "1" or "0" signal to SW 121 in a pattern of a period of the number of columns of puncture matrix P.

Thus, in accordance with puncture matrix P shown in equation 14, puncturing section 120 punctures a parity bit that is a non-correlated bit with respect to a point-in-time i information bit appearing once every constraint length K. In this way, a bit necessary for point-in-time i information bit decoding is not punctured, enabling a point-in-time i information bit to be decoded in a pre-puncturing coding-rate-½ state irrespective of the fact that puncturing processing is executed.

As described above, according to this embodiment, puncturing section 120 performs puncturing processing in accordance with a puncture matrix whereby a parity bit that is a non-correlated bit with respect to a point-in-time i information bit appearing once every constraint length K is punctured. As a result, a bit necessary for point-in-time i information bit decoding is not punctured, enabling decoding to be performed in a pre-puncturing coding-rate-½ state irrespective of the fact that puncturing processing is executed. Furthermore, through the use of iterative decoding, encoding gain of a point-in-time information bit that can be decoded in a coding-rate-½ state is propagated to another bit, enabling an effect of improving the error rate characteristic and reducing the number of iterations necessary for convergence to be obtained. A bit that can be decoded in the same coding-rate-½ state as a point-in-time i information bit appears at a period equal to the number of columns of the puncture matrix.

In this embodiment, a case has been described by way of example in which puncturing section 120 punctures a codeword sequence using puncture matrix P shown in equation 14, but this is not a limitation, and the same kind of effect can be obtained as long as a puncture matrix is used whereby a parity bit that is a non-correlated bit with respect to point-in-time i information bit $u_i$ is punctured.

Also, in this embodiment, a case has been described by way of example in which puncture matrix P whereby only parity bit sequence $p_i$ is punctured, as shown in equation 14, is used, but this is not a limitation, and the same kind of effect can also be obtained if a puncture matrix is used whereby both a systematic bit sequence and a parity bit sequence are punctured. For example, the same kind of effect can also be obtained if puncturing processing is performed using puncture matrix P such as shown in equation 15.

Equation 15 is an example of a puncture matrix when puncturing is performed on a systematic bit sequence and a parity bit sequence in a codeword sequence generated by the J=6, K=18 self-orthogonal code shown in FIG. 6.

[15]

$$P = \begin{pmatrix} 1 & 1 & 1 & 1 & 1 & 1 & 1 & 0 & 1 & 1 & 1 & 0 & 1 \\ 1 & 0 & 1 & 0 & 0 & 0 & 0 & 1 & 0 & 0 & 0 & 0 & 1 \end{pmatrix} \quad \text{(Equation 15)}$$

By means of puncture matrix P of equation 15, a coding-rate-½ codeword is punctured into a coding-rate-⅘ codeword. When puncture matrix P of equation 15 is used at this time, if point-in-time i information bit $u_i$ is designated for the leftmost column, punctured systematic bits are $u_{i+8}$ and $u_{i+12}$, and these are non-correlated bits with respect to point-in-time i information bit $u_i$. Also, as stated above, punctured parity bits are {p1, p3, p4, p5, p6, p8, p9, p10, p11, p12, p14, p15}, and these are similarly non-correlated bits with respect to point-in-time i information bit $u_i$.

Figure 22:
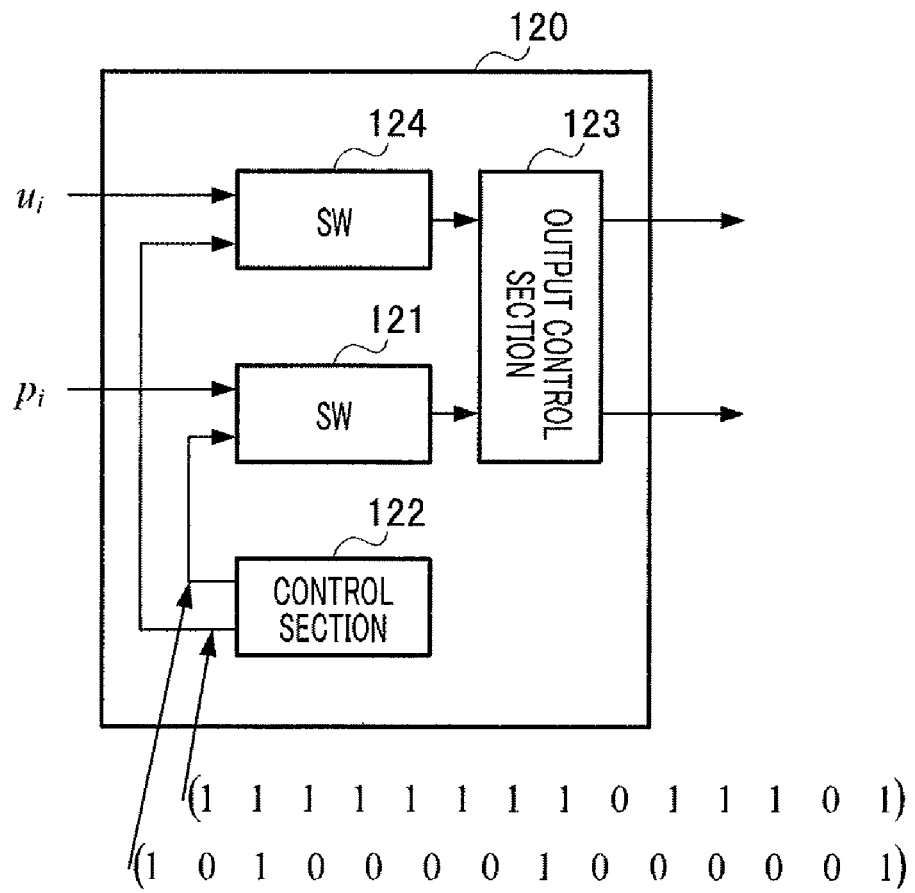
FIG. 22 is a block diagram showing another example of the configuration of a puncturing section according to Embodiment 4.

FIG. 22 shows an example of the configuration of puncturing section 120 that performs puncturing processing using puncture matrix P of equation 15. Puncturing section 120 in FIG. 22 comprises SW 121, SW 124, control section 122, and output control section 123.

SW 124 switches $u_i$ output in accordance with a puncture pattern output from control section 122. Specifically, $u_i$ is output when a "1" signal is output from control section 122, and $u_i$ output is not performed when a "0" signal is output.

SW 121 switches parity bit $p_i$ output in accordance with a puncture pattern output from control section 122. Specifically, $p_i$ is output when a "1" signal is output from control section 122, and $p_i$ output is not performed when a "0" signal is output.

Control section 122 outputs a "1" or "0" signal to SW 124 and SW 121 in a pattern of a period of the number of columns of puncture matrix P.

In this way, puncturing section 120 can puncture a systematic bit and parity bit that are non-correlated bits with respect to a point-in-time i information bit $u_i$ in accordance with puncture matrix P of equation 15.

Embodiment 5

As explained in Embodiment 4, a point-in-time i information bit is decoded using a pre-puncturing original coding rate by using a puncture matrix whereby a non-correlated bit with respect to a point-in-time i information bit is punctured, as shown in equation 14, in puncturing section 120. On the other hand, a bit of other than point-in-time i is decoded using a coding rate higher than the original coding rate, and therefore error correction performance can be said to be higher for a point-in-time i information than for another bit. Below, a point-in-time i information bit decoded using a pre-puncturing original coding rate is called an original-decoding-capable bit.

In this embodiment, a mapping method is described for a case in which error correction performance differs on a bit-by-bit basis in a codeword sequence.

(Mapping Method)

A case in which an M-ary modulation method is 16QAM is described below as an example. With 16QAM, one modulation symbol is formed by placing one of 16 candidate signal points on the IQ plane according to a combination of four bits. The correspondence between a combination of four bits and a signal point differs according to the mapping method used.

Figure 23:
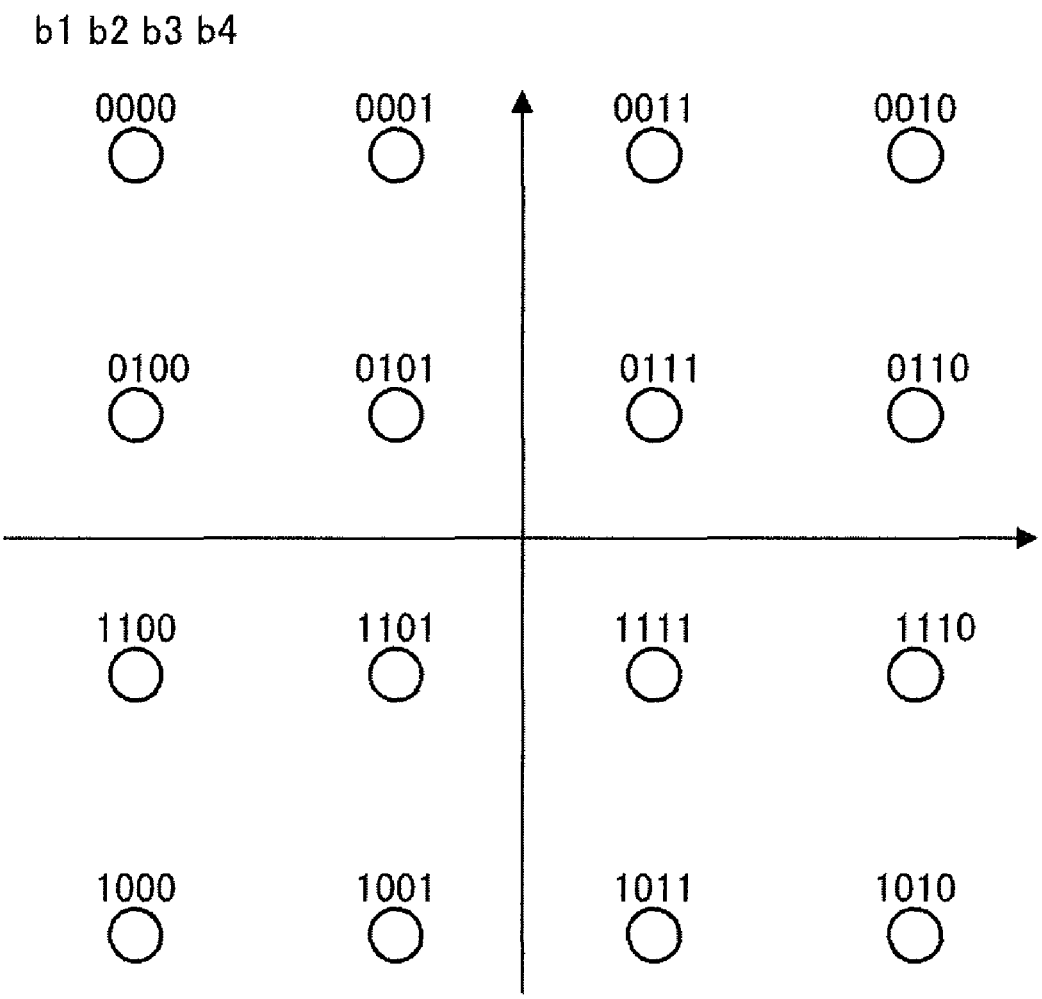
FIG. 23 is a drawing showing Gray mapping.

FIG. 23 is a drawing showing Gray mapping as one example of mapping. Gray mapping is mapping used in an IEEE802.11 compliant wireless LAN, for instance. As shown in FIG. 23, each modulation symbol is placed at a signal point on the IQ plane according to a combination of four bits.

As shown in FIG. 23, Gray mapping follows a rule whereby only one bit differs between combinations of four bits at adjacent signal points, and is known to demonstrate a good error rate characteristic.

Furthermore, it is known that, in Gray mapping, the error rate characteristic is different for each of the four bits b1, b2, b3, and b4 composing one modulation symbol. As can be seen from FIG. 23, for example, for b1 and b3, mapping positions at which these are "0" and "1" are separated averagely. In contrast, for b2 and b4, cases in which "0" and "1" mapping positions are adjacent are more numerous than for b1 or b3. As a result, b2 and b4 likelihoods obtained by a log-likelihood computation section tend to have smaller absolute values that in the case of b1 or b3. Consequently, it can be said that b2 and b4 are more prone to error that b1 or b3. Thus, error-prone bits are present in four bits composing a signal point on the IQ plane.

Also, as explained in Embodiment 4, when a non-correlated bit with respect to a point-in-time i information bit is punctured, a point-in-time i information bit is decoded using a pre-puncturing original coding rate, while a bit of other than point-in-time i is decoded using a coding rate higher than the original coding rate, and therefore error correction performance may differ on a bit-by-bit basis in a codeword sequence.

Thus, in this embodiment, the fact that error correction performance differs on a bit-by-bit basis in a codeword sequence, and the fact that there are error-prone bits among the four bits composing a signal point on the IQ plane, are taken into account, and an original-decoding-capable bit decoded using a pre-puncturing coding rate in a codeword sequence is assigned to an error-prone bit when IQ mapping is performed. In the example shown in FIG. 23, b2 and b4 are error-prone bits.

By so doing, a bit with good error resilience is assigned to an error-prone bit, enabling overall system error rate characteristics to be improved.

In the above description, a case has been described by way of example in which Gray mapping is used as a mapping method in M-ary modulation, but this is not a limitation, and another mapping method may also be used. For example, provision may be made for an original-decoding-capable bit to be assigned to an error-prone fixed bit in MSP (Modified Set Partitioning) mapping in BICM-ID (Bit Interleaved Coded Modulation-Iterative Decoding).

The transmitting method and receiving method of a BICM-ID system are described in detail in Non-Patent Document 6, and therefore only a brief description of these is given below.

Figure 24:
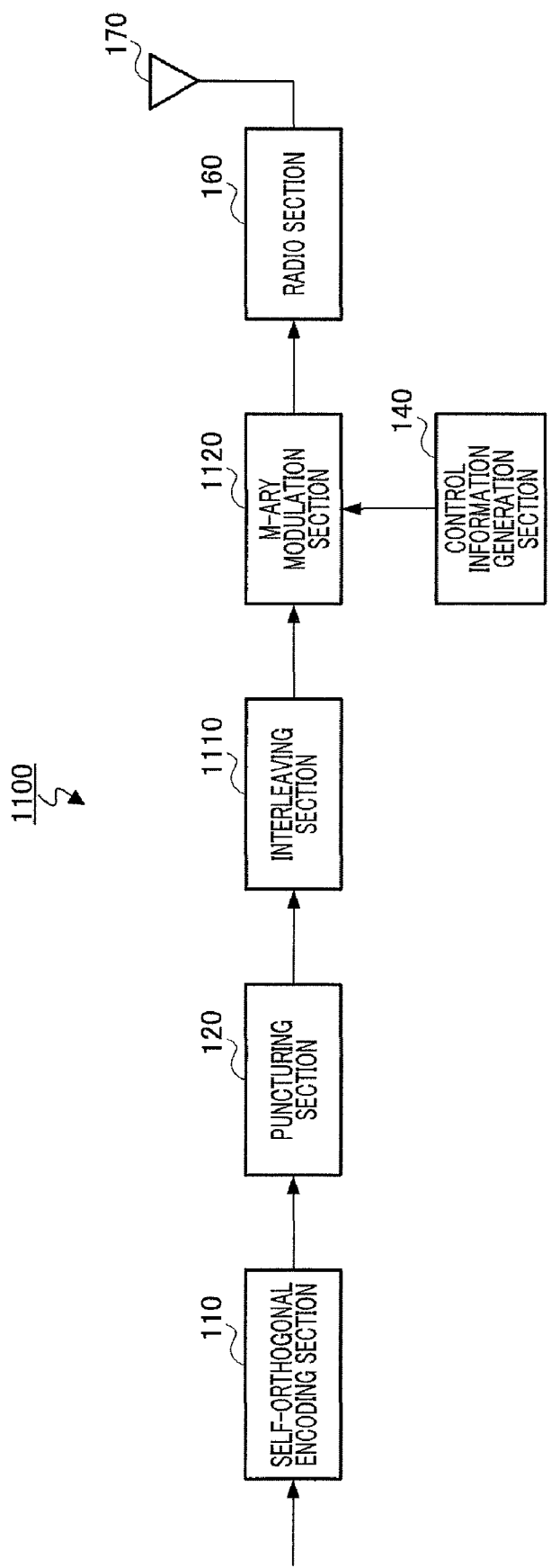
FIG. 24 is a block diagram showing a configuration of a transmitting apparatus according to Embodiment 5 of the present invention.

FIG. 24 shows a configuration of a transmitting apparatus in a BICM-ID system. Transmitting apparatus 1100 in FIG. 24 comprises self-orthogonal encoding section 110, puncturing section 120, interleaving section 1110, M-ary modulation section 1120, control information generation section 140, radio section 160, and transmitting antenna 170.

Figure 25:
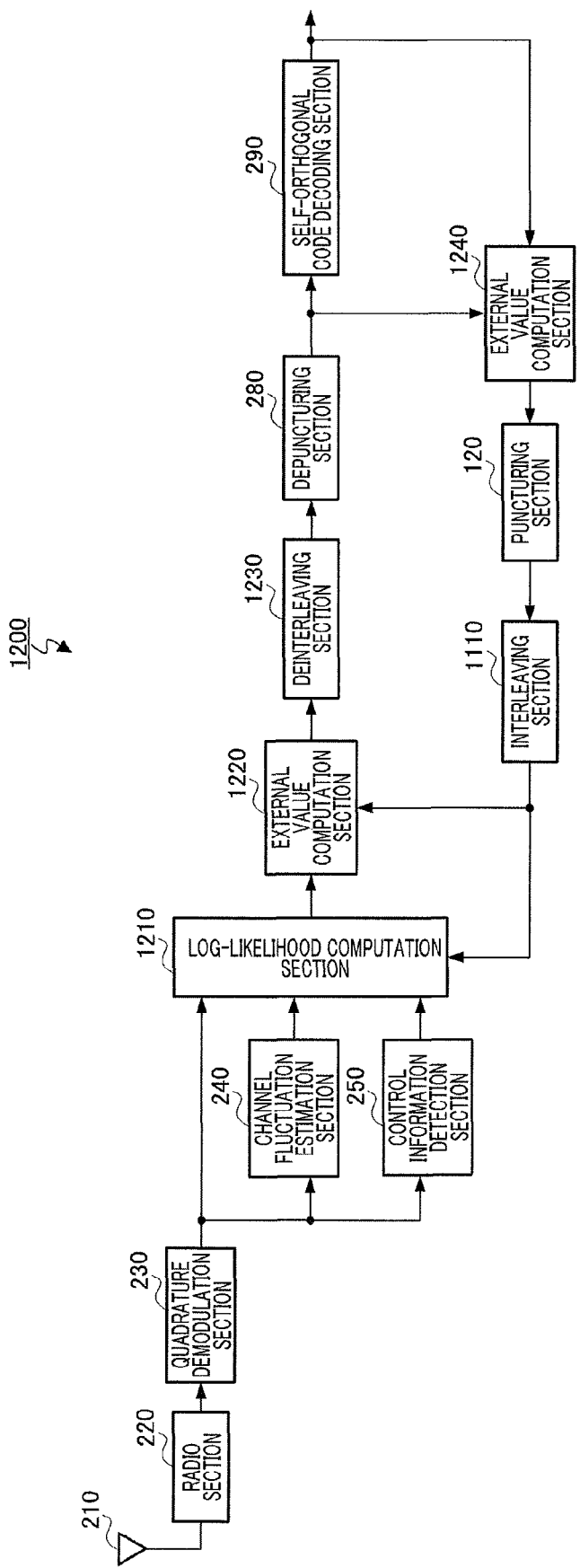
FIG. 25 is a block diagram showing a configuration of a receiving apparatus according to Embodiment 5.

FIG. 25 shows a configuration of a receiving apparatus in a BICM-ID system. Receiving apparatus 1200 in FIG. 25 comprises receiving antenna 210, radio section 220, quadrature demodulation section 230, channel fluctuation estimation section 240, control information detection section 250, log-likelihood computation section 1210, external value computation sections 1220 and 1240, deinterleaving section 1230, depuncturing section 280, self-orthogonal code decoding section 290, puncturing section 120, and interleaving section 1110.

A characteristic of a BICM-ID system is that, as shown in FIG. 25, receiving apparatus 1200 repeatedly performs log-likelihood calculation processing (demapping) and error correction code decoding processing. Non-Patent Document 6 shows, for instance, that when a convolutional code is used in this kind of communication system, a mapping method such as MSP gives a better iterative-received error rate characteristic than Gray mapping.

Figure 26D:
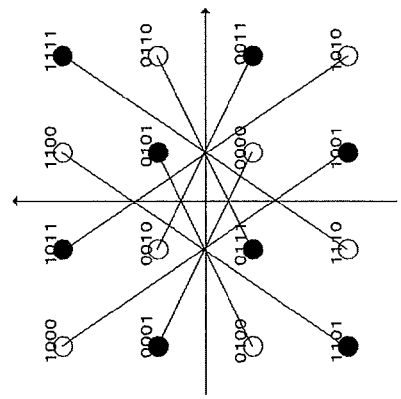
FIG. 26 is a drawing showing Gray mapping.
Figure 26C:
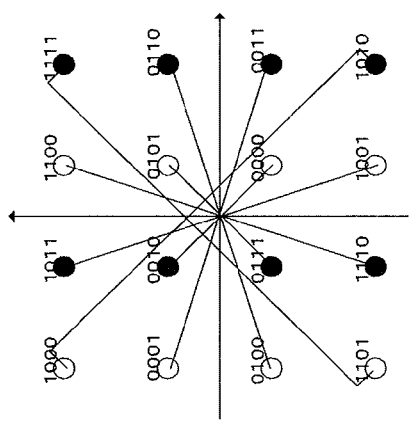
Figure 26B:
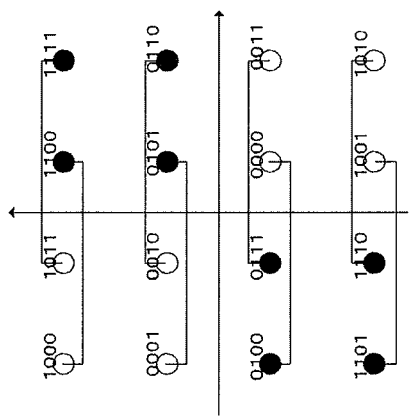
Figure 26A:
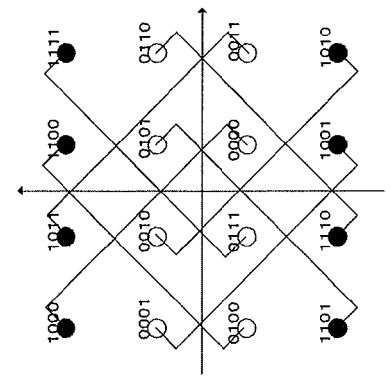

FIG. 26A through FIG. 26D show examples of MSP mapping. FIG. 26A shows distances between signal points for which b1 is 0 and signal points for which b1 is 1 when the three bits other than b1 (that is, b2, b3, and b4) are decided, and similarly, FIG. 26B shows distances between signal points for which b2 is 0 and signal points for which b2 is 1 when the three bits other than b2 (that is, b1, b3, and b4) are decided, FIG. 26C shows distances between signal points for which b3 is 0 and signal points for which b3 is 1 when the three bits other than b3 (that is, b1, b2, and b4) are decided, and FIG. 26D shows distances between signal points for which b4 is 0 and signal points for which b4 is 1 when the three bits other than b4 (that is, b1, b2, and b3) are decided.

With BICM-ID, the likelihood of a bit that is wished to be found is calculated using a likelihood output from a decoder when demapping is performed and external values of the 3 bits other than that bit that is wished to be found. Consequently, the error-proneness of each bit can generally be evaluated based on a distance between signal points under the condition that the 3 bits other than that bit that is wished to be found have all been confirmed.

In the example shown in FIG. 26, the minimum inter-signal-point distance of b1 is $2\sqrt{2}$, the minimum inter-signal-point distance of b2 is 2, the minimum inter-signal-point distance of b3 is $\sqrt{2}$, and the minimum inter-signal-point distance of b3 is $\sqrt{2}$, and therefore it can be seen that b3, for which the minimum inter-signal-point distance is smallest, is the most error-prone. That is to say, when bits other than 1 bit among a plurality of bits composing an M-ary modulation symbol all have the same value, a bit for which the inter-signal-point distance of that 1 bit is a minimal is an error-prone bit. An error-prone bit is determined in a fixed manner according to the mapping method.

Thus, in this embodiment, interleaving section 1110 rearranges a punctured codeword sequence so that an original-decoding-capable bit is assigned to b3, which is such an error-prone bit, in later-stage M-ary modulation section 1120. In this way, M-ary modulation section 1120 performs M-ary modulation by assigning an original-decoding-capable bit to a bit for which the minimum inter-signal-point distance is small, enabling the error rate characteristic to be improved by using iterative decoding on the receiving side.

Figure 27A:
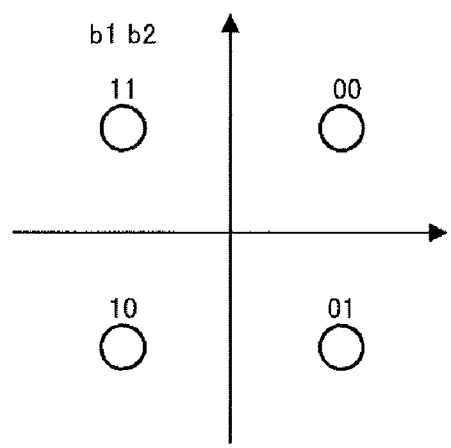
FIG. 27A is a drawing showing an example of Gray mapping when using QPSK modulation.

In the above description, a case has been described by way of example in which 16QAM is used as an M-ary modulation method, but this is not a limitation, and another M-ary modulation method may also be used. For example, if the modulation method is QPSK (Quadrature Phase Shift Keying), as shown in FIG. 27A, cases in which "0" and "1" mapping positions are adjacent are more numerous for b2 than for b1, and the inter-signal-point distance is small when b1 uses the same value, and therefore b2 tends to be more error-prone than b1. In this case, the bit error rate characteristic can be improved by means of codeword sequence rearrangement by interleaving section 1110 such that an original-decoding-capable bit is assigned to b2, which is more error-prone than b1, and by performing M-ary modulation by assigning an original-decoding-capable bit having good error resilience to error-prone b2.

Figure 27B:
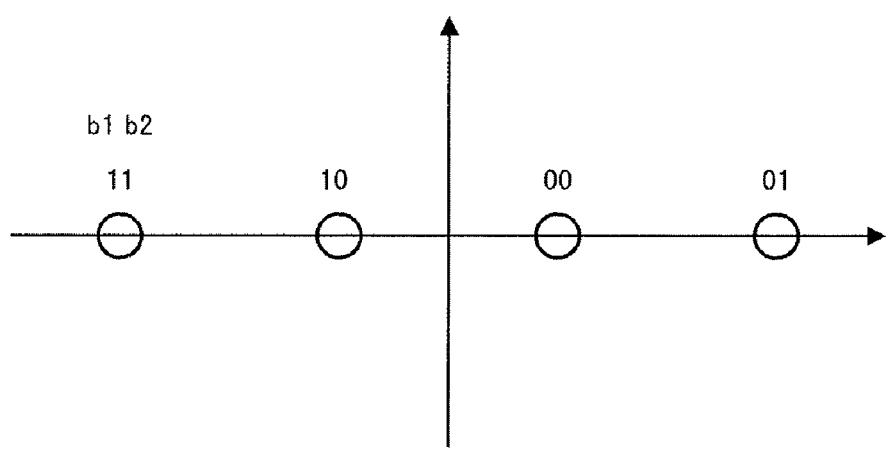
FIG. 27B is a drawing showing an example of Gray mapping when using 4ASK modulation.

The modulation method may also be 4ASK (Amplitude Shift Keying), as shown in FIG. 27B. With 4ASK modulation, cases in which "0" and "1" mapping positions are adjacent are more numerous for b2 than for b1, and the inter-signal-point distance is small when b1 uses the same value, and therefore b2 tends to be more error-prone than b1. Thus, the bit error rate characteristic can be improved by means of codeword sequence rearrangement by interleaving section 1110 such that an original-decoding-capable bit is assigned to b2, which is more error-prone than b1, and by performing M-ary modulation by assigning an original-decoding-capable bit having good error resilience to error-prone b2.

Embodiment 6

In this embodiment, a transmitting apparatus and transmission method are described whereby, when a codeword sequence that has undergone error correction encoding using a self-orthogonal code or LDPC-CC is transmitted in a communication system in which MIMO transmission is performed, bits composing a modulation symbol transmitted in the same spatial channel are made non-correlated bits. According to a transmitting apparatus and transmitting method of this embodiment, a decoding error rate characteristic can be improved by a fall in fading fluctuation and spatial channel correlation.

Figure 28:
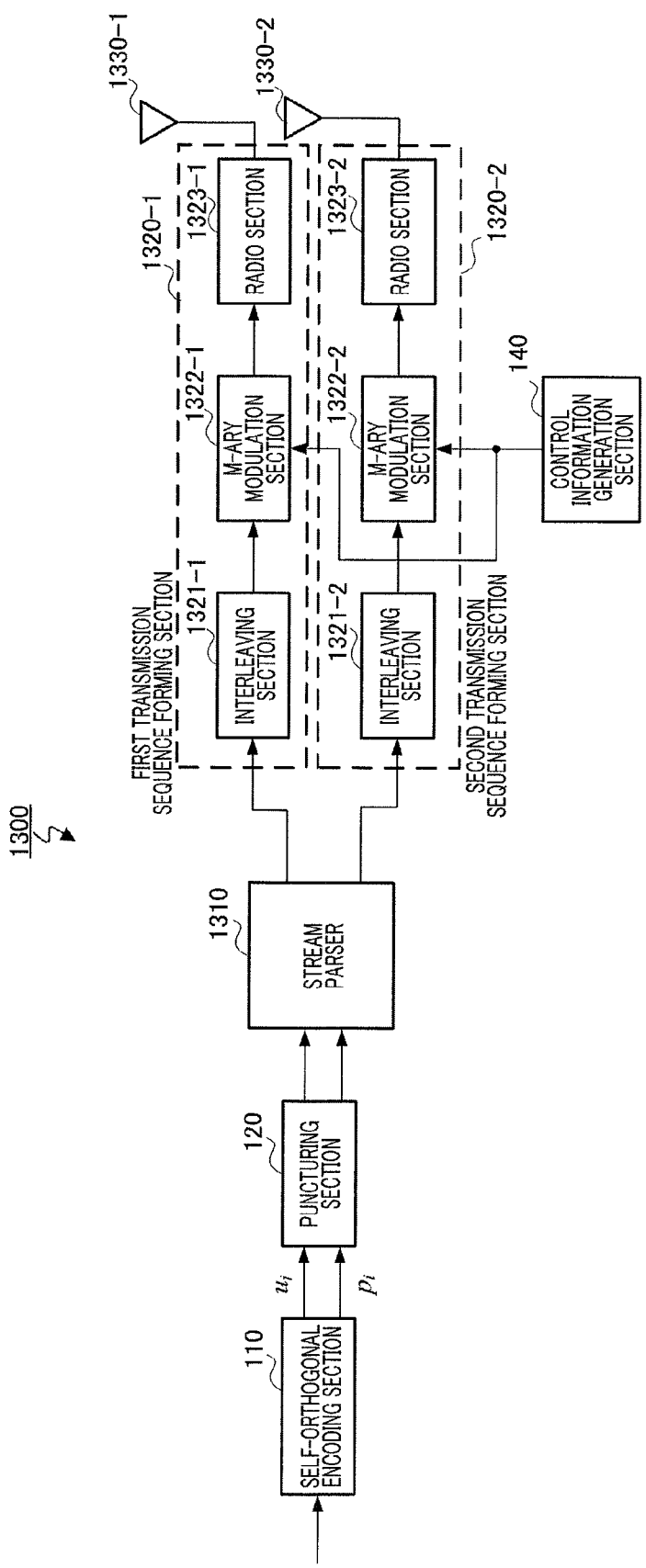
FIG. 28 is a block diagram showing a configuration of a transmitting apparatus according to Embodiment 6 of the present invention.

FIG. 28 shows a configuration of a transmitting apparatus according to this embodiment. Configuration parts in the transmitting apparatus according to this embodiment in FIG. 28 that are common to FIG. 9 are assigned the same reference codes as in FIG. 9, and descriptions thereof are omitted here. Transmitting apparatus 1300 in FIG. 28 illustrates an example of the configuration of a transmitting apparatus that transmits two transmission sequences from two transmitting antennas.

Transmitting apparatus 1300 comprises self-orthogonal encoding section 110, puncturing section 120, stream parser 1310, first transmission sequence forming section 1320-1, second transmission sequence forming section 1320-2, and transmitting antennas 1330-1 and 1330-2.

First transmission sequence forming section 1320-1 comprises interleaving section 1321-1, M-ary modulation section 1322-1, and radio section 1323-1. Similarly, second transmission sequence forming section 1320-2 comprises interleaving section 1321-2, M-ary modulation section 1322-2, and radio section 1323-2.

Below, a case is described by way of example in which a codeword encoded by means of a coding-rate-½, J=6, K=18 self-orthogonal code is transmitted from two transmitting antennas 1330-1 and 1330-2. A case is described below by way of example in which the transmission mode uses a coding rate of ½ and a QPSK modulation method for both transmission sequences.

If a transmission information sequence is designated $u_i$ (where i=1, ..., k), self-orthogonal encoding section 110 executes self-orthogonal encoding on a transmission information sequence and outputs codeword sequence ci (where i=1, ..., n). Here, ci has systematic bits and parity bits arranged alternately, in the form u1, p1, u2, p2, .... As a transmission mode using a coding rate of ½ is assumed here, puncturing section 120 outputs codeword sequence ci to stream parser 1310 without executing puncturing processing.

Stream parser 1310 divides codeword sequence ci after puncturing by puncturing section 120 into two transmission sequences, and outputs these to first transmission sequence forming section 1320-1 and second transmission sequence forming section 1320-2 respectively.

Specifically, stream parser 1310 assigns 2 bits at a time to each transmission sequence in order from the start of codeword sequence ci. For example, {u1, p2, u3, p4, u5, p6, u7, p8, u9, p10, u11, p12, p13, u14, p15, u16, p17, u18, p19, u20, p21, u22, p23, u24, ... } are assigned as a first transmission sequence, and {p1, u2, p3, u4, p5, u6, p7, u8, p9, u10, p11, u12, u13, p14, u15, p16, u17, p18, u19, p20, u21, p22, u23, p24, ... } are assigned as a second transmission sequence.

Stream parser 1310 assigns non-correlated bits with respect to bits assigned to the first transmission sequence to the second transmission sequence. For example, stream parser 1310 assigns non-correlated bit u13 with respect to bit u1 assigned to the first transmission sequence to the second transmission sequence.

Figures 29A, 29B:
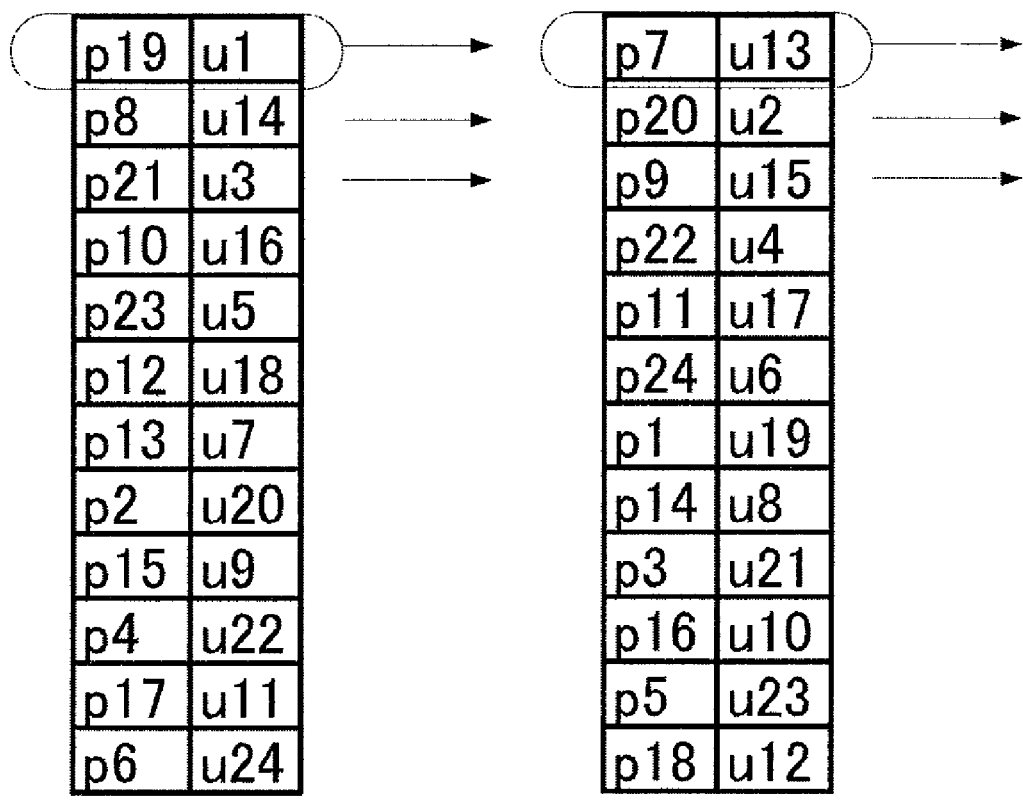
FIG. 29 is a drawing showing an example of an interleave pattern according to Embodiment 6.

Interleaving section 1321-1 performs interleaving on the first transmission sequence using the interleave pattern shown in FIG. 29A, and outputs rearranged (interleaved) sequence {u1, p19, u14, p8, u3, p21, ... } to M-ary modulation section 1322-1. M-ary modulation section 1322-1 takes 2 bits at a time in order from the start of a codeword sequence output from interleaving section 1321-1 and performs QPSK modulation, obtaining x1$i$.

Interleaving section 1321-2 performs interleaving on the second transmission sequence using the interleave pattern shown in FIG. 29B, and outputs rearranged (interleaved) sequence {u13, p7, u2, p20, u15, p9, ... } to M-ary modulation section 1322-2. M-ary modulation section 1322-2 takes 2 bits at a time in order from the start of a codeword sequence output from interleaving section 1321-2 and performs QPSK modulation, obtaining x2$i$.

QPSK modulation signals x1$i$ and x2$i$ corresponding to the first transmission sequence and second transmission sequence respectively are converted to transmission RF signals by radio sections 1323-1 and 1323-2, and are transmitted via transmitting antennas 1330-1 and 1330-2.

Thus, stream parser 1310 assigns non-correlated bits with respect to bits assigned to the first transmission sequence to the second transmission sequence, and interleaving sections 1321-1 and 1321-2 can make bits included in modulation symbols x1$i$ and x2$i$ transmitted at the same time a combination of mutually non-correlated bits in a J=6, K=18 self-orthogonal code by performing rearrangement so that non-correlated bits are included in modulation symbols x1$i$ and x2$i$ at the same time. As a result, a fall in fading fluctuation, degradation of MIMO reception quality when there is spatial correlation, and the effect of an error in the event of a MIMO reception failure, can be reduced.

In this embodiment, a case has been described by way of example in which dual-transmission MIMO transmission, a coding-rate-½ J=6, K=18 self-orthogonal code, and QPSK modulation are used, but these are not limitations, and a bit transmitted at the same time as a point-in-time i information bit by space multiplexing may also be made a non-correlated bit with respect to a point-in-time i information bit.

Although a case in which, for the same modulation symbol, all remaining bits other than a point-in-time i information bit comprise only non-correlated bits with respect to a point-in-time i information bit is most effective, the effect of this embodiment can be obtained as long as there is at least one non-correlated bit.

In this embodiment, a configuration has been assumed whereby a codeword sequence is divided into transmission sequences using stream parser 1310, after which interleaving of each is performed independently, but a configuration may also be used that is equipped with an interleaving section ahead of stream parser 1310.

Figure 30:
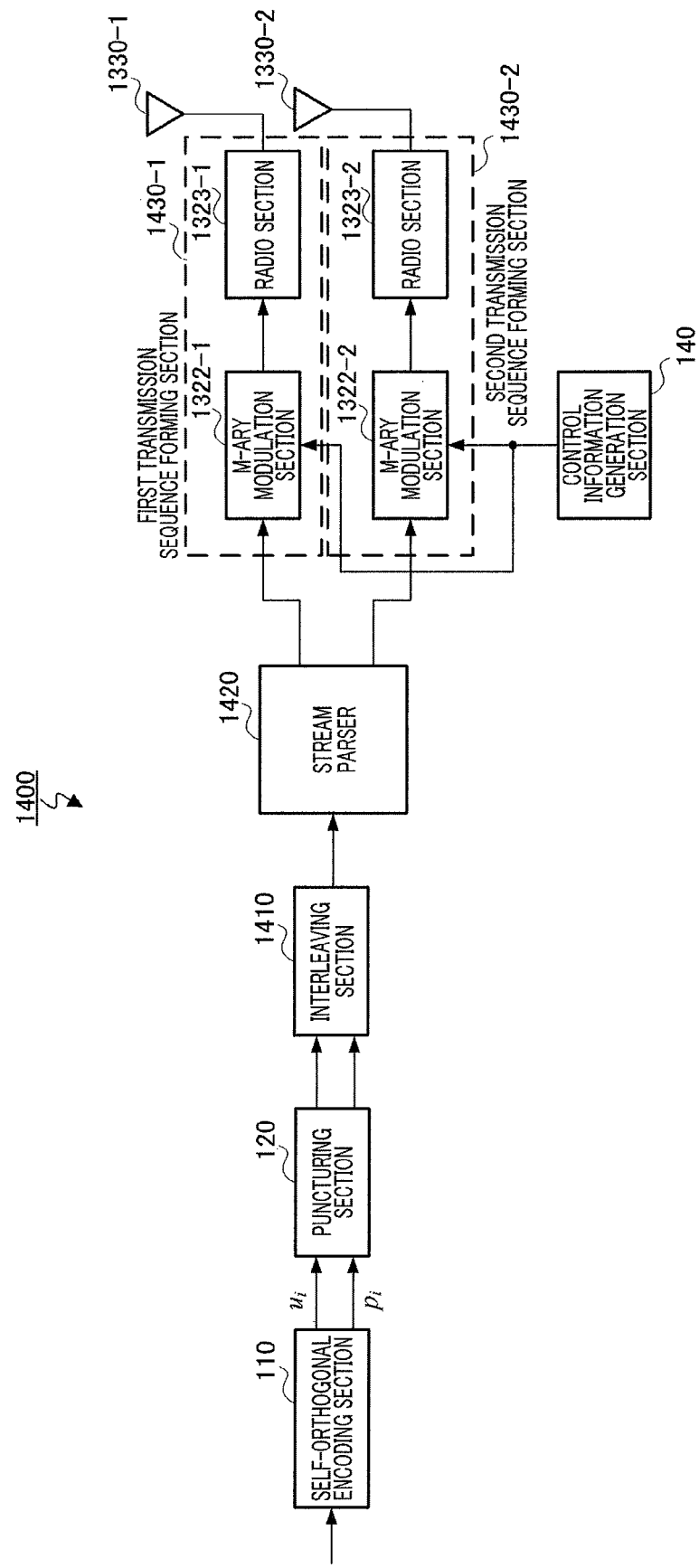
FIG. 30 is a block diagram showing another configuration of a transmitting apparatus according to Embodiment 6.

FIG. 30 shows an example of a transmitting apparatus configuration in this case. Transmitting apparatus 1400 in FIG. 30 comprises self-orthogonal encoding section 110, puncturing section 120, interleaving section 1410, stream parser 1420, first transmission sequence forming section 1430-1, second transmission sequence forming section 1430-2, and transmitting antennas 1330-1 and 1330-2.

Figure 31:
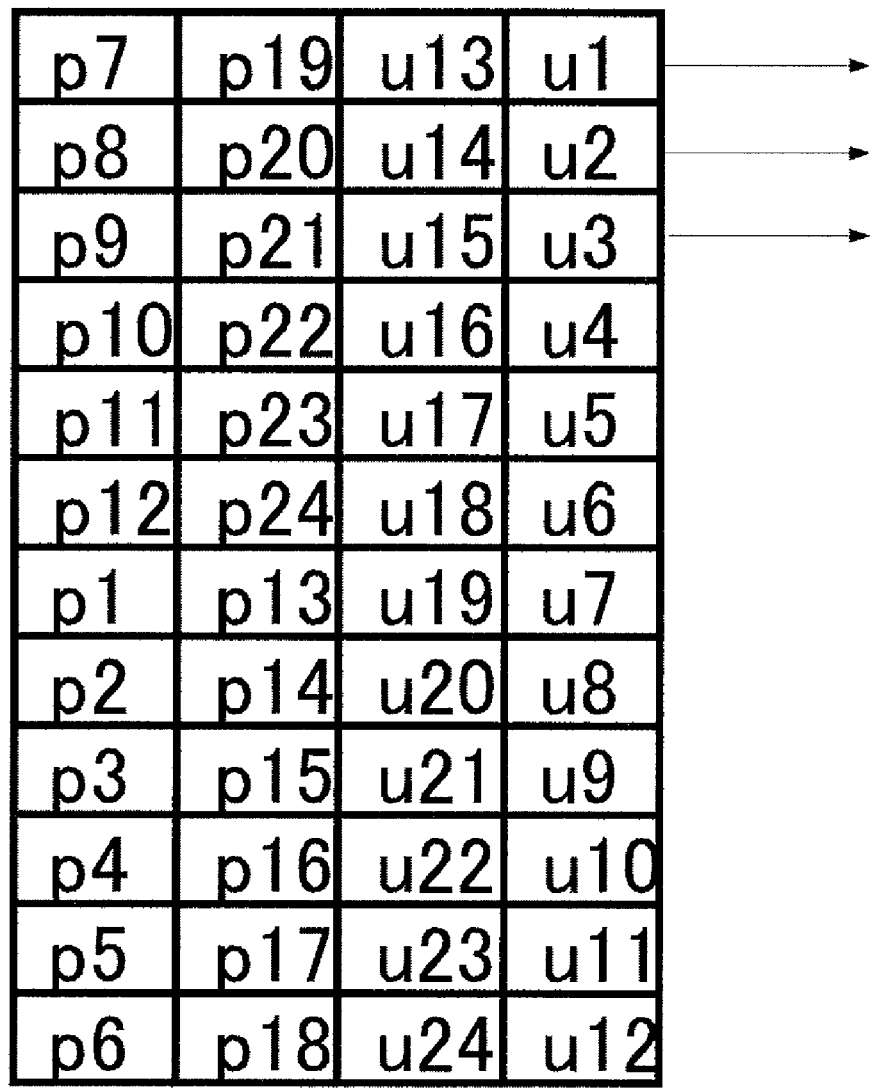
FIG. 31 is a drawing showing an example of an interleave pattern according to Embodiment 6.

FIG. 31 shows an example of an interleave pattern of interleaving section 1410. Interleave pattern 1500 shown in FIG. 31 is a pattern that performs length-12, depth-4 interleaving. In accordance with interleave pattern 1500, interleaving section 1410 outputs a codeword sequence to stream parser 1420 in the order {u1, u13, p19, p7, u2, u14, p20, p8, ... }.

Stream parser 1420 alternately assigns bits of the codeword sequence output from interleaving section 1410 to a first transmission sequence and second transmission sequence.

In this way, bits transmitted at the same time by space multiplexing can be made non-correlated bits preferentially, enabling the error rate characteristic on the decoding side to be improved.

In this embodiment, a case has been described by way of example in which transmitting apparatus 1300 preferentially makes bits included in modulation symbols transmitted at the same time by space multiplexing non-correlated bits, but an error rate characteristic in the case of time variation in fading fluctuation can be further improved by preferentially making bits transmitted in temporally consecutive modulation symbols non-correlated bits, as described in Embodiment 2.

In this embodiment, an example has been described in which the present invention is applied to single-carrier transmission, but the present invention can be similarly implemented when applied to OFDM or suchlike multicarrier-transmission communication. In this case, an error rate characteristic in a frequency selective fading environment can be further improved by preferentially making bits transmitted at adjacent frequencies non-correlated bits, as described in Embodiment 3.

Embodiment 7

In this embodiment, a case is described in which the present invention is applied to a communication system in which packet erasure correction encoding and decoding are performed. Packet erasure correction encoding and decoding are performed not in bit units but in units of a codeword symbol composed of a plurality of codeword bits.

Thus, when a codeword symbol is composed of one codeword bit, packet erasure correction encoding and decoding are performed in bit units, and when a codeword symbol is composed of a plurality of codeword bits, packet erasure correction encoding and decoding are performed in symbol units.

In this embodiment, packet erasure correction encoding and decoding are performed with each column of a parity check matrix and each variable node in a Tanner graph associated with one codeword symbol.

Embodiment 1 through Embodiment 6 are cases in which the present invention is applied to a physical layer, and each column of a parity check matrix and each variable node in a Tanner graph is associated with one codeword bit, for example. In contrast, this embodiment is a case in which the present invention is applied to a higher-level layer than a physical layer, and each column of a parity check matrix and each variable node in a Tanner graph is associated with one codeword symbol.

Therefore, a codeword symbol according to this embodiment corresponds conceptually to a codeword bit in the descriptions of Embodiment 1 through Embodiment 6. Consequently, a codeword symbol according to this embodiment is different from a modulation symbol in Embodiment 1, for example. With regard to a physical layer, any of Embodiment 1 through Embodiment 6 may be applied, and with regard to a higher-level layer than a physical layer, this embodiment may be applied.

In this embodiment, a transmitting apparatus and transmitting method are described whereby a codeword symbol transmitted in the same transmission packet as a point-in-time i information symbol is made a non-correlated symbol with respect to a point-in-time i information symbol. Here, a non-correlated symbol refers to a codeword symbol that is not used in decoding of a point-in-time i information symbol.

Although a case in which, for the same transmission packet, all remaining symbols other than a point-in-time i information symbol comprise only non-correlated symbols with respect to a point-in-time i information symbol is most effective, the effect of this embodiment can be obtained as long as there is at least one non-correlated symbol.

Figure 32:
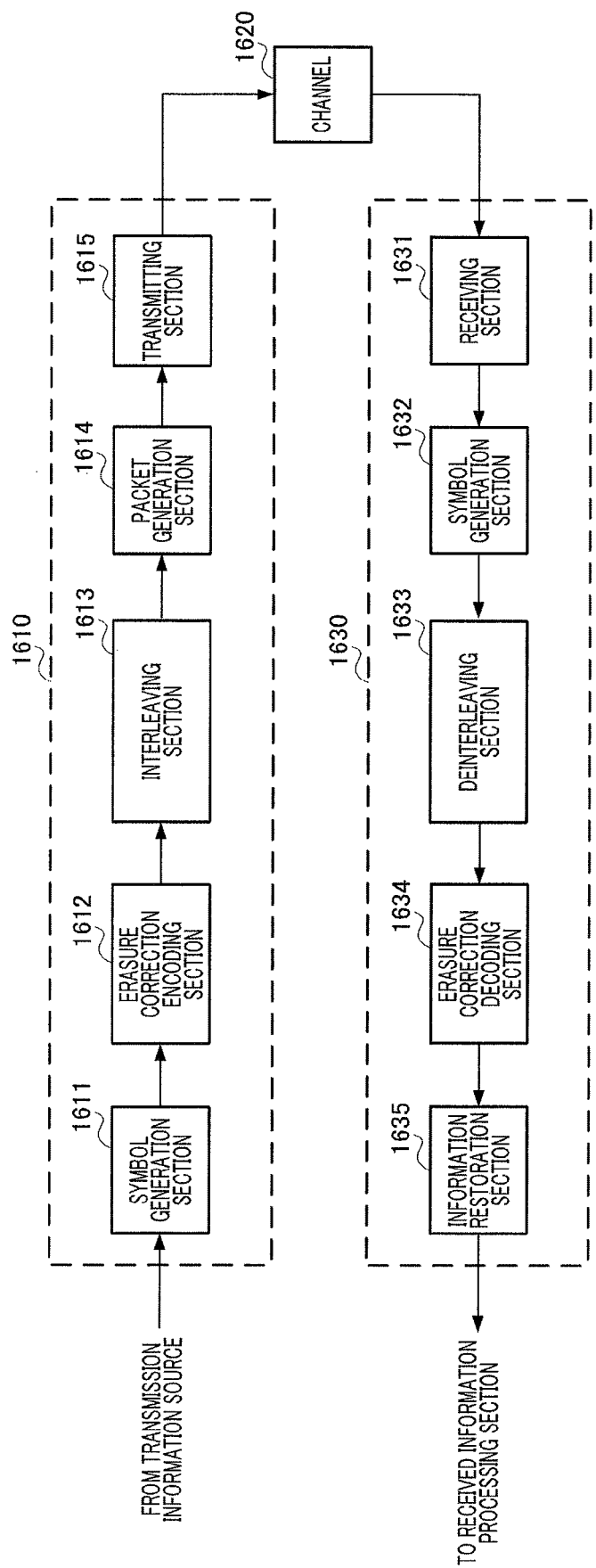
FIG. 32 is a block diagram showing an overall configuration diagram of a communication system according to Embodiment 7 of the present invention.

FIG. 32 shows an overall configuration diagram of a communication system according to this embodiment. In FIG. 32, symbol generation section 1611, erasure correction encoding section 1612, interleaving section 1613, packet generation section 1614, and transmitting section 1615 correspond to transmitting apparatus 1610. Also, in FIG. 32, receiving section 1631, symbol generation section 1632, deinterleaving section 1633, erasure correction decoding section 1634, and information restoration section 1635 correspond to receiving apparatus 1630.

Figure 33:
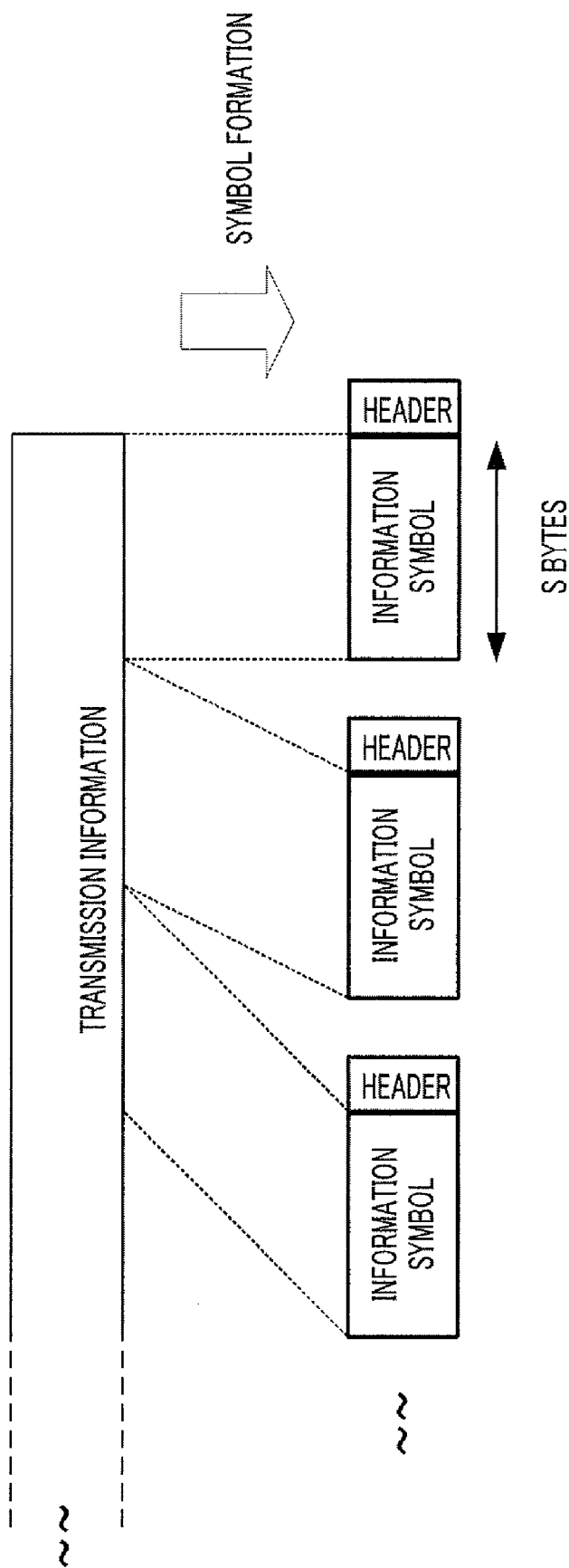
FIG. 33 is a drawing showing an example of the information symbol format.

Symbol generation section 1611 generates an information symbol composed of a plurality of bytes from transmission information output from a transmission information source (not shown). FIG. 33 shows an example of the information symbol format. When operating in accordance with the format in FIG. 33, symbol generation section 1611 generates symbols composed of S bytes from transmission information, and adds a header containing an information symbol index and so forth to each information symbol as necessary. In this way, symbol generation section 1611 generates symbols composed of a plurality of information bits. Symbol generation section 1611 outputs generated information symbols to erasure correction encoding section 1612.

Erasure correction encoding section 1612 performs LDPC-CC encoding on information symbols output from symbol generation section 1611. Specifically, erasure correction encoding section 1612 performs self-orthogonal code or LDPC-CC encoding on information symbols in symbol units. That is to say, erasure correction encoding section 1612 performs erasure correction encoding with each column of a parity check matrix and each variable node in a Tanner graph associated with one codeword symbol.

Erasure correction encoding section 1612 obtains redundant symbols by means of erasure correction encoding. Erasure correction encoding section 1612 outputs information symbols and redundant symbols to interleaving section 1613. Hereinafter, information symbols and redundant symbols are referred to as codeword symbols. In this way, erasure correction encoding section 1612 generates codeword symbols.

Interleaving section 1613 performs rearrangement processing (interleaving) of the order of codeword symbols output from erasure correction encoding section 1612. Interleaving section 1613 performs codeword symbol rearrangement so that a codeword symbol transmitted in the same transmission packet as a point-in-time i codeword symbol generated by erasure correction encoding section 1612 becomes a non-correlated symbol with respect to a point-in-time i codeword symbol.

Although a case in which, for the same transmission packet, all remaining symbols other than a point-in-time i information symbol comprise only non-correlated symbols with respect to a point-in-time i information symbol is most effective, the effect of this embodiment can be obtained as long as there is at least one non-correlated symbol.

As explained above, a non-correlated symbol is a codeword symbol that is not used in decoding of a point-in-time i information symbol. The order rearrangement (interleaving) processing method used by interleaving section 1613 will be described in detail later herein. Interleaving section 1613 outputs order-rearranged (interleaved) codeword symbols to packet generation section 1614.

Packet generation section 1614 generates a transmission packet from codeword symbols output from interleaving section 1613. In packet generation section 1614, NP codeword symbols (where NP is a natural number) are collected together, and a header containing information necessary for packet transmission is added to these NP codeword symbols to form a packet. Packet generation section 1614 outputs a generated packet to transmitting section 1615.

Transmitting section 1615 converts a transmission packet output from packet generation section 1614 to a transmissible format according to the medium used for channel 1620, and transmits the packet to receiving apparatus 1630 via channel 1620.

Channel 1620 indicates a path over which a signal transmitted from transmitting section 1615 passes until received by receiving section 1631. Media that can be used for channel 1620 are Ethernet (registered trademark), a power line, metal cable, optical fiber, radio, light (visible light, infrared, and so forth), or a combination of these.

Receiving section 1631 receives a signal from transmitting section 1615 arriving via channel 1620, and converts the received signal to a packet according to the transmission packet format. Hereinafter, this packet is called a received packet. Depending on the channel 1620 conditions, a transmission packet and received packet may not match at this time—that is, a received packet corresponding to a transmission packet may not be received (packet erasure). Receiving section 1631 outputs a received packet to symbol generation section 1632.

Symbol generation section 1632 removes the header from a received packet, and generates received codeword symbols. Symbol generation section 1632 outputs generated received codeword symbols to deinterleaving section 1633. At this time, symbol generation section 1632 outputs received codeword symbols to deinterleaving section 1633 so that later-stage deinterleaving section 1633 and erasure correction decoding section 1634 can detect which received codeword symbol is a lost symbol.

For example, symbol generation section 1632 adds information indicating a lost symbol to a received codeword symbol header, and outputs the header and dummy data as a received codeword symbol. Deinterleaving section 1633 and erasure correction decoding section 1634 can detect a lost symbol from the input header and dummy data.

If transmitting apparatus 1610 transmits transmission packets with consecutive sequence numbers added, symbol generation section 1632 does not output dummy data as a received codeword symbol. Deinterleaving section 1633 and erasure correction decoding section 1634 may next detect here which received codeword symbol is a lost symbol by detecting a missing number among the sequence numbers.

Deinterleaving section 1633 rearranges the order of (deinterleaves) received codeword symbols output from symbol generation section 1632. At this time, deinterleaving section 1633 rearranges the order of received codeword symbols using processing that is the opposite of the rearrangement processing performed by interleaving section 1613 on the transmitting side. Deinterleaving section 1633 outputs rearranged received codeword symbols to erasure correction decoding section 1634.

If there is a lost symbol among the received codeword symbols output from deinterleaving section 1633, erasure correction decoding section 1634 performs lost symbol erasure correction decoding using a redundant symbol added by erasure correction encoding section 1612 on the encoding side. An example of erasure correction decoding processing by erasure correction decoding section 1634 is described below.

An iterative decoding algorithm is generally used for erasure correction decoding of a received codeword symbol that has undergone erasure correction encoding using a self-orthogonal code or LDPC-CC. An example of an iterative decoding algorithm for erasure correction decoding of a lost symbol is described below using FIG. 35 and FIG. 36.

Figure 35:
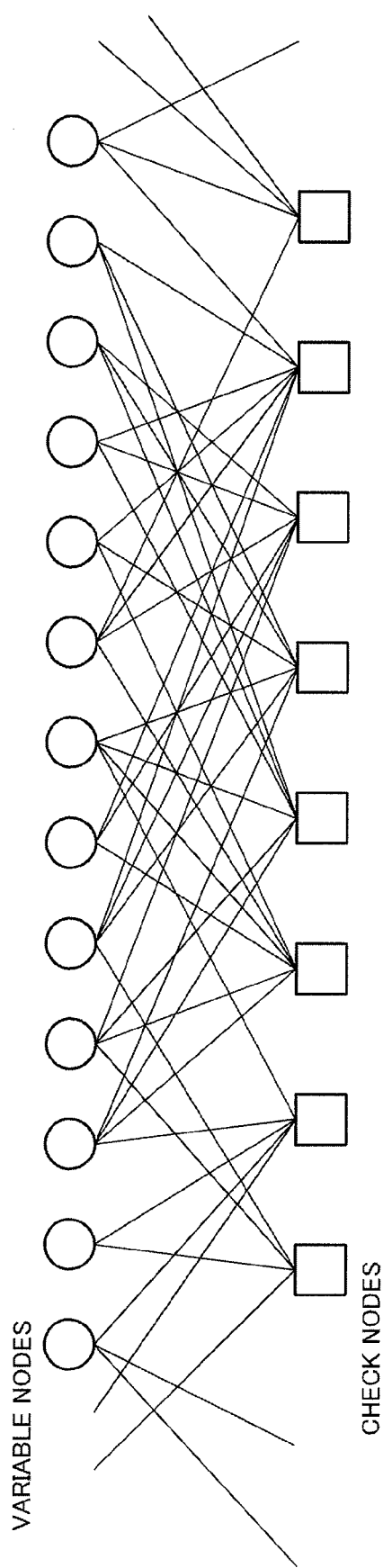
FIG. 35 is a drawing showing a Tanner graph for a parity check matrix of a self-orthogonal code or LDPC-CC.

FIG. 35 shows a Tanner graph for a parity check matrix of a self-orthogonal code or LDPC-CC. In FIG. 35, variable nodes represent parity check matrix column-direction relationships, and check nodes represent parity check matrix row-direction relationships. a variable node and check node are connected by a line (edge) when a parity check matrix element is 1. A variable node corresponds to a received codeword symbol after erasure correction encoding.

Figure 36:
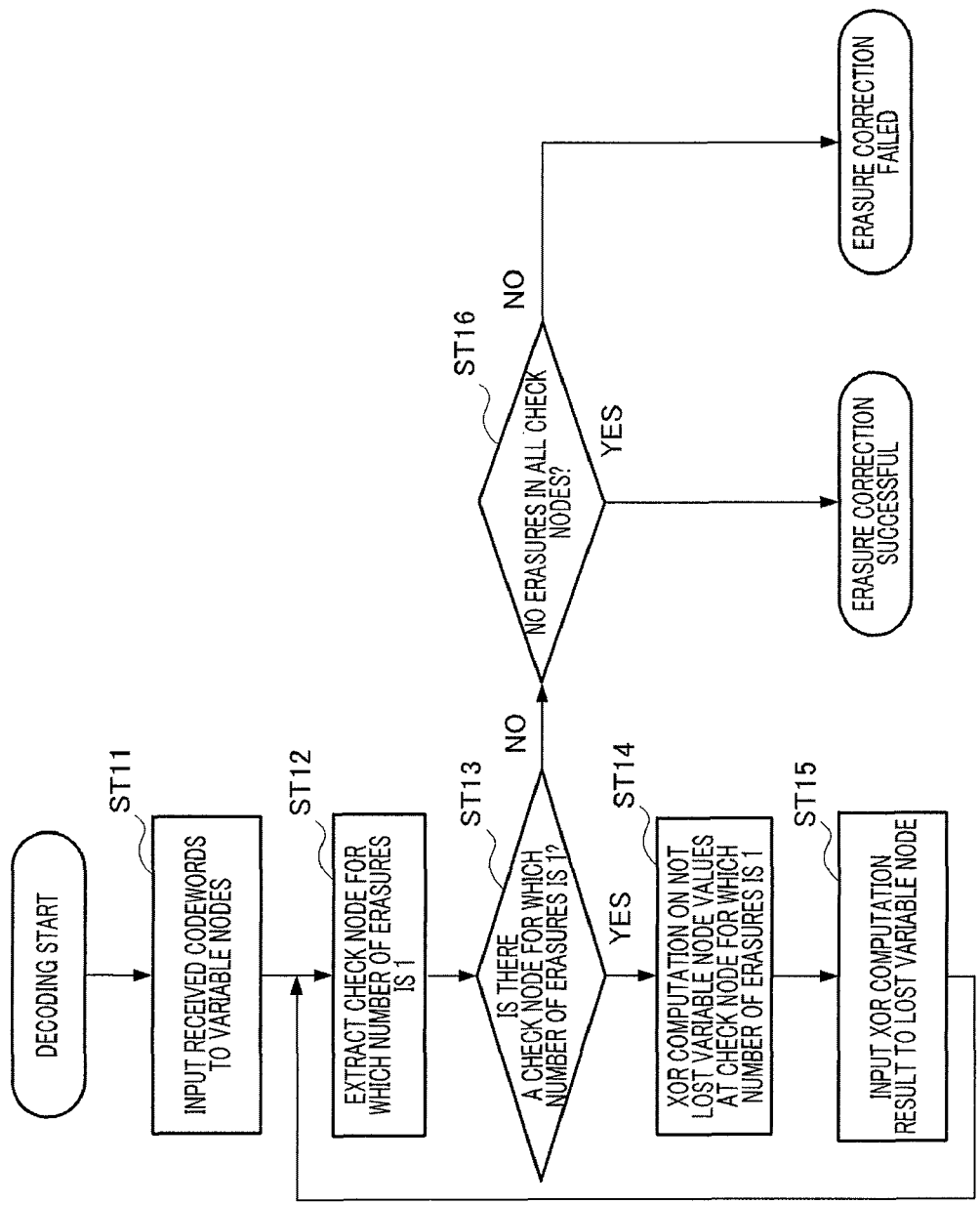
FIG. 36 is a drawing showing the processing flow of an iterative decoding algorithm.

FIG. 36 shows a flowchart of an iterative decoding algorithm. In FIG. 36, "ST" indicates a step of the processing flow. An iterative decoding algorithm is described below using the flowchart in FIG. 36.

In ST11, received codeword symbols including a lost symbol are input to corresponding variable nodes. In ST12, a check node for which the number of erasures of variable nodes connected to the check node is 1 is extracted. If a check node for which the number of erasures is 1 is extracted (ST13: YES), in ST14 an XOR (exclusive OR) computation is performed on correctly received (not lost) variable node values at the extracted check node for which the number of erasures is 1. Then, in ST15, the XOR computation result obtained in ST14 is input to the lost variable node, and the processing flow returns to ST12.

On the other hand, if a check node for which the number of erasures is 1 is not extracted (ST13: NO), in ST16 a check is performed of whether or not there are no erasures in all check nodes. If there are no erasures (ST16: YES), erasure correction is assumed to have succeeded and the decoding algorithm is terminated, whereas if there is a erasure (ST16: NO), erasure correction is assumed to have failed and the decoding algorithm is terminated.

Thus, with an iterative decoding algorithm, erasure correction can be performed if the number of erasures of variable nodes connected to a check node is only one. On the other hand, if the number of erasures of variable nodes connected to a check node is two or more, erasure correction is difficult. Therefore, in order to perform erasure correction effectively, it is desirable for the number of erasures of a plurality of variable nodes connected to a check node to be one at most.

Also, a plurality of variable nodes connected to the same check node are variable nodes in relationships that mutually affect decoding. Consequently, codeword symbols corresponding to such a plurality of variable nodes connected to the same check node are symbols in relationships that mutually affect decoding, and are not non-correlated symbols. In other words, a combination of codeword symbols corresponding to a plurality of variable nodes connected to mutually different check nodes is a combination of non-correlated symbols.

Thus, erasure correction decoding section 1634 in FIG. 32 performs erasure correction decoding of lost symbols, obtains received codeword symbols, and outputs only an information symbol included in received codeword symbols to information restoration section 1635. If there are no lost symbols, erasure correction decoding section 1634 outputs only information symbols included in received codeword symbols to information restoration section 1635 without performing erasure correction decoding.

Information restoration section 1635 converts information symbols to a format that can be decrypted by a received information processing section (not shown), and outputs this to the received information processing section. For example, if information symbols conforms to the format in FIG. 33, information restoration section 1635 removes a header added to each information symbol and outputs linked information symbols to the received information processing section.

Below, the operation of transmitting apparatus 1610 and receiving apparatus 1630 configured as described above is explained, focusing mainly on the operation of interleaving section 1613 and packet generation section 1614. In the following description, erasure correction encoding section 1612 is assumed to perform erasure correction encoding using the coding-rate-½, J=6, K=18 self-orthogonal code shown in FIG. 1. A case is described below by way of example in which packet generation section 1614 generates one transmission packet from four codeword symbols.

In erasure correction encoding section 1612, erasure correction encoding is executed by means of a self-orthogonal code on information symbols $u_i$ (where i=1, . . . , n), and codeword symbols comprising information symbols $u_i$ and redundant symbols $p_i$ are generated. Generated codeword symbols are output to interleaving section 1613.

In interleaving section 1613, codeword symbol rearrangement (interleaving) processing is performed. Specifically, codeword symbol rearrangement is performed so that, in later-stage packet generation section 1614, a point-in-time i information symbol in erasure correction encoding section 1612 and a non-correlated symbol with respect to a point-in-time i information symbol are included in the same transmission packet.

Although a case in which, for the same transmission packet, all remaining symbols other than a point-in-time i information symbol comprise only non-correlated symbols with respect to a point-in-time i information symbol is most effective, the effect of this embodiment can be obtained as long as there is at least one non-correlated symbol.

Figure 34:
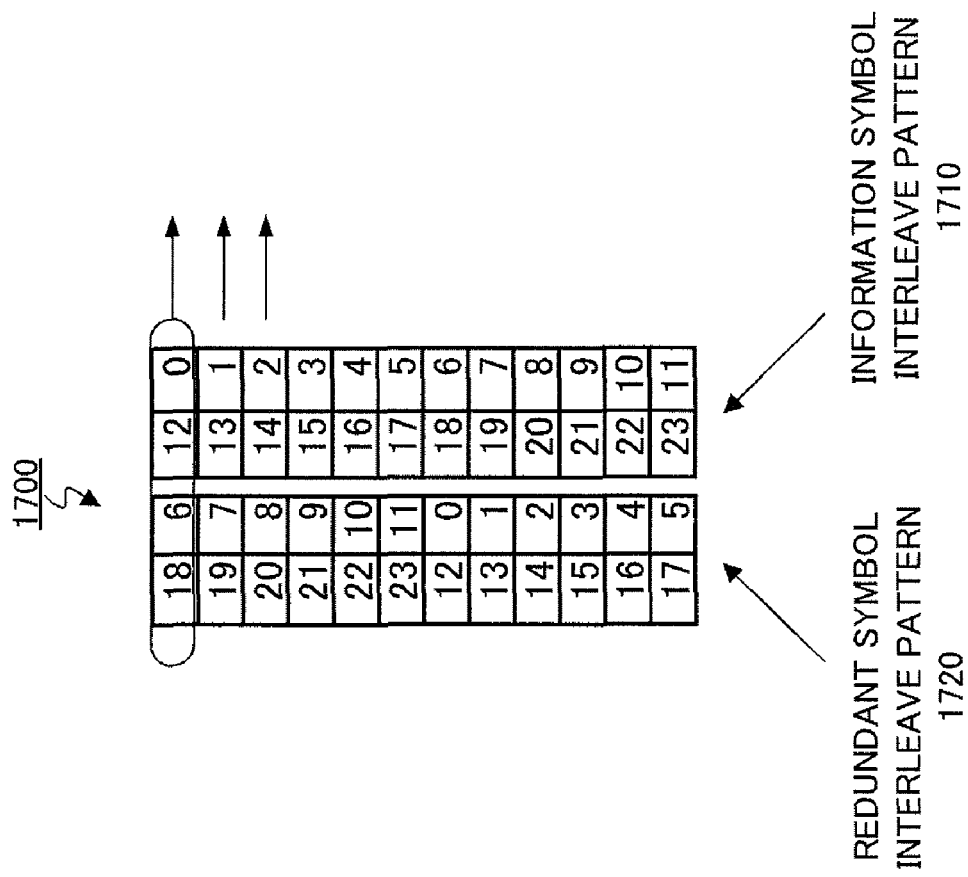
FIG. 34 is a drawing showing an example of an interleave pattern according to Embodiment 7.

Rearrangement (interleaving) processing performed by interleaving section 1613 is described below using FIG. 34. FIG. 34 shows an example of an interleave pattern in interleaving section 1613. Interleave pattern 1700 in FIG. 34 is an example of an interleave pattern in the case of a self-orthogonal code coding rate of ½. Interleave pattern 1700 comprises information symbol interleave pattern 1710 and redundant symbol interleave pattern 1720.

Here, information symbol interleave pattern 1710 is an interleave pattern for information symbols, and redundant symbol interleave pattern 1720 is an interleave pattern for redundant symbols. Information symbols $u_i$ and redundant symbols $p_i$ are codeword symbols encoded by means of the J=6, K=18 self-orthogonal code shown in FIG. 6 above, and the numbers entered in each pattern represent index i of information symbols $u_i$ and redundant symbols $p_i$.

Information symbol interleave pattern 1710 is a length-12 interleaver, and shows the way in which bits are written into memory in interleaving section 1613 in the vertical-direction order in FIG. 34. That is to say, information symbols are written into memory in interleaving section 1613 in the order u0, u1, u2, . . . , u11. Then 12th information symbol u12 is written at the top of the next column.

By this means, information symbol u0 of point-in-time i and information symbol u12 of point-in-time (i+12) are rearranged so as to become laterally aligned. As explained in Embodiment 1, information symbol u12 of point-in-time (i+12) is a non-correlated symbol with respect to information symbol u0 of point-in-time i. Thus, information symbol interleave pattern 1710 laterally aligns information symbol u0 of point-in-time i and u12, which is a non-correlated symbol with respect to that symbol u0.

Similarly, redundant symbol interleave pattern 1720 is a length-12 interleaver. Redundant symbol interleave pattern 1720 is equivalent to information symbol interleave pattern 1710 cyclically shifted downward.

In the example shown in FIG. 34, redundant symbol interleave pattern 1720 laterally aligns redundant symbols p6 and p18 and information symbols u0 and u12. Redundant symbols p6 and p18 are redundant symbols that are not used in decoding of information symbols u0 and u12, and redundant symbol p12 is a non-correlated symbol with respect to redundant symbol p6.

Thus, redundant symbol interleave pattern 1720 laterally aligns information symbol u0 of point-in-time i and redundant symbol p6 that is not used in decoding of information symbol u12 of point-in-time (i+12). Furthermore, redundant symbol p18 a non-correlated symbol with respect to that redundant symbol p6, and therefore information symbol u0 of point-in-time i and redundant symbol p18 that is not used in decoding of information symbol u12 of point-in-time (i+12) are laterally aligned.

Codeword symbols rearranged in this way are output sequentially to packet generation section 1614 in the horizontal direction of interleave pattern 1700. Therefore, codeword symbols are output from interleaving section 1613 to packet generation section 1614 in the order u0, u12, p6, p18, u1, u13, . . . , for example.

In packet generation section 1614 in FIG. 32, a transmission packet is generated using codeword symbols output from interleaving section 1613. As stated above, packet generation section 1614 generates one transmission packet from four codeword symbols. Therefore, when interleave pattern 1700 is used, if a transmission packet is designated xj, symbols composing respective transmission packets are as follows: x0={u0, u12, p6, p18}, x1={u1, u13, p7, p19}, . . . , x11={u11, u23, p5, p17}.

Here, a case will be considered in which a packet erasure occurs in channel 1620, and transmission packet xj is lost. As one transmission packet is generated from four codeword symbols, when one packet erasure occurs four codeword symbols are simultaneously lost. If variable nodes corresponding to the lost four codeword symbols are connected to the same check node, the number of erasures is two or more, and therefore erasure correction is difficult, as explained above.

For example, consider a case in which transmission packet x0 is formed by the combination {u0, u1, p0, p2}. Here, p0 and p2 are symbols shown in FIG. 6, and in parity check matrix Hp, a point-in-time i parity symbol corresponds to p0, and point-in-time i+2 corresponds to p2. Non-correlated symbols in parity check matrix Hp here are symbols of points-in-time i+1, i+3 through i+6, i+8 through i+12, i+14, and i+15.

As already explained in Embodiment 1, it can be seen from equation 5 and αj that u1, p0, and p2 are necessary for decoding of information symbol u0. In other words, a set of check nodes connected to a variable node corresponding to u0 includes a check node connected to variable nodes corresponding to u1, p0, and p2.

Consequently, if u0, u1, p0, and p2 are all lost due to a packet erasure, there is a check node for which the number of erasures of connected variable nodes is two or more, and therefore erasure correction decoding using this check node is difficult. Also, if erasure correction decoding is first performed using another check node, and erasure correction decoding is performed after the number of erasures of connected variable nodes has become only one, decoding processing delay time will increase.

In contrast, in this embodiment, transmission packet x0 is formed by the combination {u0, u12, p6, p18} by performing codeword symbol rearrangement using interleave pattern 1700 in FIG. 34, for example. At this time, u12, p6, and p18 are codeword symbols that are not used in decoding of information symbol u0, and u12, p6, and p18 are non-correlated symbols with respect to u0. Therefore, even if transmission packet x0 formed by the combination {u0, u12, p6, p18} is lost, and u0, u12, p6, and p18 all fail to be received, decoding of information symbol u0 is not affected since codeword symbols u12, p6, and p18 are not used in decoding of information symbol u0.

Thus, in this embodiment, a non-correlated symbol that is not used in decoding of a point-in-time i information symbol is assigned preferentially to a transmission packet in which a point-in-time i information symbol is transmitted. In this way, even if all the codeword symbols forming a lost packet are lost due to a packet erasure, the lost symbols can be dispersed among a plurality of check nodes, enabling erasure correction decoding to be performed effectively.

As described above, according to this embodiment, erasure correction encoding section 1612 performs erasure correction encoding on information symbols, and interleaving section 1613 performs codeword symbol rearrangement so that, in later-stage packet generation section 1614, a point-in-time i information symbol and a non-correlated symbol with respect to a point-in-time i information symbol are included in the same transmission packet.

Although a case in which, for the same transmission packet, all remaining symbols other than a point-in-time i information symbol comprise only non-correlated symbols with respect to a point-in-time i information symbol is most effective, the effect of this embodiment can be obtained as long as there is at least one non-correlated symbol.

By this means, a point-in-time i information symbol and a non-correlated symbol that is not used in point-in-time i information symbol decoding can be transmitted in the same transmission packet, so that even if all the codeword symbols included in a lost packet are lost due to a packet erasure, the lost symbols can be dispersed among a plurality of check nodes, and error rate characteristic degradation in erasure correction decoding can be suppressed.

When a constraint-length-K orthogonal code is used as a erasure correction code, if a set composed of differences of elements of a complete difference set defining the self-orthogonal code is designated set D, and a set of integers in the range −(K−1) to (K−1) is designated set U, an information symbol at a point in time separate from point-in-time i by the number of complementary sets of set D (set D complementary sets D⁻) with respect to set U is a non-correlated symbol with respect to a point-in-time i information symbol. Also, not only an information symbol, but also a redundant symbol that is not used in point-in-time i information symbol decoding, is similarly a non-correlated symbol.

In this embodiment, a case has been described by way of example in which ½ is used as a coding rate and the number of codeword symbols included in one transmission packet is four, but these are not limitations, and a different coding rate and number of symbols may be used.

In this embodiment, a case has been described in which codeword symbol rearrangement is performed using interleave pattern 1700 shown in FIG. 34, but this is not a limitation, and the same kind of effect can be obtained as long as the interleave pattern provides for codeword symbol rearrangement to be performed so that non-correlated bits are present in the same transmission packet.

Although a case in which, for the same transmission packet, all remaining symbols other than a point-in-time i information symbol comprise only non-correlated symbols with respect to a point-in-time i information symbol is most effective, the effect of this embodiment can be obtained as long as there is at least one non-correlated symbol.

For example, in the above description, a case has been described in which interleaving section 1613 focuses on "−12" and "+12" among the four integers {−12, −8, +8, +12} included in set D complementary set D⁻, and performs codeword symbol rearrangement so that a point-in-time i information symbol and point-in-time (i+12) information symbol are transmitted in the same transmission packet.

However, the combination is not limited to this, and provision may also be made for interleaving section 1613 to perform codeword symbol rearrangement so that "−8" and "+8" are used and a point-in-time i information symbol and point-in-time (i+8) information symbol are transmitted in the same transmission packet. As well as providing for codeword symbols transmitted in the same transmission packet to be made a combination of non-correlated symbols, this also enables the size of the interleaver to be made smaller than when "−12" and "+12" are used.

When an LDPC-CC is used as a erasure correction code, provision is made for a transmission packet in which a point-in-time i information symbol is included to include preferentially a codeword symbol of other than a single correlation column of that information symbol. Furthermore, provision may also be made for a transmission packet to be configured using an information symbol of other than a single correlation column of that information symbol or a codeword symbol of other than a double correlation column of that information symbol.

The disclosures of Japanese Patent Application No. 2007-284345, filed on Oct. 31, 2007, and Japanese Patent Application No. 2008-278546, filed on Oct. 29, 2008, including the specifications, drawings and abstracts, are incorporated herein by reference in their entirety.

INDUSTRIAL APPLICABILITY

A transmitting apparatus according to the present invention is suitable for use as a transmitting apparatus in a communication system in which a self-orthogonal code or LDPC-CC is applied.

The invention claimed is:
1. A transmitting apparatus comprising:
an encoding section that performs error correction encoding using a self-orthogonal code or LDPC-CC on an information symbol and generates a codeword symbol;
an interleaver that rearranges an order of said codeword symbols; and
a transmission symbol generation section that generates a transmission symbol using a plurality of said codeword symbols, wherein:
said interleaver rearranges said codeword symbols so that correlation between a channel characteristic of said transmission symbol that includes said information symbol of point-in-time i and a channel characteristic of said transmission symbol that includes a non-correlated symbol of said information symbol of point-in-time i becomes high; and
said non-correlated symbol is said codeword symbol that is not used in decoding of said information symbol of point-in-time i.

2. The transmitting apparatus according to claim 1, wherein, when a constraint length of said self-orthogonal code or said LDPC-CC is K (where K is a natural number), said encoding section performs error correction encoding using said self-orthogonal code or said LDPC-CC in which said non-correlated symbol is present in point-in-time i to point-in-time (i+K).

3. The transmitting apparatus according to claim 1, wherein:
when said encoding section uses said self-orthogonal code having a constraint length of K (where K is a natural number), said non-correlated symbol is set based on a complementary set of set D with respect to set U;
said set U is a set of integers in a range of $-(K-1)$ to $(K-1)$; and
said set D is a set composed of differences of elements of a complete difference set defining said self-orthogonal code.

4. The transmitting apparatus according to claim 3, wherein said non-correlated symbol is said codeword symbol of point-in-time (i+k) corresponding to an addition value (i+k) of integer k whose absolute value is smallest and said i among integers included in said set D complementary set.

5. The transmitting apparatus according to claim 3, wherein, when said interleaver includes m (where m≧3) said non-correlated symbols in an identical said transmission symbol, said non-correlated symbols are said codeword symbols of integer k for which a value multiplied by (m−1) is included in said complementary set or point-in-time (i+k) corresponding to an addition value (i+k) of integer k and said i for which a value multiplied by (m−1) is outside a range of said set D among integers included in said set D complementary set.

6. The transmitting apparatus according to claim 1, wherein, when said encoding section uses said LDPC-CC, said non-correlated symbol is said codeword symbol corresponding to other than a single correlation column of an information symbol of point-in-time i in an LDPC-CC parity check matrix.

7. The transmitting apparatus according to claim 1, wherein, when said encoding section uses said LDPC-CC, said non-correlated symbol is said codeword symbol corresponding to other than a double correlation column of an information symbol of point-in-time i in an LDPC-CC parity check matrix.

8. The transmitting apparatus according to claim 1, wherein said interleaver rearranges said codeword symbols so that one or more sets of combinations of said information symbol of point-in-time i and said non-correlated symbol are included in an identical said transmission symbol.

9. The transmitting apparatus according to claim 1, wherein said interleaver rearranges said codeword symbols so that said transmission symbol including said non-correlated symbol is transmitted at a time at which correlation between a time at which said transmission symbol including said information symbol of point-in-time i and a channel characteristic is high.

10. The transmitting apparatus according to claim 1, wherein said interleaver rearranges said codeword symbols so that said transmission symbol including said non-correlated symbol is transmitted at a frequency at which correlation between a frequency at which said transmission symbol including said information symbol of point-in-time i and a channel characteristic is high.

11. The transmitting apparatus according to claim 1, wherein a depth of said interleaver is less than or equal to constraint length K (where K is a natural number) of said self-orthogonal code or said LDPC-CC.

12. The transmitting apparatus according to claim 1, wherein said transmission symbol generation section maps said codeword symbol to sine wave phase/amplitude and generates a modulation symbol as said transmission symbol.

13. The transmitting apparatus according to claim 12, further comprising:
a plurality of antennas that transmit said modulation symbol; and
an assignment section that assigns said modulation symbol to one of said plurality of antennas,
wherein said assignment section assigns said modulation symbol including said non-correlated symbol to said antenna different from said antenna from which a modulation symbol including said information symbol of point-in-time i is transmitted at an identical time as said modulation symbol including said information symbol of point-in-time i.

14. The transmitting apparatus according to claim 1, wherein said transmission symbol generation section generates a transmission packet composed of said codeword symbol as said transmission symbol.

15. The transmitting apparatus according to claim 1, further comprising a puncturing section that punctures said non-correlated symbol,
wherein said transmission symbol generation section generates said transmission symbol using said codeword symbol after puncturing.

* * * * *